United States Patent
Sato

(10) Patent No.: US 10,923,502 B2
(45) Date of Patent: Feb. 16, 2021

(54) THREE-DIMENSIONAL FERROELECTRIC MEMORY DEVICES INCLUDING A BACKSIDE GATE ELECTRODE AND METHODS OF MAKING SAME

(71) Applicant: SANDISK TECHNOLOGIES LLC, Addison, TX (US)

(72) Inventor: Koji Sato, Yokkaichi (JP)

(73) Assignee: SANDISK TECHNOLOGIES LLC, Addison, TX (US)

(\*) Notice: Subject to any disclaimer, the term of this patent is extended or adjusted under 35 U.S.C. 154(b) by 37 days.

(21) Appl. No.: 16/249,300

(22) Filed: Jan. 16, 2019

(65) Prior Publication Data

US 2020/0227439 A1    Jul. 16, 2020

(51) Int. Cl.
H01L 27/11597    (2017.01)
H01L 27/11587    (2017.01)
H01L 27/1159     (2017.01)
H01L 21/28       (2006.01)

(52) U.S. Cl.
CPC .... H01L 27/11597 (2013.01); H01L 27/1159 (2013.01); H01L 27/11587 (2013.01); H01L 21/28017 (2013.01); H01L 29/40111 (2019.08)

(58) Field of Classification Search
CPC ......... H01L 27/11597; H01L 27/11587; H01L 27/1159; H01L 29/40111; H01L 21/28017
See application file for complete search history.

(56) References Cited

U.S. PATENT DOCUMENTS

| | | | |
|---|---|---|---|
| 5,915,167 A | 6/1999 | Leedy | |
| 6,392,264 B2 | 5/2002 | Takeuchi et al. | |
| 7,157,314 B2 | 1/2007 | Subramanian et al. | |
| 9,355,727 B1 | 5/2016 | Zhang et al. | |
| 9,576,971 B2 | 2/2017 | Zhang et al. | |
| 9,627,354 B1 | 4/2017 | Oyamada | |
| 9,839,127 B2 | 12/2017 | Kwon et al. | |
| 9,941,299 B1 | 4/2018 | Chen et al. | |
| 10,090,036 B2 | 10/2018 | Van Houdt | |

(Continued)

FOREIGN PATENT DOCUMENTS

WO    WO2018236353 A1    12/2018

OTHER PUBLICATIONS

U.S. Appl. No. 16/227,889, filed Dec. 20, 2018, SanDisk Technologies LLC.

(Continued)

*Primary Examiner* — Christine A Enad

(74) *Attorney, Agent, or Firm* — The Marbury Law Group, PLLC

(57) ABSTRACT

A ferroelectric memory device includes an alternating stack of insulator layers and electrically conductive layers and located over a top surface of a substrate, a memory stack structure vertically extending through the alternating stack and including a ferroelectric material layer, a front-side gate dielectric contacting the ferroelectric material layer, and a vertical semiconductor channel contacting the front-side gate dielectric, a backside gate dielectric contacting the vertical semiconductor channel, and a backside gate electrode contacting the backside gate dielectric. Portions of the ferroelectric material layer adjacent to the electrically material layers can be programmed with polarization states to store data.

18 Claims, 58 Drawing Sheets

(56) References Cited

U.S. PATENT DOCUMENTS

| | | |
|---|---|---|
| 2001/0019497 A1 | 9/2001 | Shimada et al. |
| 2002/0003246 A1 | 1/2002 | Takeuchi et al. |
| 2002/0018355 A1 | 2/2002 | Johnson et al. |
| 2002/0027793 A1 | 3/2002 | Johnson et al. |
| 2002/0079520 A1 | 6/2002 | Nishihara |
| 2002/0106854 A1 | 8/2002 | Takeuchi et al. |
| 2002/0125536 A1 | 9/2002 | Iwasa et al. |
| 2002/0173139 A1 | 11/2002 | Kweon |
| 2003/0002368 A1 | 1/2003 | Kang et al. |
| 2003/0039146 A1 | 2/2003 | Choi |
| 2003/0053346 A1 | 3/2003 | Bruchhaus et al. |
| 2003/0057462 A1 | 3/2003 | An |
| 2003/0058700 A1 | 3/2003 | Bruchhaus et al. |
| 2003/0086285 A1 | 5/2003 | Yamaguchi |
| 2003/0087480 A1 | 5/2003 | Kang |
| 2003/0099127 A1 | 5/2003 | Yang et al. |
| 2003/0119212 A1 | 6/2003 | Nishihara et al. |
| 2003/0129796 A1 | 7/2003 | Bruchhaus et al. |
| 2003/0141527 A1 | 7/2003 | Joo et al. |
| 2003/0170919 A1 | 9/2003 | Song et al. |
| 2003/0185068 A1 | 10/2003 | Saito et al. |
| 2003/0206429 A2 | 11/2003 | Subramanian et al. |
| 2004/0042134 A1 | 3/2004 | Kim et al. |
| 2004/0042290 A1 | 3/2004 | Tarui et al. |
| 2004/0108536 A1 | 6/2004 | Lee et al. |
| 2004/0124454 A1 | 7/2004 | Choi et al. |
| 2004/0137648 A1 | 7/2004 | An |
| 2004/0145024 A1 | 7/2004 | Chen et al. |
| 2004/0157459 A1 | 8/2004 | Ying et al. |
| 2004/0173570 A1 | 9/2004 | Ying et al. |
| 2004/0266030 A1 | 12/2004 | Kweon |
| 2006/0018045 A1 | 1/2006 | Moeller et al. |
| 2007/0133258 A1 | 6/2007 | Kim |
| 2007/0195616 A1 | 8/2007 | Fallah et al. |
| 2007/0211535 A1 | 9/2007 | Kim |
| 2008/0067566 A1 | 3/2008 | Choi et al. |
| 2008/0121956 A1 | 5/2008 | Kanaya |
| 2008/0237591 A1 | 10/2008 | Leedy |
| 2009/0173978 A1 | 7/2009 | Kato |
| 2009/0174082 A1 | 7/2009 | Leedy |
| 2009/0184360 A1 | 7/2009 | Jin et al. |
| 2009/0236908 A1 | 9/2009 | Park |
| 2010/0097839 A1 | 4/2010 | Kim |
| 2010/0140589 A1 | 6/2010 | Ionescu |
| 2010/0238699 A1 | 9/2010 | Miyakawa et al. |
| 2011/0170330 A1 | 7/2011 | Oezyilmaz et al. |
| 2012/0069647 A1 | 3/2012 | Kramer et al. |
| 2012/0175581 A1 | 7/2012 | Hwang |
| 2014/0321199 A1 | 10/2014 | Han et al. |
| 2015/0055399 A1 | 2/2015 | Jung et al. |
| 2015/0207067 A1 | 7/2015 | Doolittle et al. |
| 2016/0113115 A1 | 4/2016 | Kwon et al. |
| 2016/0118404 A1* | 4/2016 | Peng .................. H01L 27/1159 257/295 |
| 2016/0181259 A1* | 6/2016 | Van Houdt ....... H01L 29/78391 365/145 |
| 2017/0092615 A1 | 3/2017 | Oyamada |
| 2017/0148811 A1* | 5/2017 | Zhang .............. H01L 27/11519 |
| 2017/0178712 A1 | 6/2017 | Van Houdt |
| 2017/0243879 A1 | 8/2017 | Yu et al. |
| 2018/0114560 A1 | 4/2018 | Kim |
| 2018/0195049 A1 | 7/2018 | Ramaswamy |
| 2018/0350837 A1 | 12/2018 | Yoo et al. |
| 2019/0123061 A1* | 4/2019 | Liu ..................... G11C 11/2273 |

OTHER PUBLICATIONS

Kurotsuchi, K. et al., "2.8-GB/s-write and 670-MB/s-erase operations of a 3D vertical chain-cell-type phase-change-memory array," *2015 Symposium on VLSI Technology*, 7-1 pp. T92-T93, Jun. 16-18, 2015, (Abstract Only).

Notification of Transmittal of the International Search Report and Written Opinion of the International Search Authority for International Patent Application No. PCT/US2019/062544, dated Mar. 26, 2020, 11 pages.

* cited by examiner

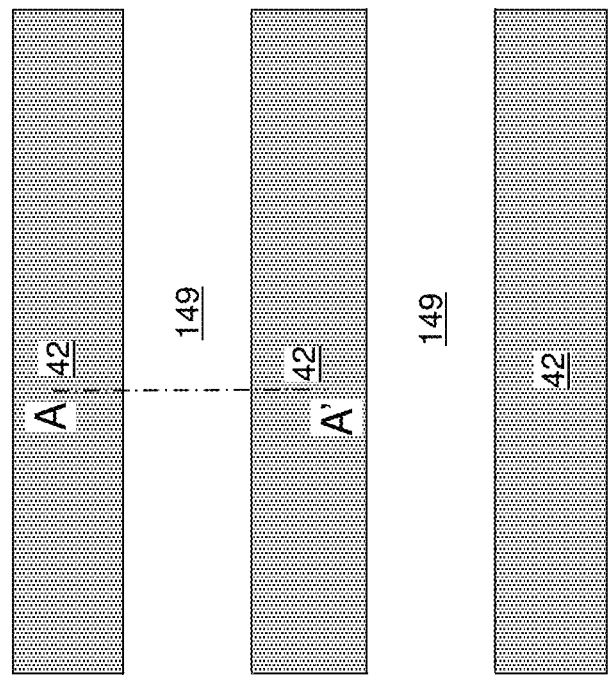
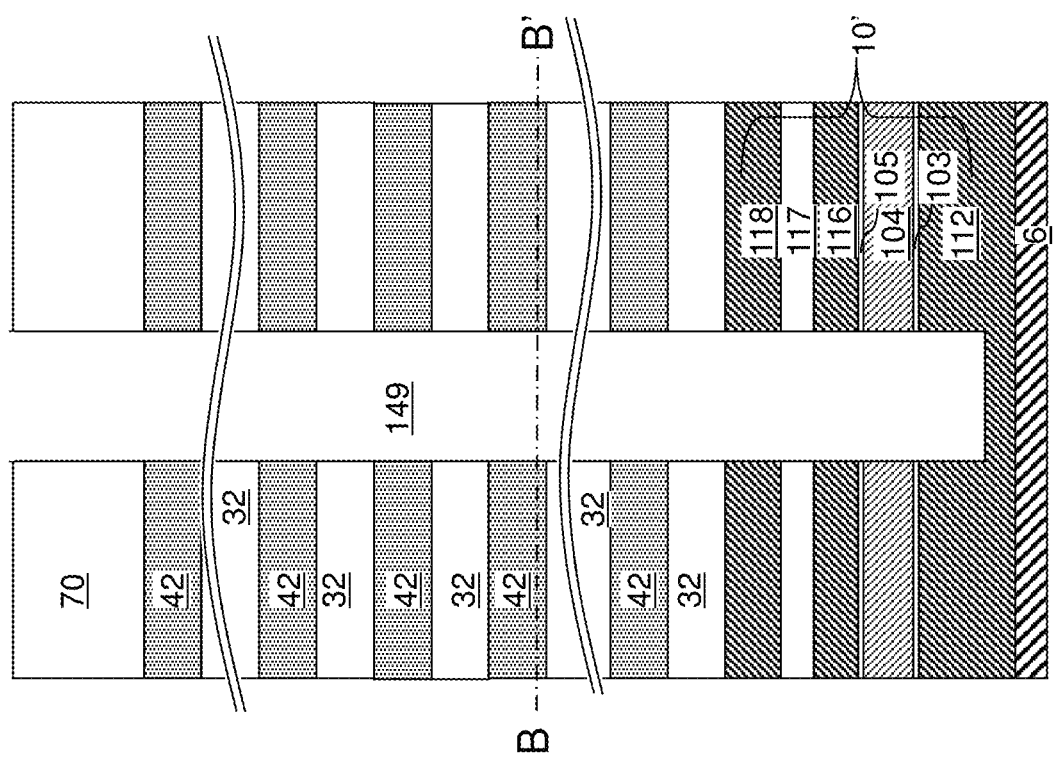
FIG. 5B
FIG. 5A

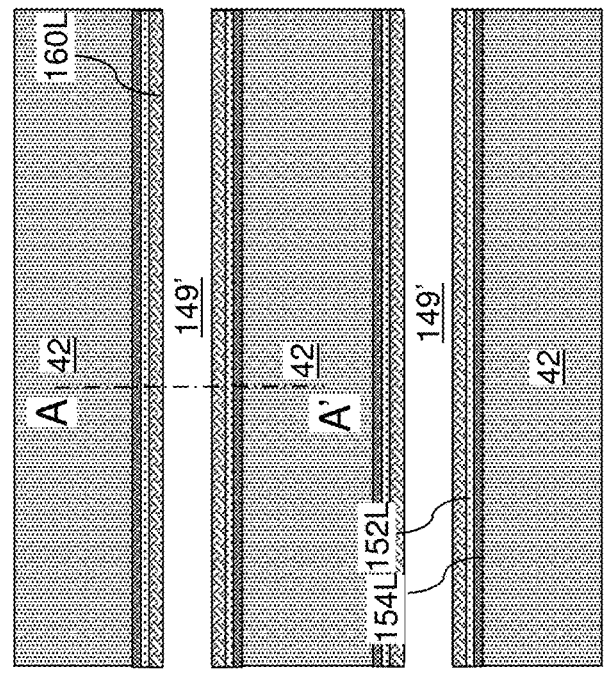
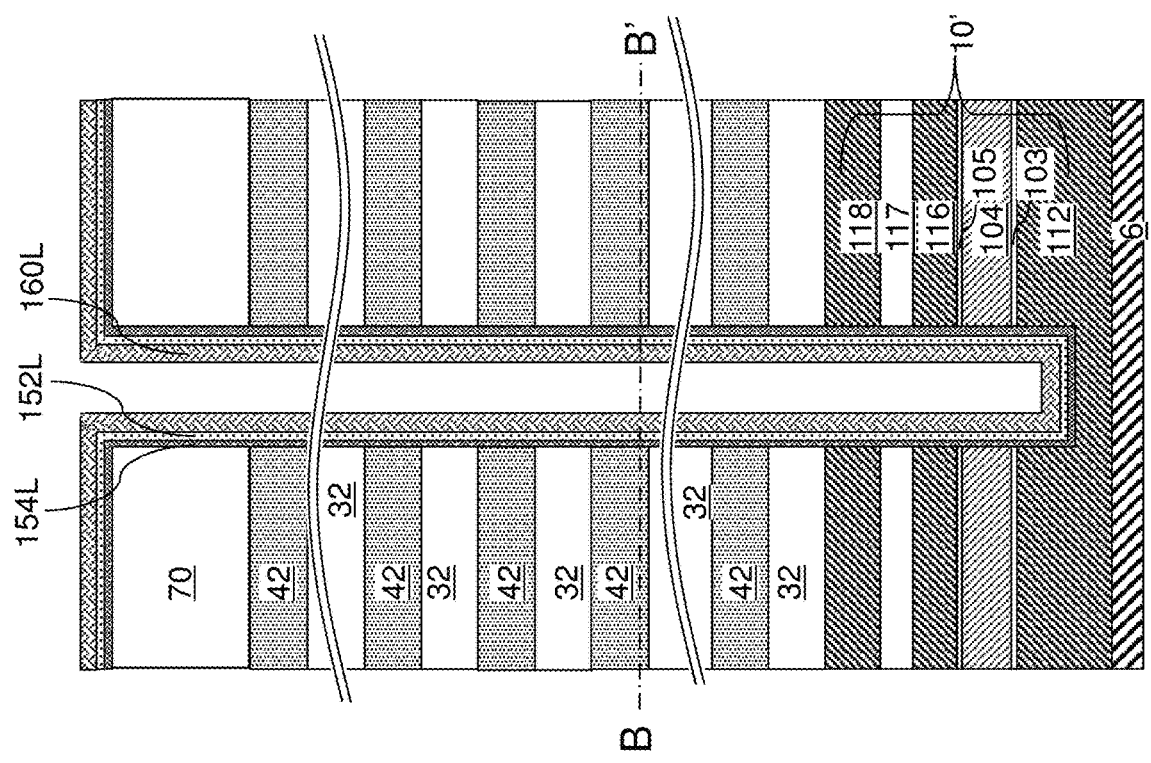
FIG. 6B
FIG. 6A

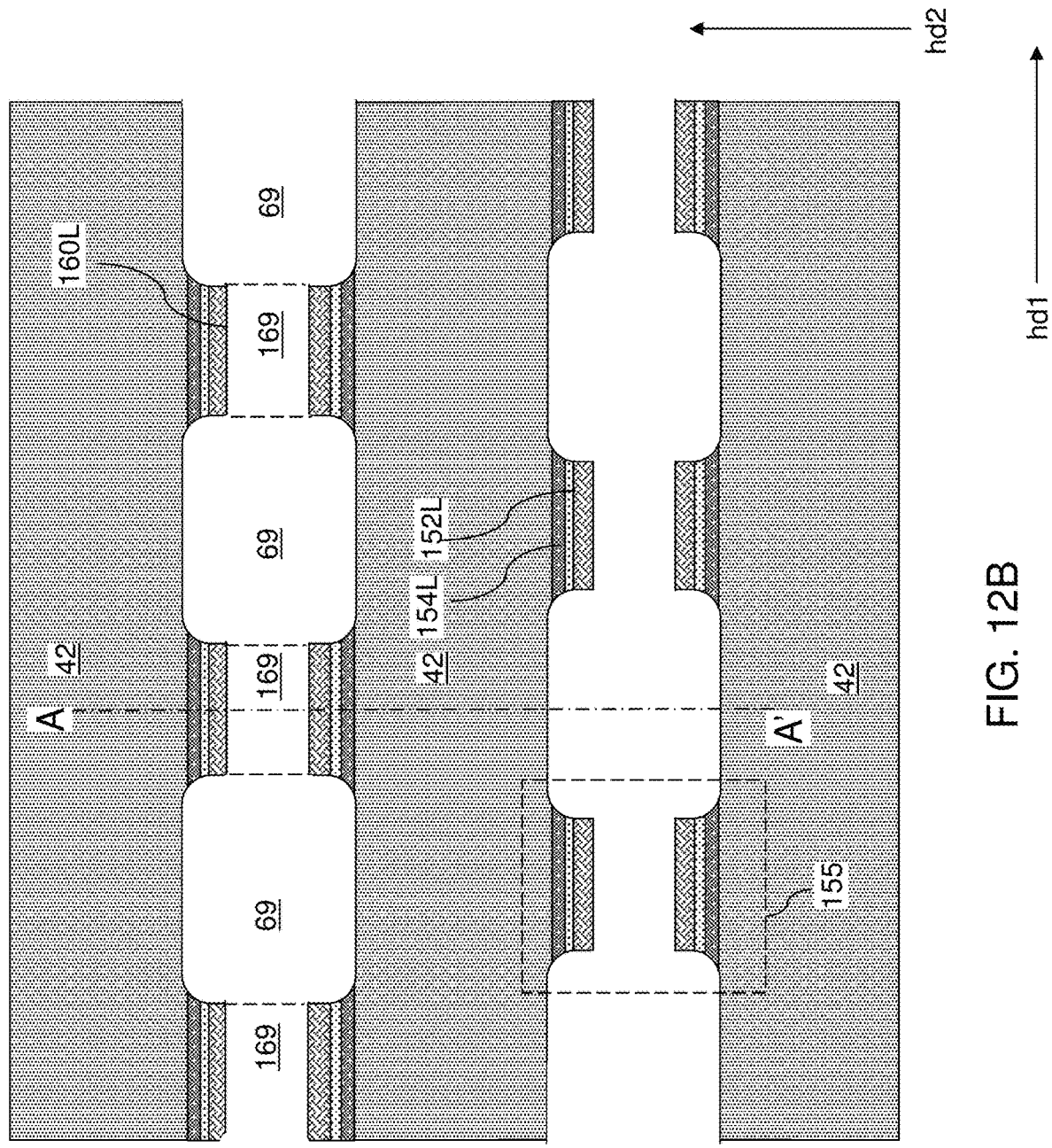

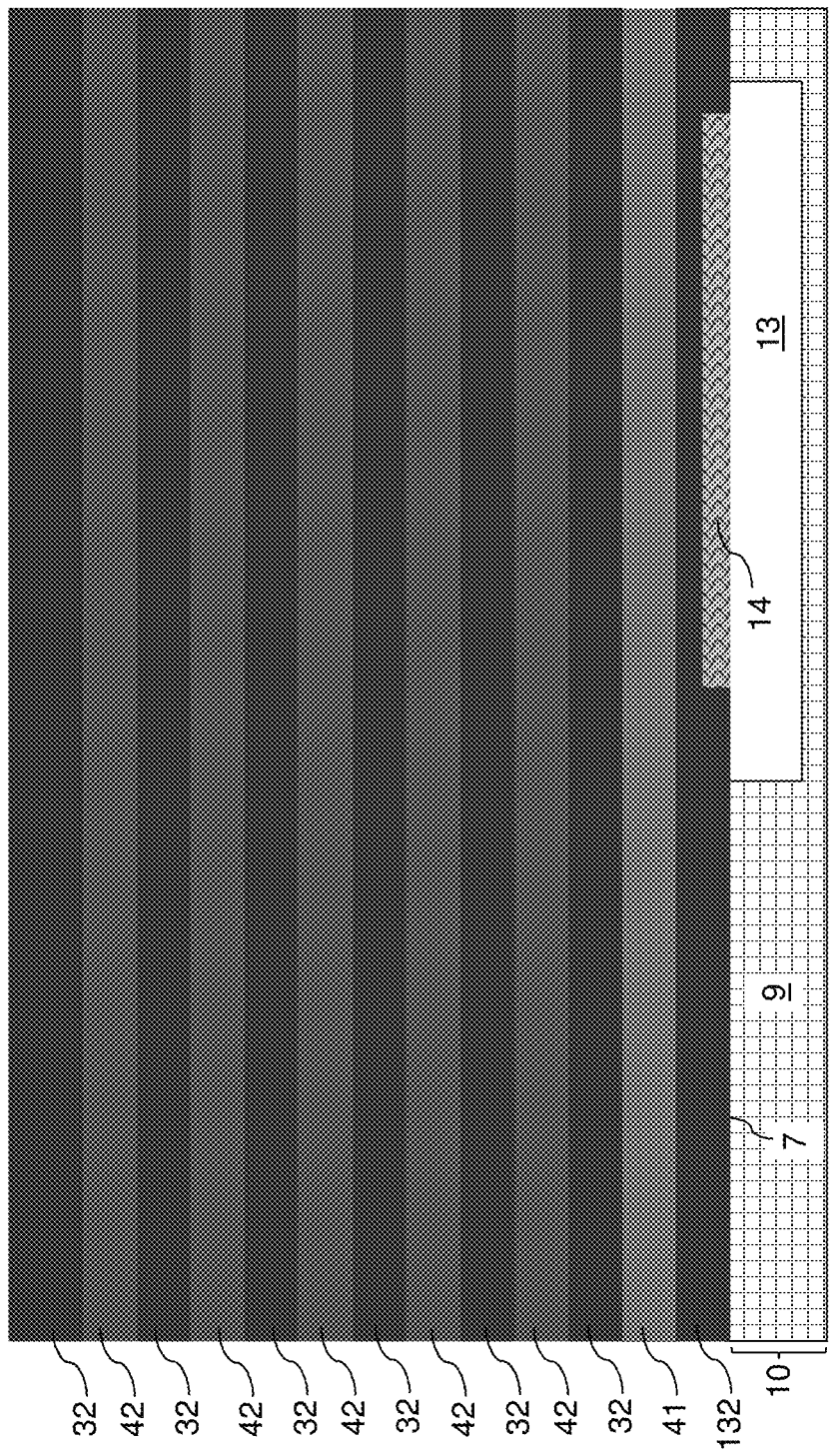

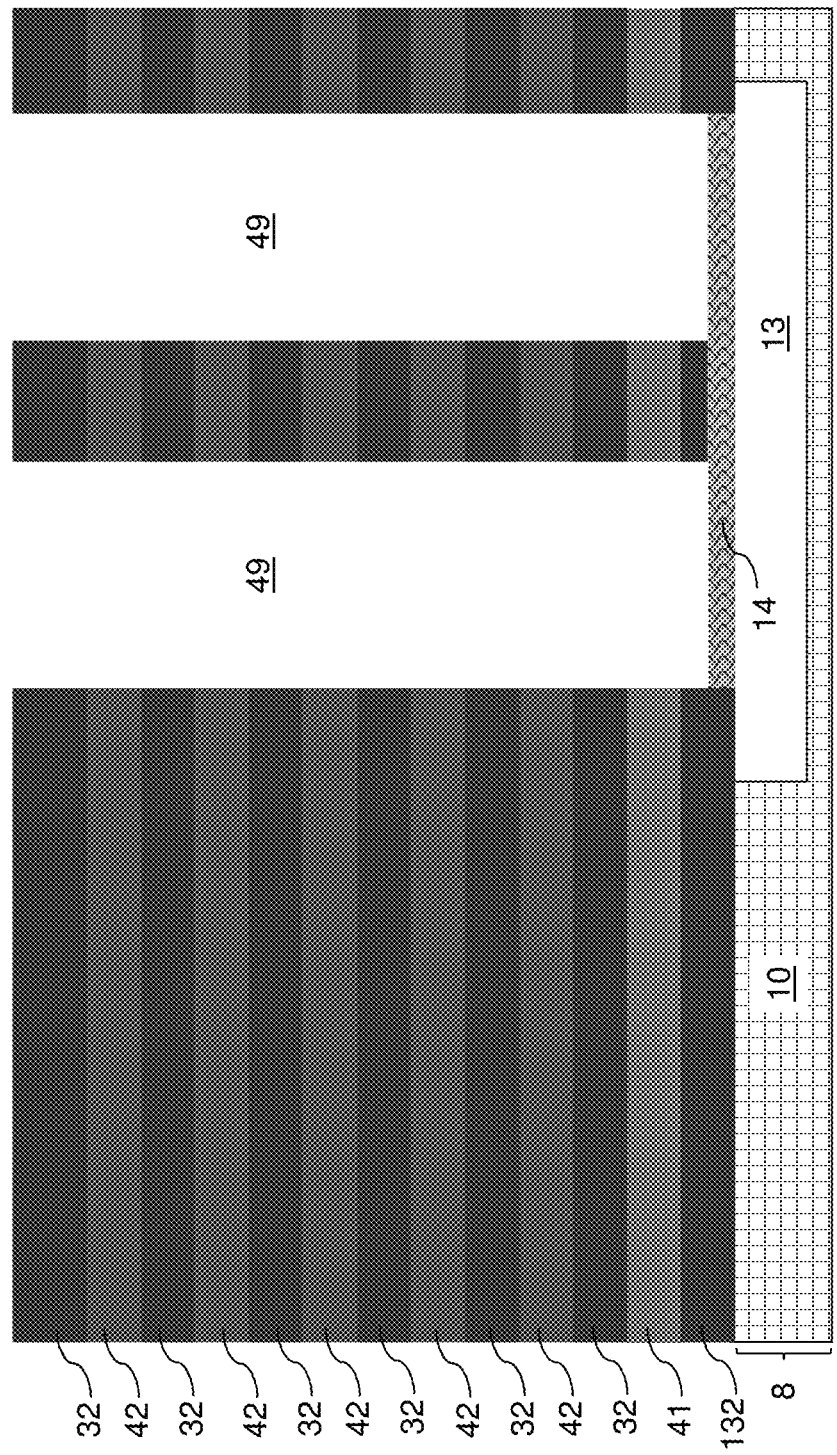

THREE-DIMENSIONAL FERROELECTRIC MEMORY DEVICES INCLUDING A BACKSIDE GATE ELECTRODE AND METHODS OF MAKING SAME

FIELD

The present disclosure relates generally to the field of semiconductor devices and specifically to three-dimensional ferroelectric memory devices including a backside gate electrode, and methods of making the same.

BACKGROUND

Ferroelectric memory device refers to a memory device in which information is stored in the ferroelectric state of a ferroelectric material. The ferroelectric state can affect the conductance of an adjacent material portion through the effect of the electrical charges that accumulate at an interface with the adjacent material portion. The different conductive states of the adjacent material portion can be used to encode data in a nonvolatile manner.

SUMMARY

According to an aspect of the present disclosure, a three-dimensional memory device is provided, which comprises: alternating stacks of insulating strips and electrically conductive strips located over a substrate and laterally spaced apart one from another by line trenches, wherein the line trenches laterally extend along a first horizontal direction and are spaced apart along a second horizontal direction; and line trench fill structures located in the line trenches, wherein each of the line trench fill structures comprises a respective set of memory stack structures, a backside gate dielectric that contacts each memory stack structure within the respective set of memory stack structures, and a backside gate electrode contacting the backside gate dielectric, wherein each memory stack structure comprises a ferroelectric material layer, a front-side gate dielectric contacting the ferroelectric material layer, and a vertical semiconductor channel contacting the front-side gate dielectric and the backside gate dielectric.

According to another aspect of the present disclosure, a three-dimensional memory device is provided, which comprises: an alternating stack of insulator layers and electrically conductive layers and located over a top surface of a substrate; a memory stack structure vertically extending through the alternating stack and comprising a ferroelectric material layer, a front-side gate dielectric contacting the ferroelectric material layer, and a vertical semiconductor channel contacting the front-side gate dielectric; a backside gate dielectric contacting the vertical semiconductor channel; and a backside gate electrode contacting the backside gate dielectric.

According to another aspect of the present disclosure, a method of forming a three-dimensional memory device is provided, which comprises: forming a vertically alternating sequence of insulating layers and spacer material layers over a substrate; dividing the vertically alternating sequence into alternating stacks of insulating strips and spacer material strips and line trench fill structures by forming line trenches that laterally extend along a first horizontal direction through the vertically alternating sequence; forming memory stack structures in the line trenches, wherein each memory stack structure comprises a ferroelectric material layer, a front-side gate dielectric contacting the ferroelectric material layer, and a vertical semiconductor channel contacting the front-side gate dielectric; and forming a backside gate dielectric and a backside gate electrode within each of the line trenches over a respective subset of the vertical semiconductor channels.

According to another aspect of the present disclosure, a method of manufacturing a three-dimensional memory device is provided, which comprises: forming an alternating stack of insulating layers and spacer material layers over a substrate; forming a memory opening that vertically extends through the alternating stack; and sequentially forming a ferroelectric material layer, a front-side gate dielectric contacting the ferroelectric material layer, a vertical semiconductor channel, a backside gate dielectric, and a backside gate electrode within the memory opening.

BRIEF DESCRIPTION OF THE DRAWINGS

FIG. 5A is a vertical cross-sectional view of a line trench in the first exemplary structure of FIGS. 4A and 4B.

FIG. 5B is a horizontal cross-sectional view along the plane B-B' of FIG. 5A.

FIG. 6A is a vertical cross-sectional view of a line trench after formation of a continuous ferroelectric material layer, a continuous front-side gate dielectric layer, and a semiconductor channel material layer according to the first embodiment of the present disclosure.

FIG. 6B is a horizontal cross-sectional view along the plane B-B' of FIG. 6A.

FIG. 12B is a horizontal cross-sectional view of the region of the first exemplary structure along the plane B-B' of FIG. 12A.

FIG. 22 is a vertical cross-sectional view of a second exemplary structure after formation of a stack including an alternating plurality of material layers according to a second embodiment of the present disclosure.

FIG. 23 is a vertical cross-sectional view of the second exemplary structure after formation of memory openings through the stack according to the second embodiment of the present disclosure.

DETAILED DESCRIPTION

The present disclosure is directed to three-dimensional ferroelectric memory devices including a backside gate electrode, methods of making the same, and methods of operating the same, the various aspects of which are described below. The embodiments of the disclosure can be used to form various structures including a multilevel metal interconnect structure, a non-limiting example of which includes semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three-dimensional memory arrays. The three-dimensional memory devices of various embodiments include a monolithic three-dimensional NAND string memory device, and can be fabricated using the various embodiment methods described herein.

As used herein, a "ferroelectric material" refers to any material that exhibits spontaneous electric polarization that can be reversed by the application of an external electric field.

Figure 1A:
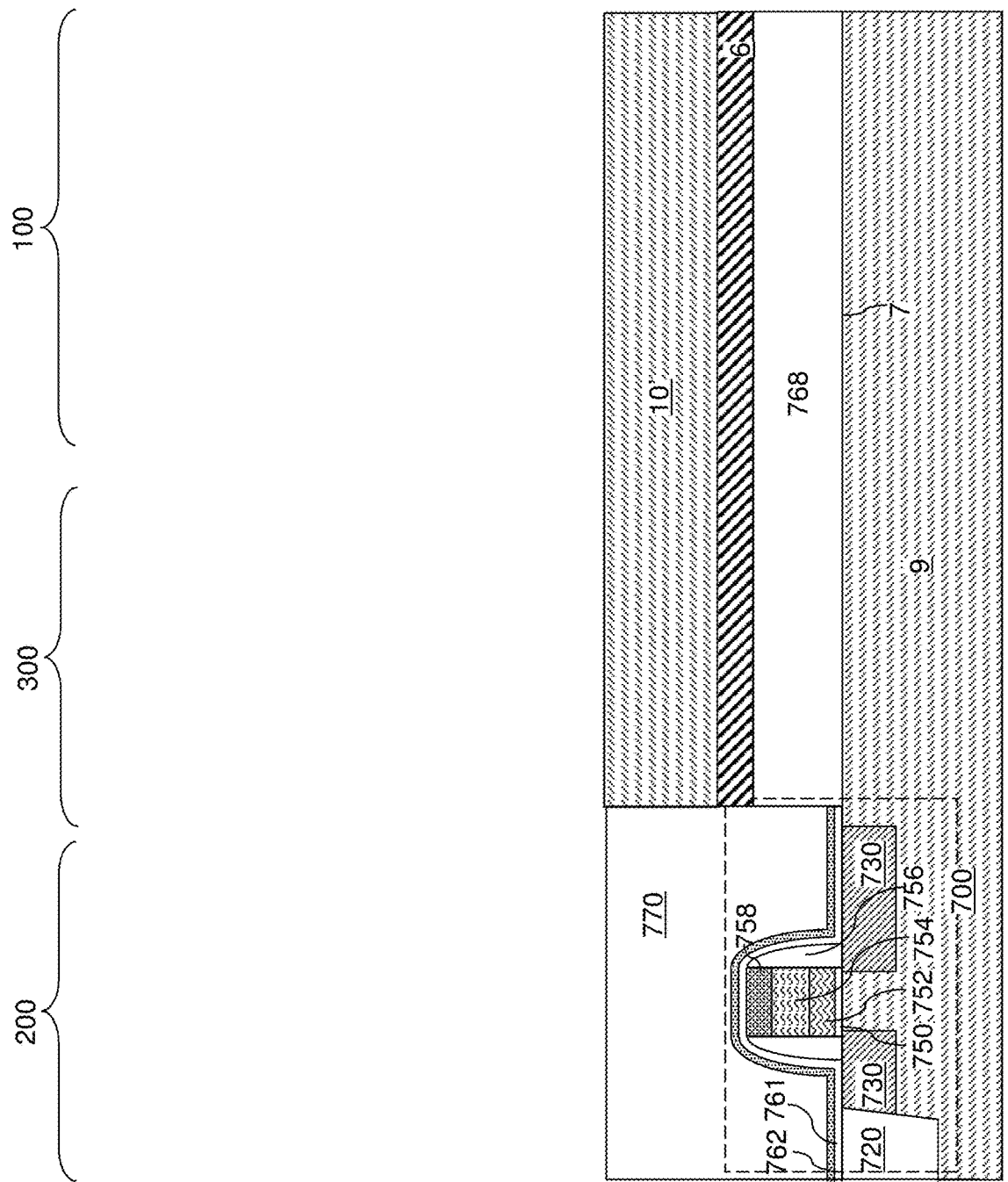
FIG. 1A is a schematic vertical cross-sectional view of a first exemplary structure after formation of at least one peripheral device, an insulating spacer layer, a buried conductive layer, and in-process source level layers according to a first embodiment of the present disclosure.
Figure 1B:
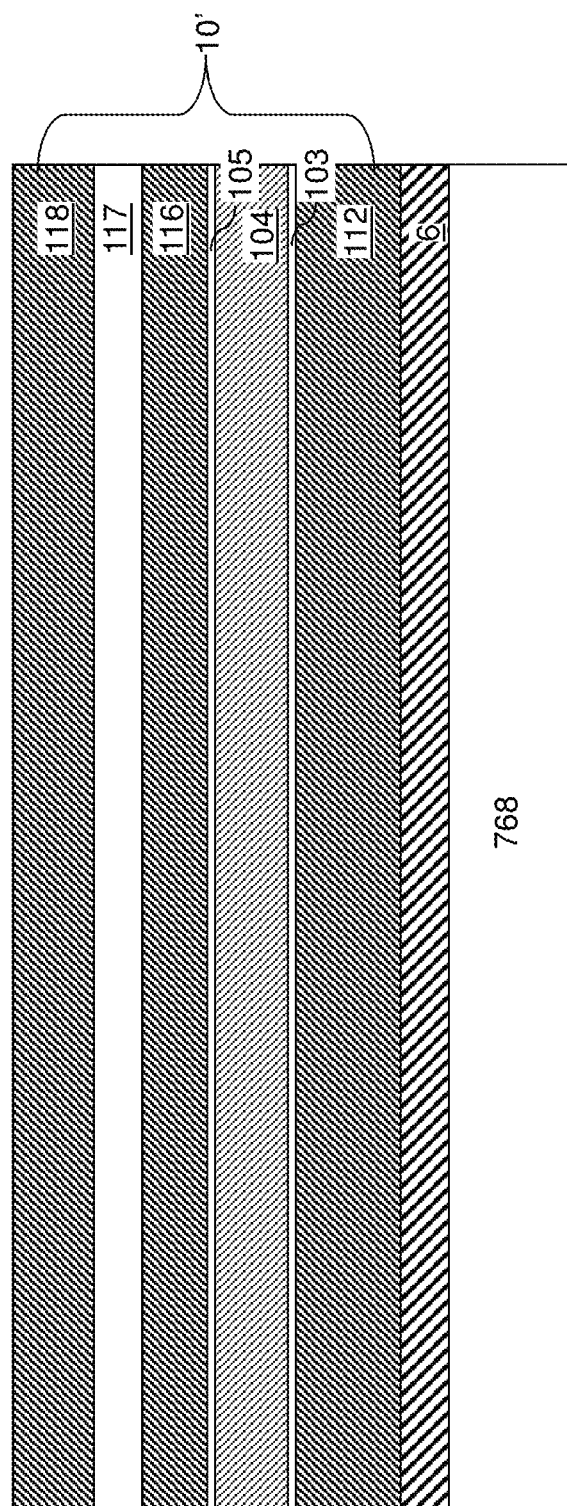
FIG. 1B is a vertical cross-sectional view of the stack of the insulating spacer layer, the buried conductive layer, and the in-process source level layers of the first exemplary structure of FIG. 1A.

Referring to FIGS. 1A and 1B, a first exemplary structure according to a first embodiment of the present disclosure is illustrated, which can be used, for example, to fabricate a ferroelectric memory device structure containing vertical NAND strings. The first exemplary structure includes a substrate 8, such as a silicon wafer or a silicon on insulator substrate, for example. The substrate 8 can include a substrate semiconductor layer 9 in an upper portion thereof. The substrate semiconductor layer 9 may be an upper portion of the silicon wafer 8, a doped well in the upper portion of the silicon wafer 8, or a semiconductor (e.g., silicon) layer located over a top surface of the substrate. The substrate 8 can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline silicon surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants using the at least one gate structure (750, 752, 754, 758) as masking structures. Additional masks may be used as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device. A dielectric material such as silicon oxide can be deposited over the at least one semiconductor device, and can be subsequently planarized to form a planarization dielectric layer 770. The region including the at least one semiconductor device 700 is herein referred to as a peripheral device region 200.

A dielectric material layer 768 can be formed over the substrate semiconductor layer 9. The dielectric material layer 768 may include a single dielectric material layer or a plurality of dielectric material layers. The dielectric material layer 768 may include any one or more of doped silicate glass, undoped silicate glass, and organosilicate glass. In one embodiment, the at least one dielectric material layer 768 can comprise, or consist essentially of, dielectric material layers having dielectric constant that does not exceed the dielectric constant of undoped silicate glass (silicon oxide) of 3.9.

An optional layer of a metallic material and a layer of a semiconductor material can be deposited over, or within patterned recesses of, the dielectric material layer 768, and are lithographically patterned to provide an optional conductive plate layer 6 and in-process source-level material layers 10'. The optional conductive plate layer 6, if present, provides a high conductivity conduction path for electrical current that flows into, or out of, the in-process source-level material layers 10'. The optional conductive plate layer 6 includes a conductive material such as a metal, metal silicide, or a heavily doped semiconductor material. The optional conductive plate layer 6, for example, may include a tungsten or tungsten silicide layer having a thickness in a range from 3 nm to 100 nm, although lesser and greater thicknesses can also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 can include a metallic compound material such as a conductive metallic silicide or nitride (e.g., TiN) and/or a metal (e.g., W). The thickness of the optional conductive plate layer 6 may be in a range from 5 nm to 100 nm, although lesser and greater thicknesses can also be used.

The in-process source-level material layers 10' can include various layers that are subsequently modified to form source-level material layers. The source-level material layers, upon formation, include a source contact layer that functions as a common source region for vertical field effect transistors of a three-dimensional memory device. In one embodiment, the in-process source-level material layer 10' can include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source-select-level conductive layer 118.

The lower source-level material layer 112 and the upper source-level material layer 116 can include a doped semiconductor material such as doped polysilicon or doped amorphous silicon. The conductivity type of the lower source-level material layer 112 and the upper source-level material layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be used.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon, polysilicon, or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be used.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be used.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be used. The optional source-select-level conductive layer 118 can include a conductive material that can be used as a source-select-level gate electrode. For example, the optional source-select-level conductive layer 118 can include a heavily doped semiconductor material such as heavily doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be used.

The in-process source-level material layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface 7 of the substrate 8).

The optional conductive plate layer 6 and the in-process source-level material layers 10' may be patterned to provide openings in areas in which through-memory-level contact via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed. Thus, regions in which the in-process source-level material layers 10' are present include a memory array region 100 in which memory devices are to be subsequently formed and a contact region 300 in which stepped surfaces and contact via structures contacting various electrically conductive strips are to be subsequently formed.

Figure 2:
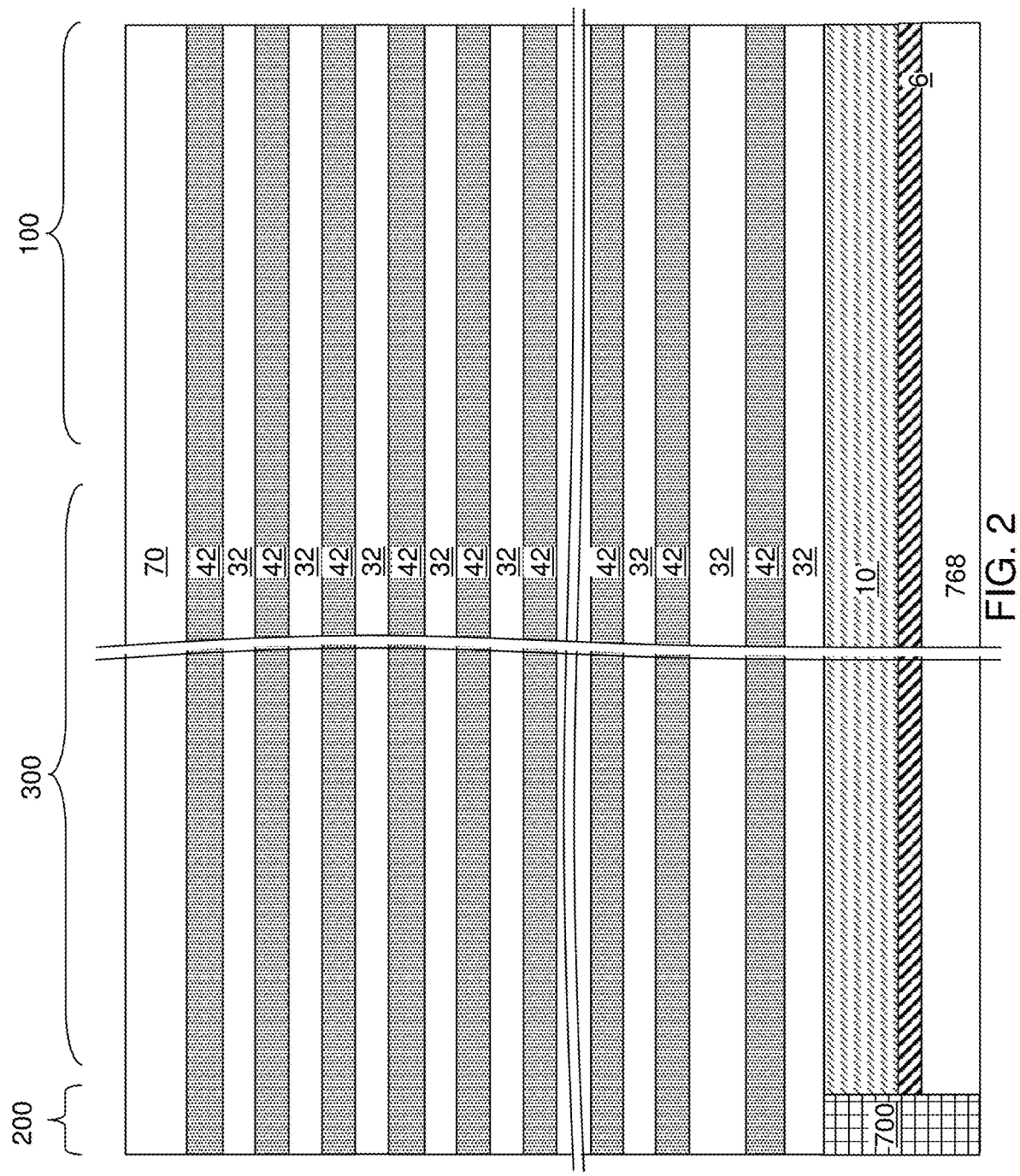
FIG. 2 is a schematic vertical cross-sectional view of the first exemplary structure after formation of a vertically alternating sequence of insulating layers and spacer material layers according to the first embodiment of the present disclosure.

Referring to FIG. 2, a vertically alternating sequence of first material layers (which can be insulating layers 32) and second material layers (which can be sacrificial material layer 42) is formed over the top surface of the substrate 8. As used herein, a "material layer" refers to a layer including a material throughout the entirety thereof. As used herein, a "vertically alternating sequence" or a "vertically alternating plurality" of first elements and second elements refers to a structure in which instances of the first elements and instances of the second elements alternate along a vertical direction. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating sequence (32, 42). In one embodiment, the alternating sequence (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating sequence (32, 42) can have a uniform thickness that is substantially invariant within each respective sacrificial material layer 42.

While the present disclosure is described using an embodiment in which the spacer material layers are sacrificial material layers 42 that are subsequently replaced with electrically conductive strips, embodiments are expressly contemplated herein in which the sacrificial material layers are formed as electrically conductive strips. In this case, steps for replacing the spacer material layers with electrically conductive strips can be omitted.

An insulating cap layer 70 can be formed over the alternating sequence (32, 42). The insulating cap layer 70 includes a sacrificial material that is different from the material of the sacrificial material layers 42. In one embodiment, the insulating cap layer 70 can include a silicate glass material such as undoped silicate glass or a doped silicate glass. Examples of doped silicate glasses include borosilicate glass, phosphosilicate glass, borophosphosilicate glass, and organosilicate glass. The insulating cap layer 70 can be formed by a chemical vapor deposition process. For example, tetraethylorthosilicate (TEOS) can be thermally decomposed in the present or absence of dopant gases to form a doped silicate glass or an undoped silicate glass. The thickness of the insulating cap layer 70 can be in a range from 50 nm to 300 nm, although lesser and greater thicknesses can also be used.

Figure 3:
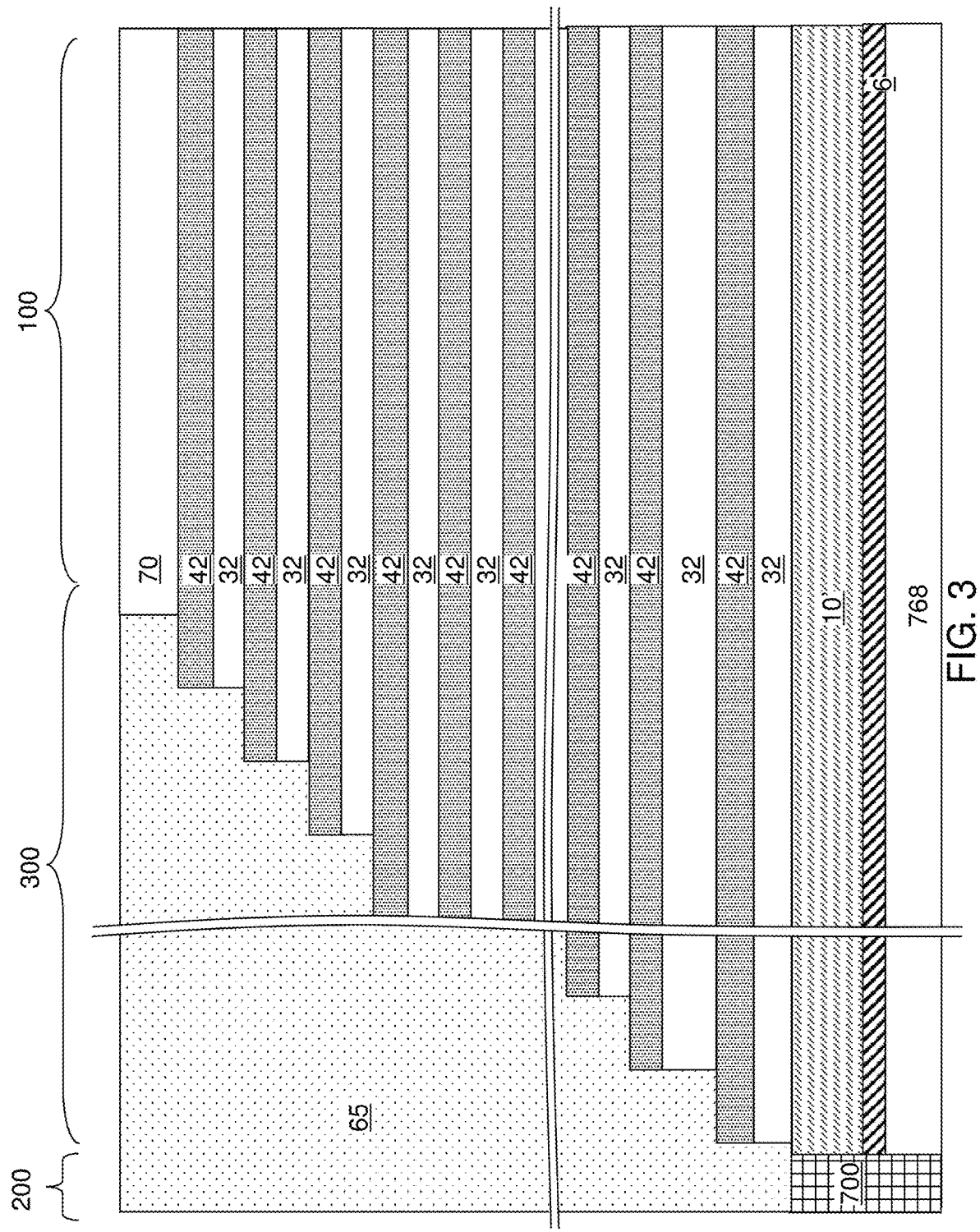
FIG. 3 is a schematic vertical cross-sectional view of the first exemplary structure after formation of stepped terraces and a retro-stepped dielectric material portion according to the first embodiment of the present disclosure.
Figure 4A:
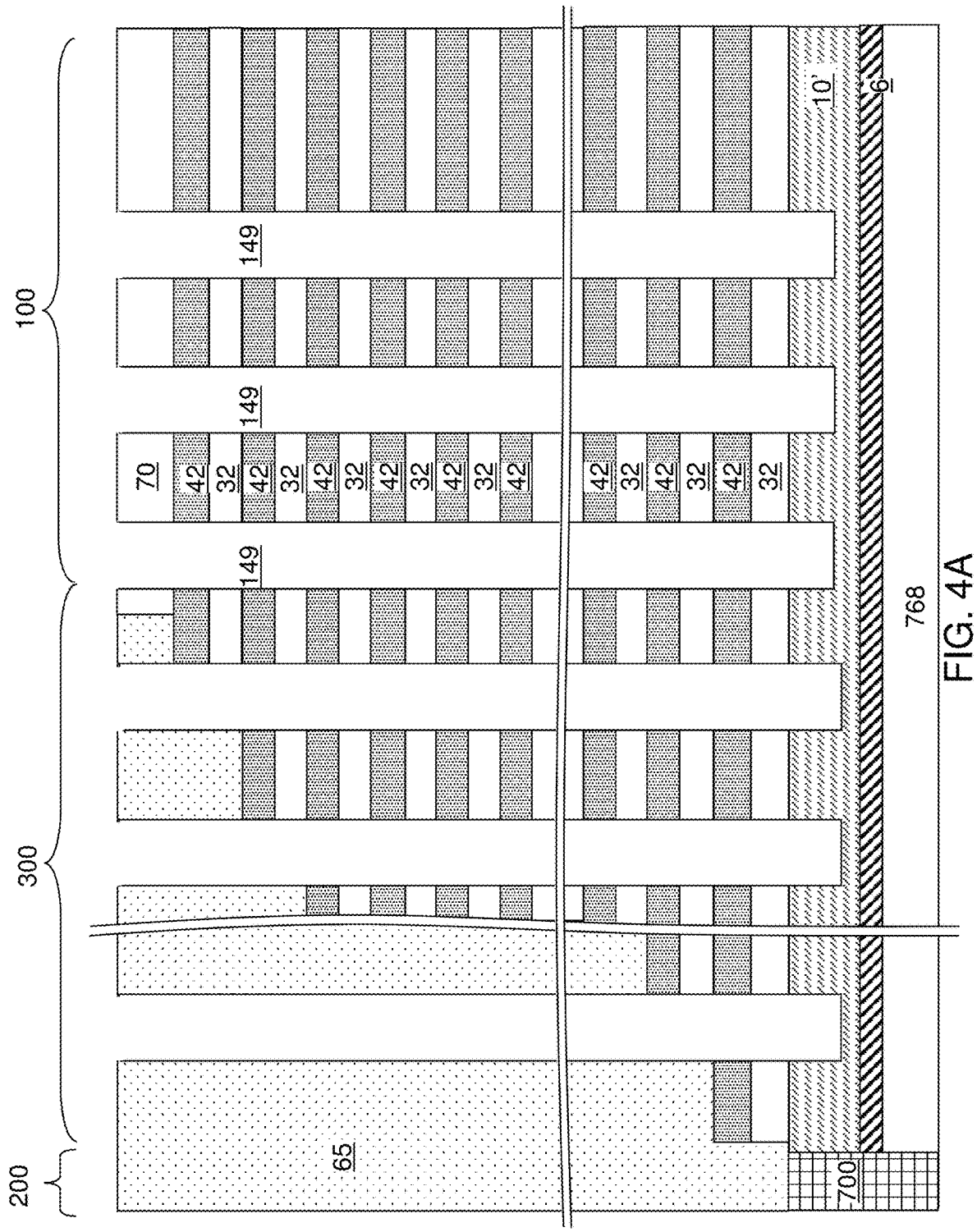
FIG. 4A is a schematic vertical cross-sectional view of the first exemplary structure after formation of line trenches according to the first embodiment of the present disclosure.
Figure 4B:
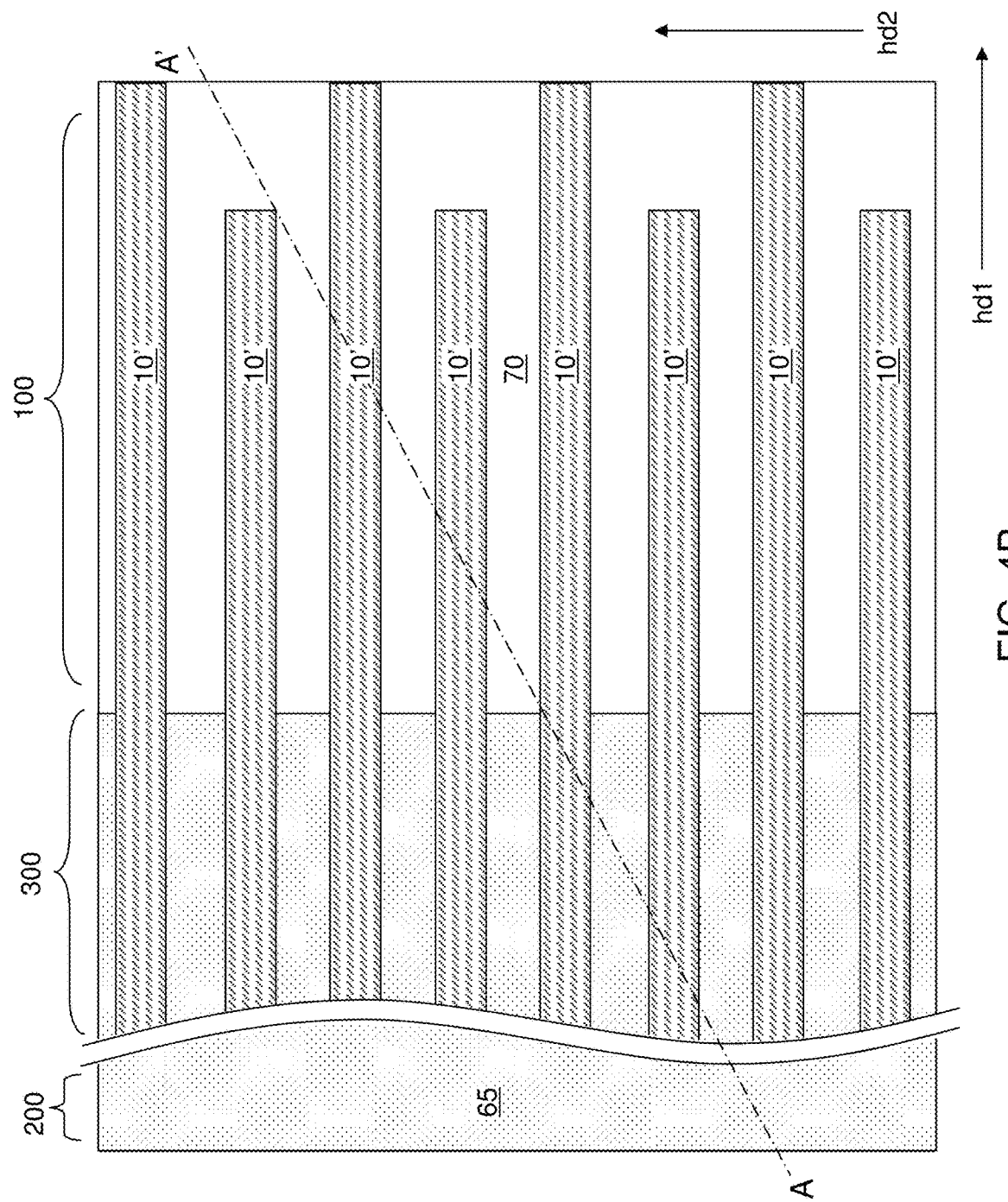
FIG. 4B is a top-down view of the first exemplary structure of FIG. 4A. The vertical plane A-A' is the plane of the cross-section for FIG. 4A.

Referring to FIG. 3, the vertically alternating sequence of the insulating layers 32 and the spacer material layers (i.e., the sacrificial material layers 42) can be patterned to form stepped surfaces that continuously extend from a bottommost layer of the vertically alternating sequence (32, 42) to a topmost layer of the alternating sequence (32, 42) in the contact region 300. A stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the vertically alternating sequence (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the vertically alternating sequence (32, 42). Each sacrificial material layer 42 other than a topmost sacrificial material layer 42 within the vertically alternating sequence (32, 42) laterally extends farther than any overlying sacrificial material layer 42 within the vertically alternating sequence (32, 42). The terrace region includes stepped surfaces of the vertically alternating sequence (32, 42) that continuously extend from a bottommost layer within the vertically alternating sequence (32, 42) to a topmost layer within the vertically alternating sequence (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Referring to FIGS. 4A, 4B, 5A, and 5B, a lithographic material stack (not shown) including at least a photoresist layer can be formed over the insulating cap layer 70 and the retro-stepped dielectric material portion 65, and can be lithographically patterned to form line-shaped openings therein. The line-shaped openings laterally extend along a first horizontal direction hd1, and has a uniform width along a second horizontal direction hd2 that is perpendicular to the first horizontal direction hd1. The pattern in the lithographic material stack can be transferred through the insulating cap layer 70 or the retro-stepped dielectric material portion 65, and through the vertically alternating sequence (32, 42) by at least one anisotropic etch that uses the patterned lithographic material stack as an etch mask. Portions of the vertically alternating sequence (32, 42) underlying the line-shaped openings in the patterned lithographic material stack are etched to form line trenches 149. As used herein, a "line trench" refers to a trench that has laterally extends straight along a horizontal direction.

The line trenches 149 laterally extend along the first horizontal direction hd1 through the vertically alternating sequence (32, 42). In one embodiment, the line trenches 149 have a respective uniform width that is invariant under translation along the first horizontal direction hd1. In one embodiment, the line trenches 149 can have the same width throughout, and the spacing between neighboring pairs of the line trenches 149 can be the same. In this case, the line trenches 149 can constitute a one-dimensional periodic array of line trenches 149 having a pitch along a second horizontal direction hd2 that is perpendicular to the first horizontal direction hd1. The width of the line trenches 149 along the second horizontal direction hd2 can be in a range from 30 nm to 500 nm, such as from 60 nm to 250 nm, although lesser and greater widths can also be used.

The line trenches 149 extend through each layer of the vertically alternating sequence (32, 42) and the retro-stepped dielectric material portion 65. The chemistry of the anisotropic etch process used to etch through the materials of the vertically alternating sequence (32, 42) can alternate to optimize etching of the first and second materials in the vertically alternating sequence (32, 42). The anisotropic etch can be, for example, a series of reactive ion etches. The sidewalls of the line trenches 149 can be substantially vertical, or can be tapered. The patterned lithographic material stack can be subsequently removed, for example, by ashing.

The line trenches 149 laterally extend through the entire memory array region 100, and laterally extend into the contact region 300. The line trenches 149 may laterally extend through the entire contact region 300 along the first horizontal direction hd1, or may laterally extend only through part of a width, but not the entire width along the first horizontal direction hd1, of the contact region 300. The line trenches 149 can be laterally spaced one from another along a second horizontal direction hd2, which is perpendicular to the first horizontal direction hd1. In one embodiment, an overetch into the semiconductor material layer 10 may be optionally performed after the top surface of the semiconductor material layer 10 is physically exposed at a bottom of each line trench 149. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the line trenches 149 can be coplanar with the topmost surface of the semiconductor material layer 10.

Each of the line trenches 149 may include a sidewall (or a plurality of sidewalls) that extends substantially perpendicular to the topmost surface of the substrate. The substrate semiconductor layer 9 and the semiconductor material layer 10 collectively constitute a substrate (9, 10), which can be a semiconductor substrate. Alternatively, the semiconductor material layer 10 may be omitted, and the line trenches 149 can be extend to a top surface of the substrate semiconductor layer 9. In one embodiment, the vertically alternating sequence of the insulating layers 32 and the spacer material layers (such as the sacrificial material layers 42) can be divided into discrete alternating stacks of insulating strips 32 (i.e., divided portions of the insulating layers 32) and spacer material strips (i.e., divided portions of the spacer material layers) by the line trenches 149. Alternatively, the line trenches 149 may not divide the vertically alternating sequence of the insulating layers 32 and the spacer material layers (such as the sacrificial material layers 42) into discrete alternating stacks of insulating strips and spacer material strips. In this case, the insulating layers 32 and the spacer material layers (such as the sacrificial material layers 42) may remain as continuous material layers with openings formed by the line trenches 149 therethrough.

Referring to FIGS. 6A and 6B, a continuous ferroelectric material layer 154L, a continuous front-side gate dielectric layer 152L, and a semiconductor channel material layer 160L are sequentially formed in the line trenches 149 and over the insulating cap layer 70. The continuous ferroelectric material layer 154L can be formed on the sidewalls of the insulating layers 32 and the sacrificial material layers 42. The continuous ferroelectric material layer 154L includes a ferroelectric material.

In one embodiment, the continuous ferroelectric material layer 154L comprises, and/or consists essentially of, at least one ferroelectric material, such as hafnium oxide, barium titanate ($BaTiO_3$; BT), colemanite ($Ca_2B_6O_{11}.5H_2O$), bismuth titanate ($Bi_{12}TiO_{20}$, $Bi_4Ti_3O_{12}$ or $Bi_2Ti_2O_7$), europium barium titanate, ferroelectric polymers, germanium telluride, langbeinites ($M_2M'_2(SO_4)_3$ in which M is a monovalent metal and M' is a divalent metal), lead scandium tantalate ($Pb(Sc_xTa_{1-x})O_3$), lead titanate ($PbTiO_3$; PT), lead zirconate titanate ($Pb(Zr,Ti)O_3$; PZT), lithium niobate ($LiNbO_3$; LN), ($LaAlO_3$)), polyvinylidene fluoride ($CH_2CF_2)_n$, potassium niobate ($KNbO_3$), potassium sodium tartrate ($KNaC_4H_4O_6.4H_2O$), potassium titanyl phosphate ($KO_5PTi$), sodium bismuth titanate ($Na_{0.5}Bi_{0.5}TiO_3$ or $Bi_{0.5}Na_{0.5}TiO_3$), $NH_4H_2PO_4$ (ADP), $KH_2PO_4$ (KDP), $LiTaO_3$ (LT), $(Pb,La)TiO_3$ (PLT), and $(Pb,La)(Zr,Ti)O_3$ (PLZT). In one embodiment, the continuous ferroelectric material layer 154L comprises, and/or consists essentially of, a ferroelectric dielectric material.

The continuous ferroelectric material layer 154L can be formed, for example, by chemical vapor deposition (CVD), atomic layer deposition (ALD), physical vapor deposition (PVD), or any suitable deposition technique. The thickness of the continuous ferroelectric material layer 154L can be in a range from 1 nm to 10 nm, such as from 2 nm to 5 nm, although lesser and greater thicknesses can also be used.

The continuous front-side gate dielectric layer 152L can include a single dielectric material layer or a stack of a plurality of dielectric material layers. In one embodiment, the continuous front-side gate dielectric layer 152L can include a silicon oxide layer. Optionally, the continuous front-side gate dielectric layer 152L can additionally include a dielectric metal oxide layer such as an aluminum oxide layer. The thickness of the continuous front-side gate dielectric layer 152L can be in a range from 1 nm to 10 nm, such as from 2 nm to 6 nm, although lesser and greater thicknesses can also be used. The continuous front-side gate dielectric layer 152L can be formed by a conformal deposition process such as low pressure chemical vapor deposition or atomic layer deposition.

The semiconductor channel material layer 160L can be deposited on the continuous front-side gate dielectric layer 152L. The semiconductor channel material layer 160L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 160L includes amorphous silicon or polysilicon. The semiconductor channel material layer 160L can be formed by a conformal deposition method such as low pressure chemical vapor deposition (LPCVD). The thickness of the semiconductor channel material layer 160L can be in a range from 2 nm to 10 nm, although lesser and greater thicknesses can also be used.

In one embodiment, the semiconductor channel material layer 160L can have a doping of the first conductivity type, which is the same conductivity type as the conductivity type of the doping of the semiconductor material layer 10. In one embodiment, the semiconductor channel material layer 160L can comprise a semiconducting material including electrical dopants at an atomic concentration in a range from $1.0 \times 10^{14}/cm^3$ to $1.0 \times 10^{18}/cm^3$.

Figure 7B:
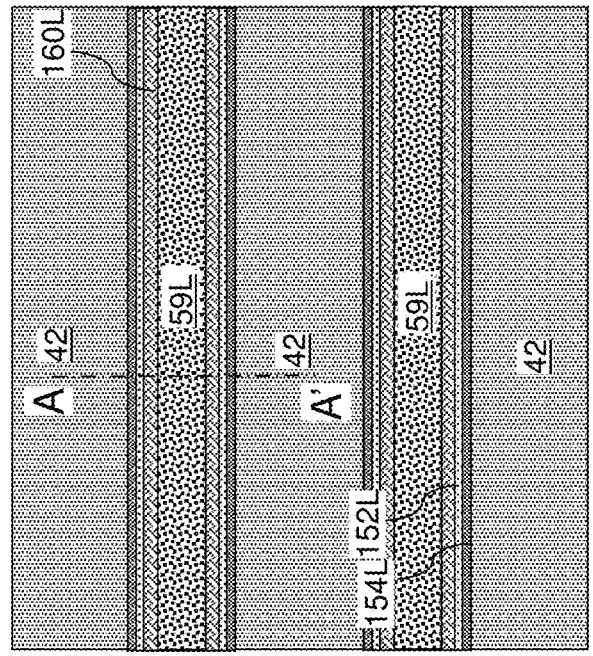
FIG. 7B is a horizontal cross-sectional view along the plane B-B' of FIG. 7A.
Figure 7A:
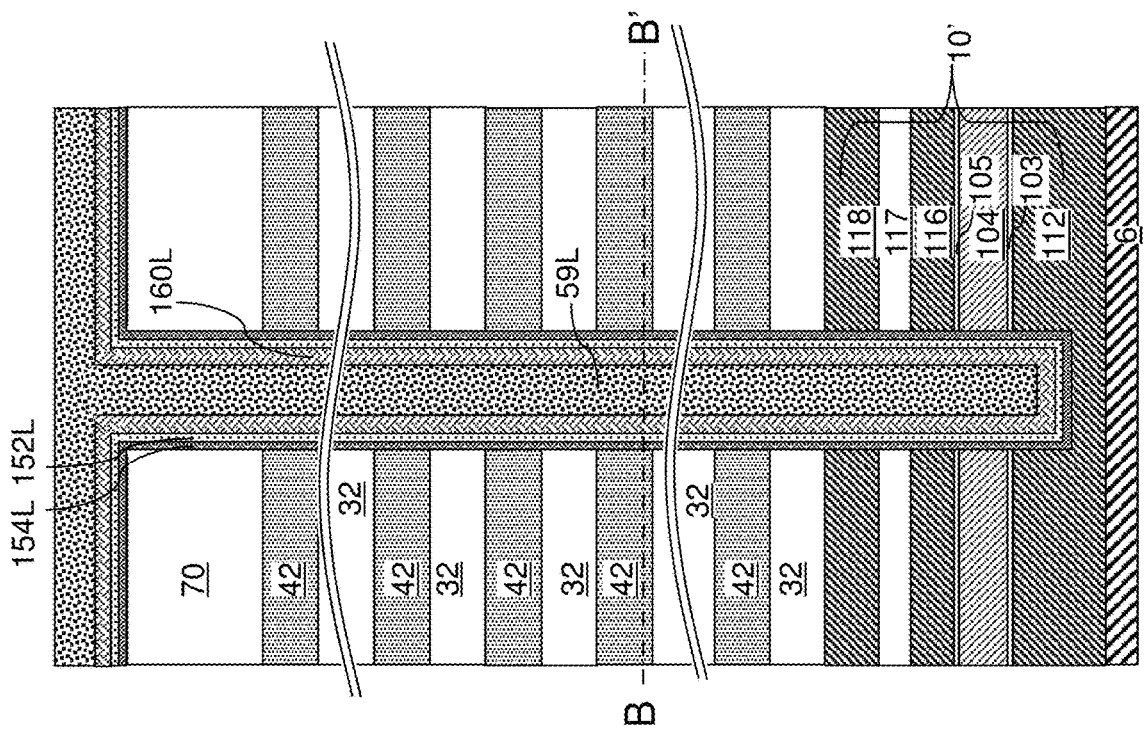
FIG. 7A is a vertical cross-sectional view of a line trench after formation of a sacrificial line trench fill material layer according to the first embodiment of the present disclosure.

Referring to FIGS. 7A and 7B, a sacrificial line trench fill material layer 59L can be formed by filling remaining volumes of the line trenches 149 with a sacrificial line trench fill material. The sacrificial line trench fill material comprises a material that can be subsequently removed selective to the material of the semiconductor channel material layer 160L. In one embodiment, the sacrificial line trench fill material layer 59L can include a spin-on sacrificial material such as spin-on carbon (SOC). In one embodiment, the spin-on-carbon material can include amorphous carbon in a volatile solvent that is removed after curing.

Figure 8A:
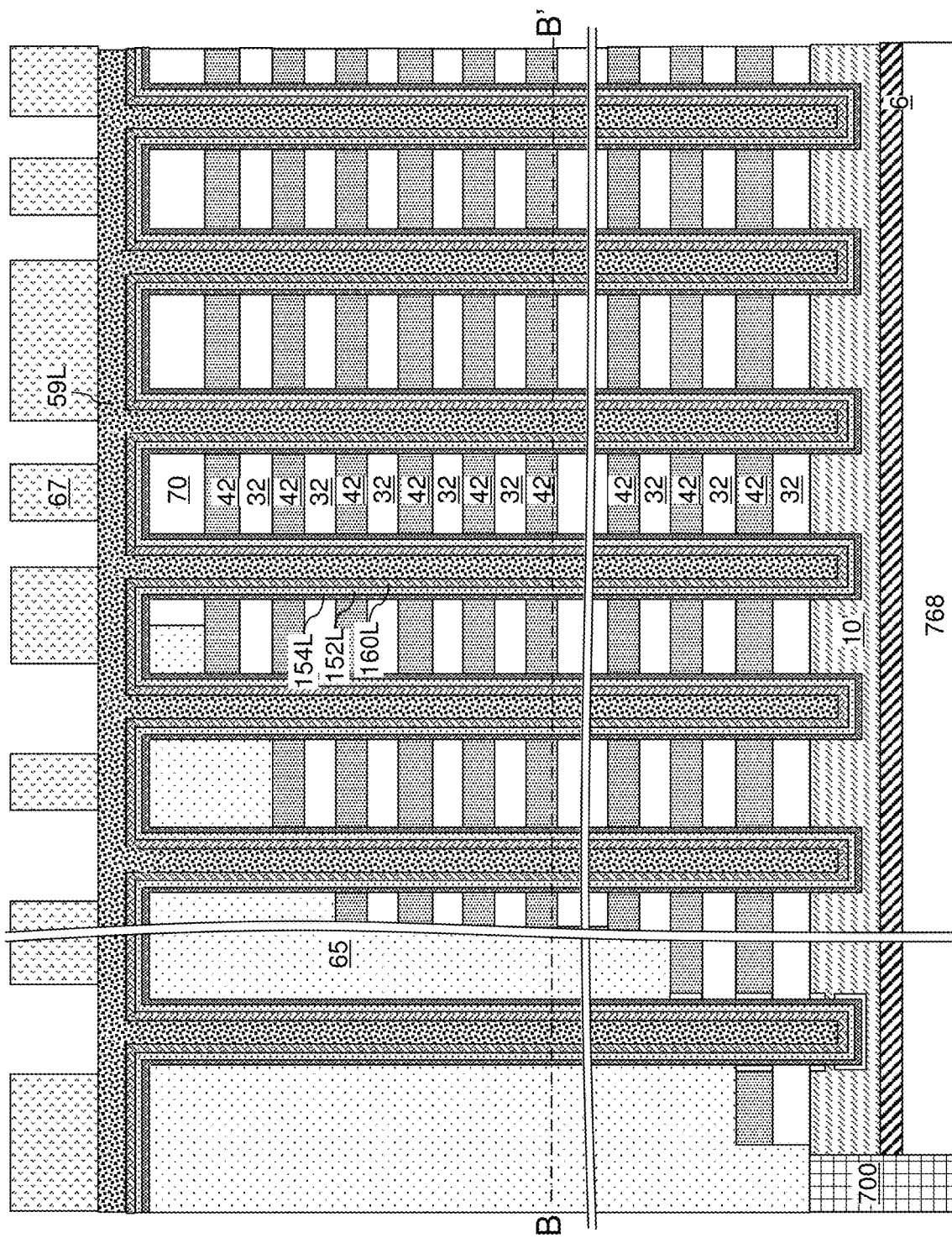
FIG. 8A is a vertical cross-sectional view of the first exemplary structure after formation of a patterned photoresist layer according to the first embodiment of the present disclosure.
Figure 8B:
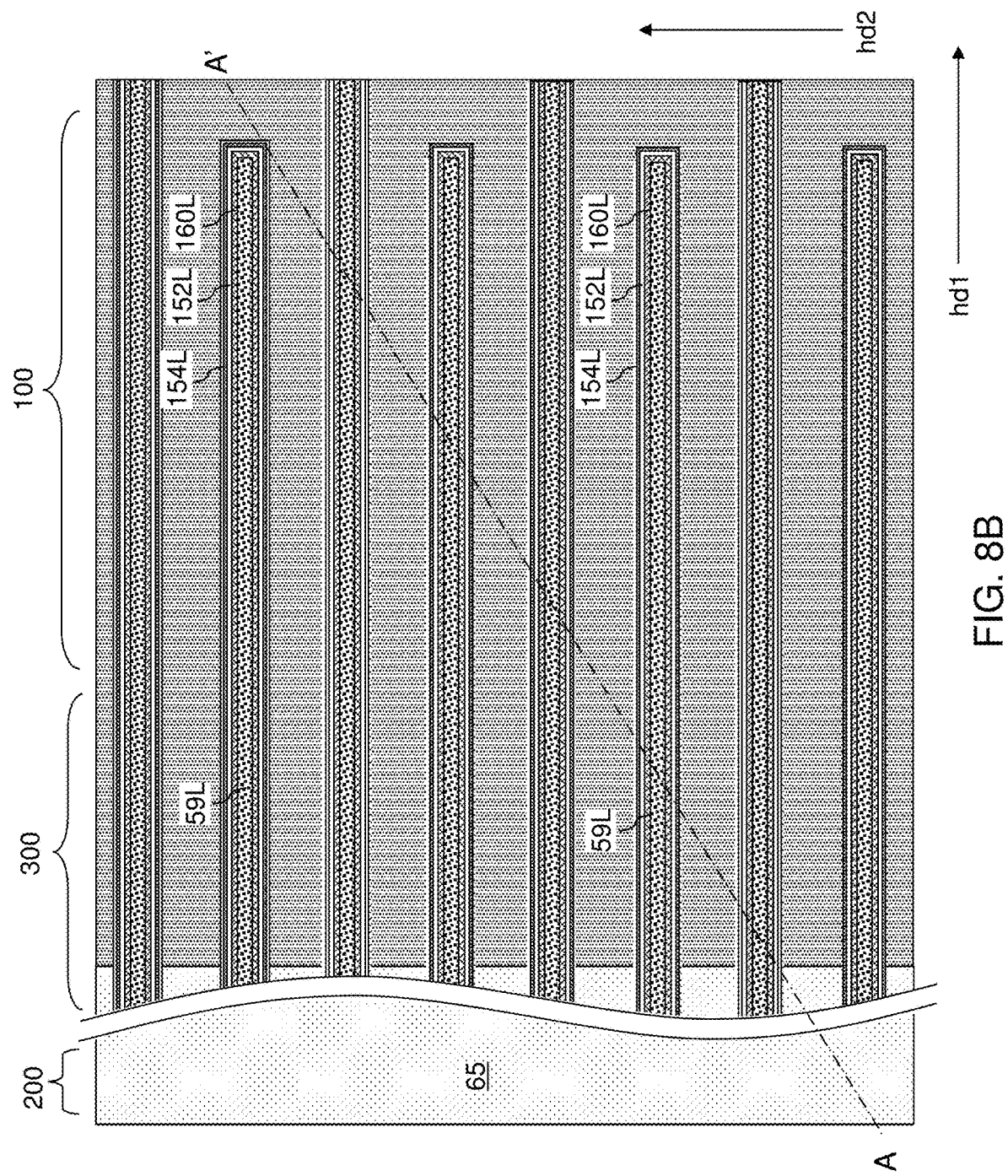
FIG. 8B is a horizontal cross-sectional view of the first exemplary structure along the plane B-B' of FIG. 8A.
Figure 8C:
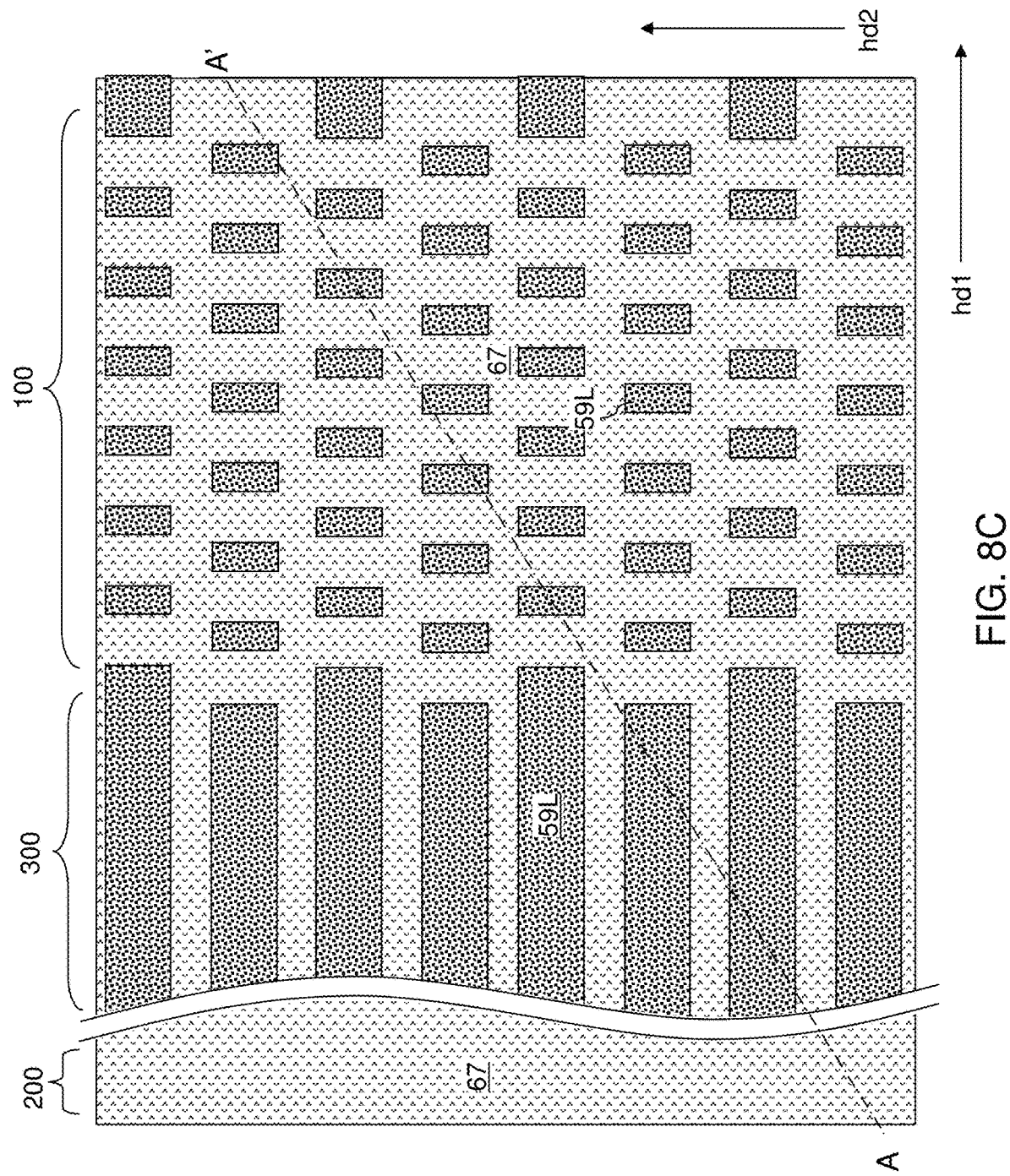
FIG. 8C is a top-down view of the first exemplary structure of FIGS. 8A and 8B.

Referring to FIGS. 8A-8C, a photoresist layer 67 can be applied over the sacrificial line trench fill material layer 59L, and can be lithographically patterned to form openings in the memory array region 100 and in the contact region 300. The pattern of opening in the memory array region 100 includes a two-dimensional array of discrete openings each corresponding to an area in which dielectric isolation pillars are to be subsequently formed. In one embodiment, the two-dimensional array of discrete openings can be a periodic two-dimensional array of discrete openings. The openings in the contact region 300 may be elongated along the first horizontal direction hd1, and may extend along the entire length of the staircase region (i.e., the stepped surfaces of the vertically alternating sequence (32, 42)) along the first horizontal direction hd1. Each opening in the photoresist layer 67 can overlie a respective area in which the sacrificial line trench fill material layer 59L vertically extends through the vertically alternating sequence (32, 42).

Figure 9A:
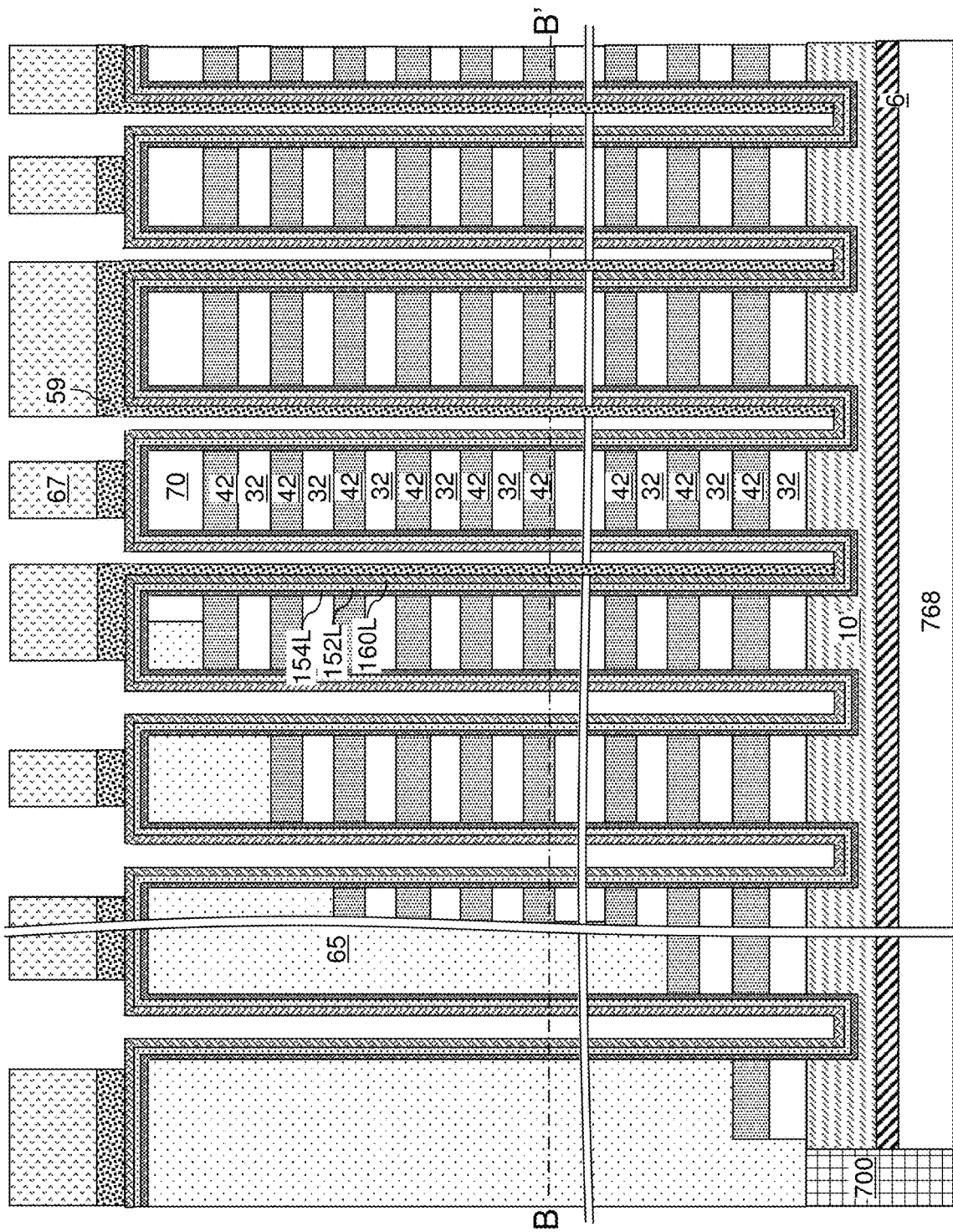
FIG. 9A is a vertical cross-sectional view of the first exemplary structure after anisotropically etching unmasked portions of the sacrificial line trench fill material layer and formation of pillar cavities according to the first embodiment of the present disclosure.
Figure 9B:
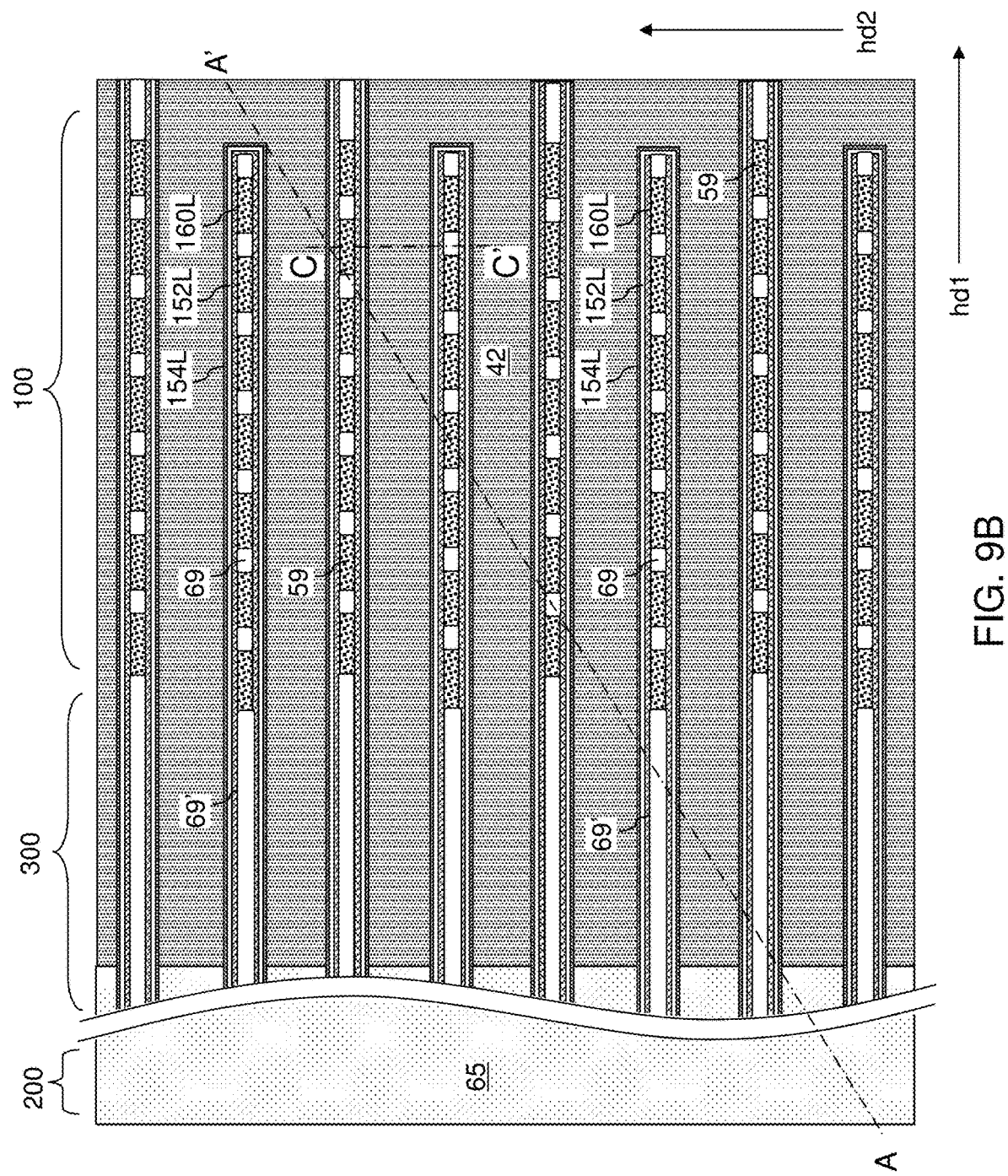
FIG. 9B is a horizontal cross-sectional view of the first exemplary structure along the plane B-B' of FIG. 9A.
Figure 9C:
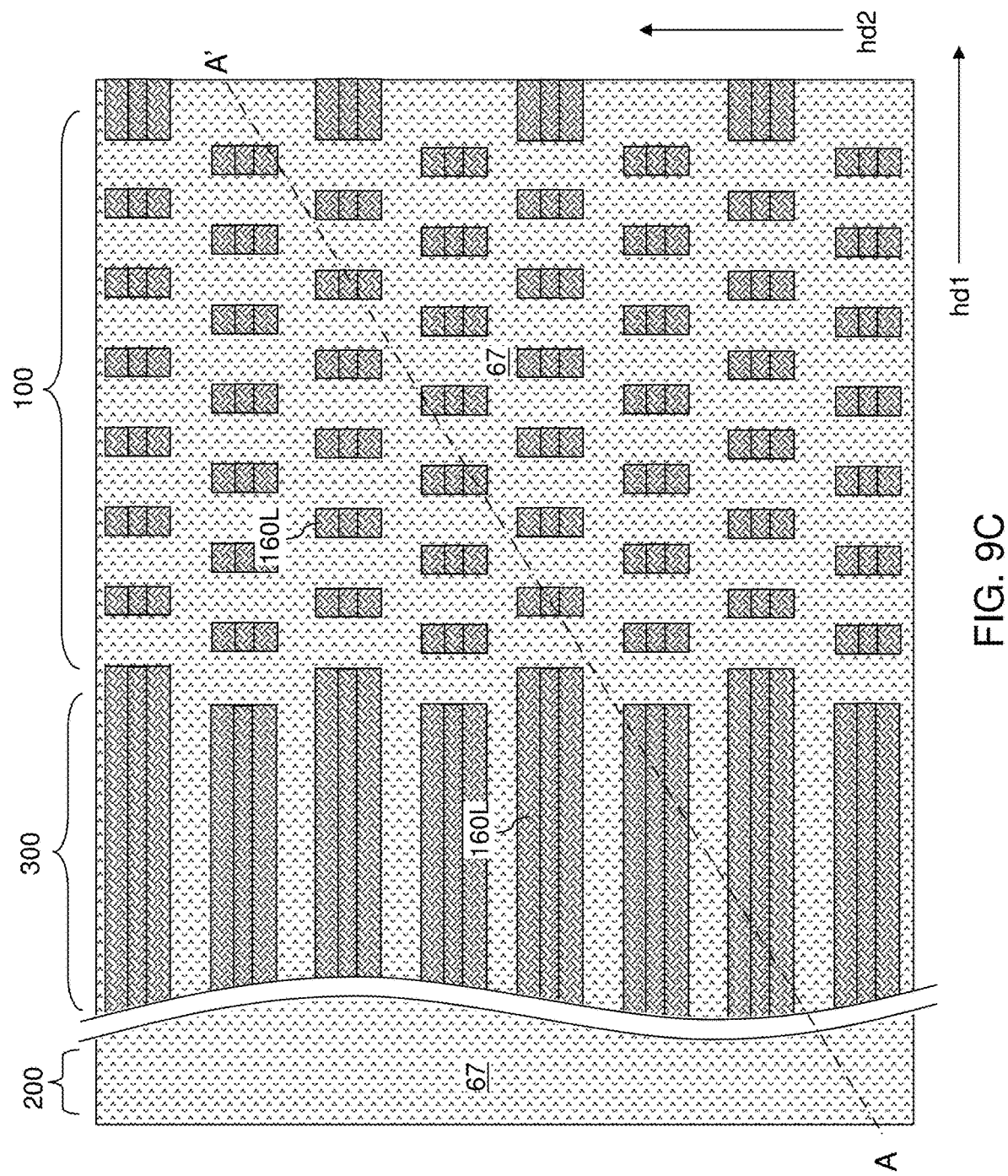
FIG. 9C is a top-down view of the first exemplary structure of FIGS. 9A and 9B.

Referring to FIGS. 9A-9C, the unmasked portions of the sacrificial line trench fill material layer 59L can be etched underneath each opening in the photoresist layer 67 by an anisotropic etch process. The anisotropic etch process can use a chemistry that etches the sacrificial line trench fill material selective to the material of the semiconductor channel material layer 160L. In one embodiment, a gas mixture for etching amorphous carbon selective to silicon can be used as the etchant gas during the anisotropic etch process. For example, a combination of carbonyl sulfide (COS) and $O_2$ or other reactive ion etch gas for etching carbon can be used. An array of pillar cavities 69 are formed in the volumes within the memory array region 100 from which the sacrificial line trench fill material is removed. Line cavities 69' are formed in volumes within the contact region 300 from which the sacrificial line trench fill material is removed. Thus, a plurality of vertical cavities (69, 69') extend through the sacrificial line trench fill material layers 59L, which continuously extends over the insulating cap layer 70 within multiple cavities (69, 69') therethrough.

Figure 10A:
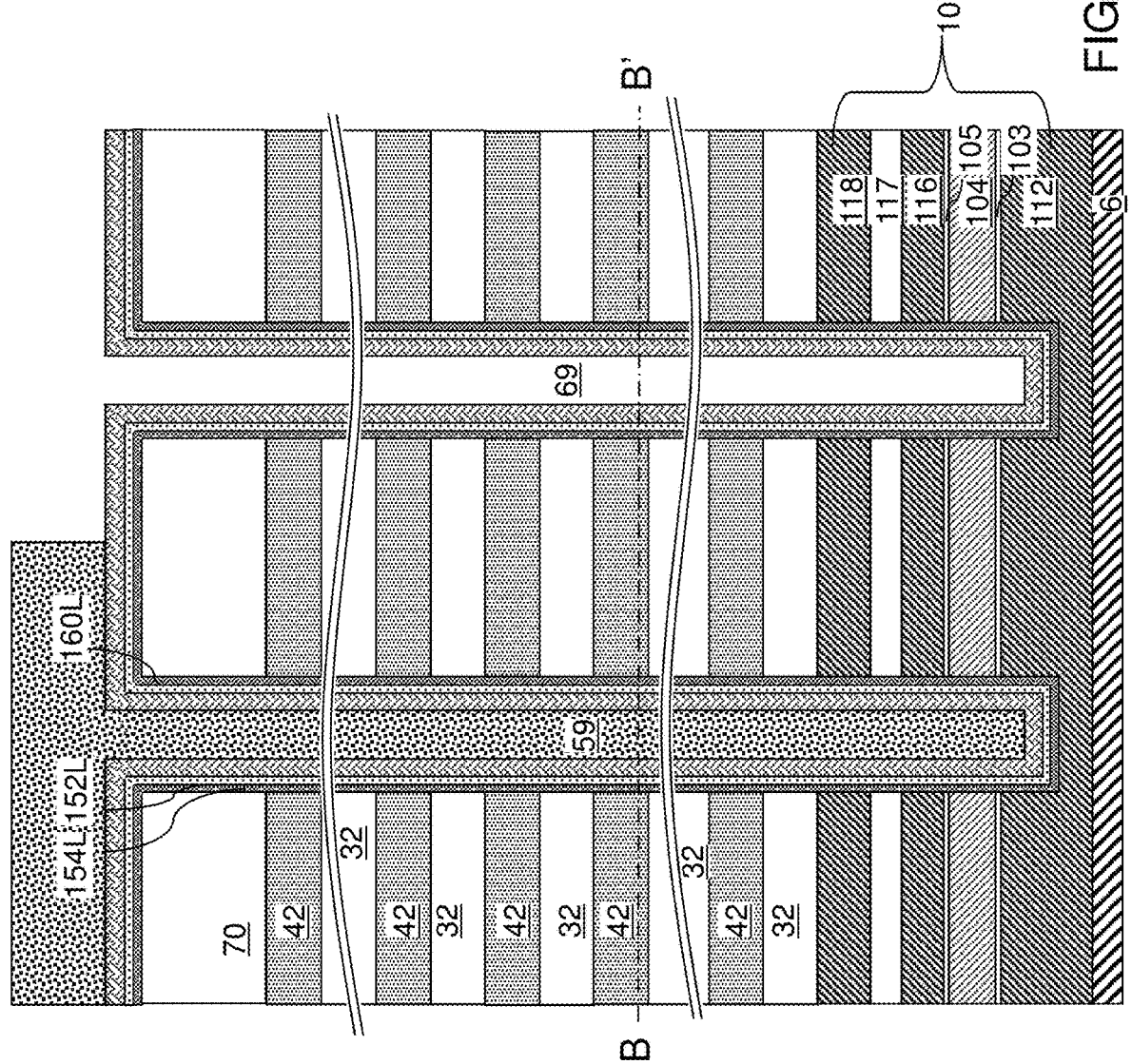
FIG. 10A is a vertical cross-sectional view of a region of the first exemplary structure after removal of the patterned photoresist layer according to the first embodiment of the present disclosure.
Figure 10B:
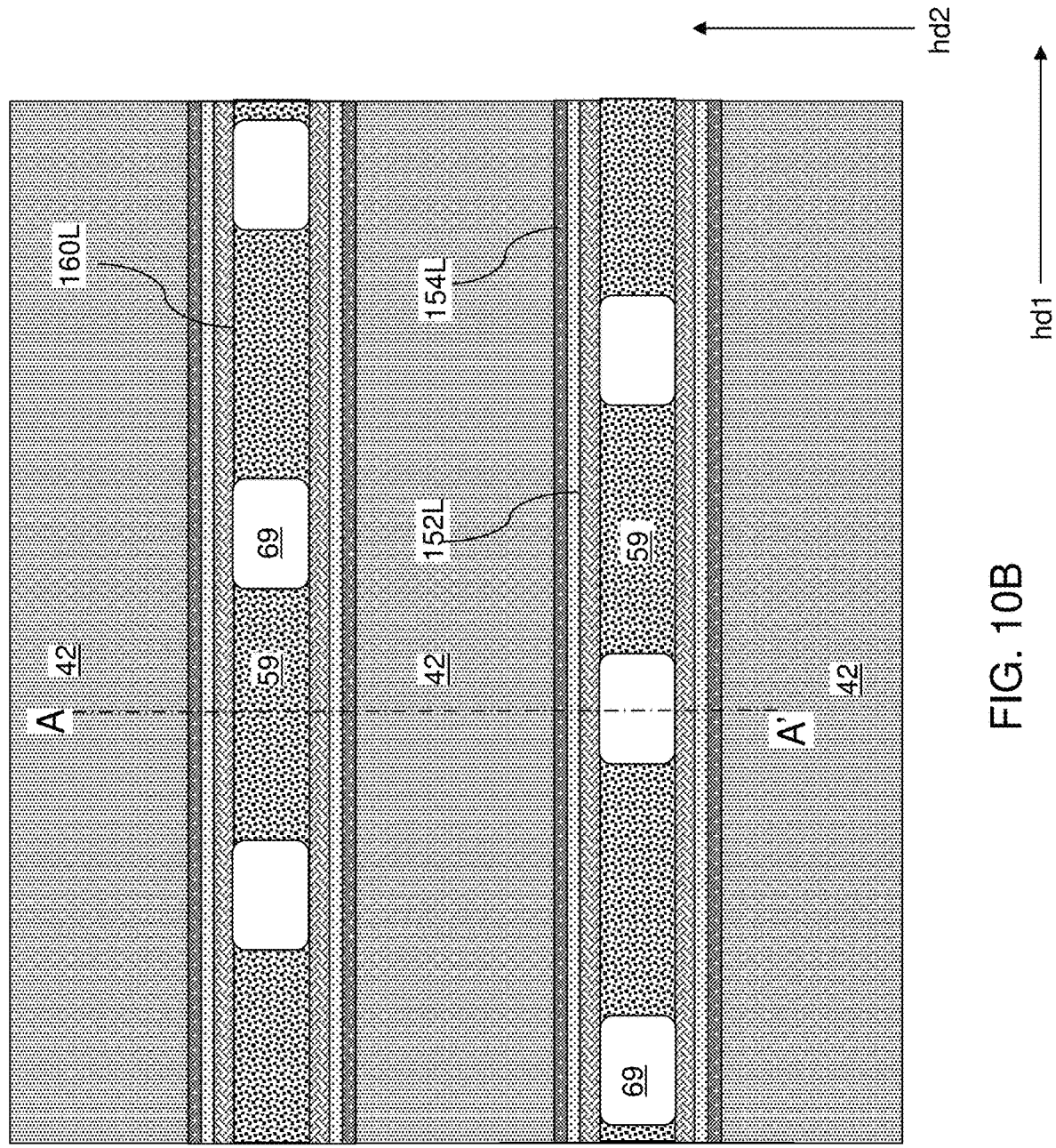
FIG. 10B is a horizontal cross-sectional view of the region of the first exemplary structure along the plane B-B' of FIG. 10A.

Referring to FIGS. 10A and 10B, the patterned photoresist layer 67 can be removed selective to the semiconductor channel material layer 160L, for example, by dissolution in an organic solvent.

Figure 11A:
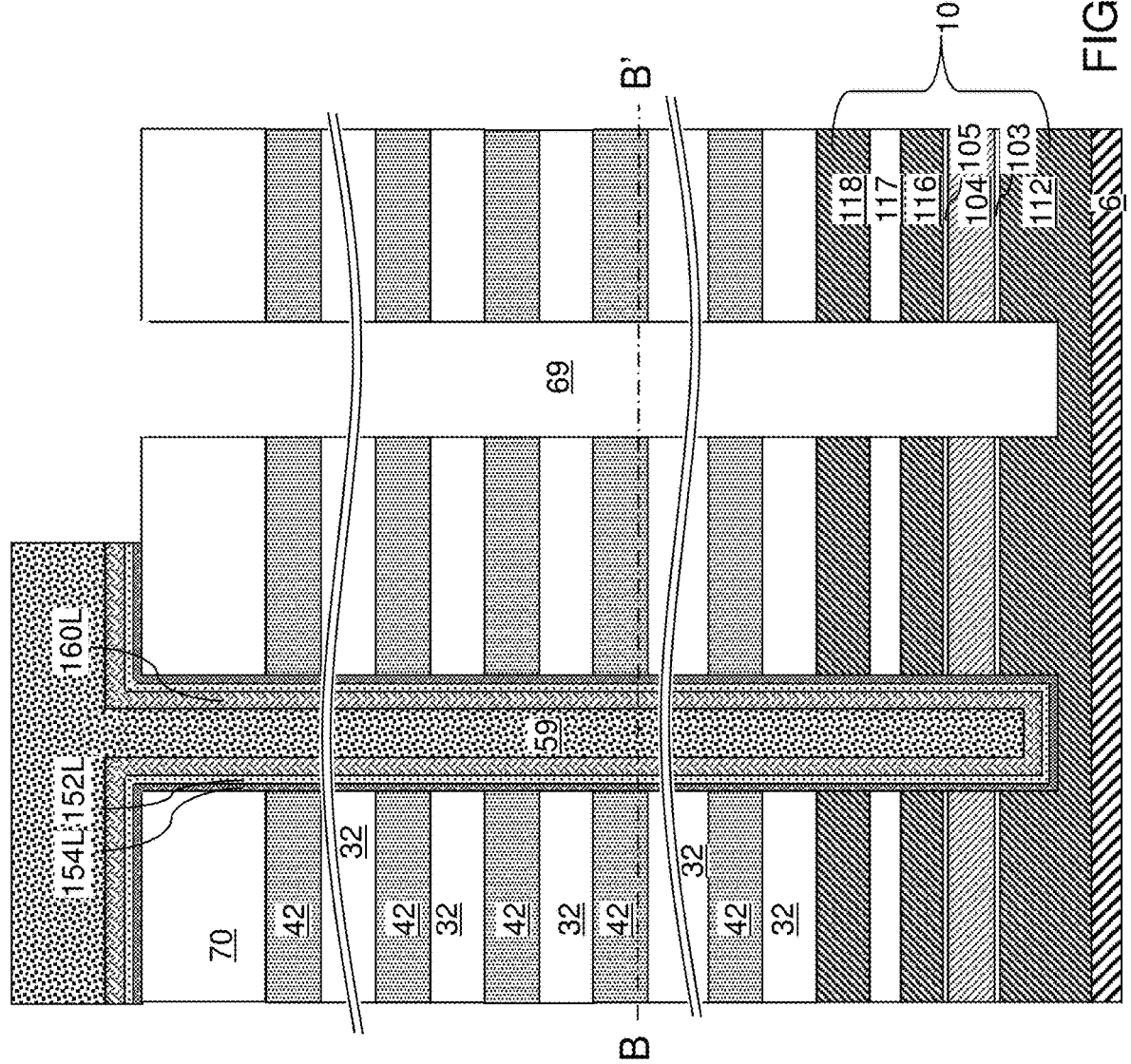
FIG. 11A is a vertical cross-sectional view of a region of the first exemplary structure after removal of portions of the semiconductor channel material layer, the continuous front-side gate dielectric layer, and the continuous ferroelectric material layer around each vertical cavity according to the first embodiment of the present disclosure.
Figure 11B:
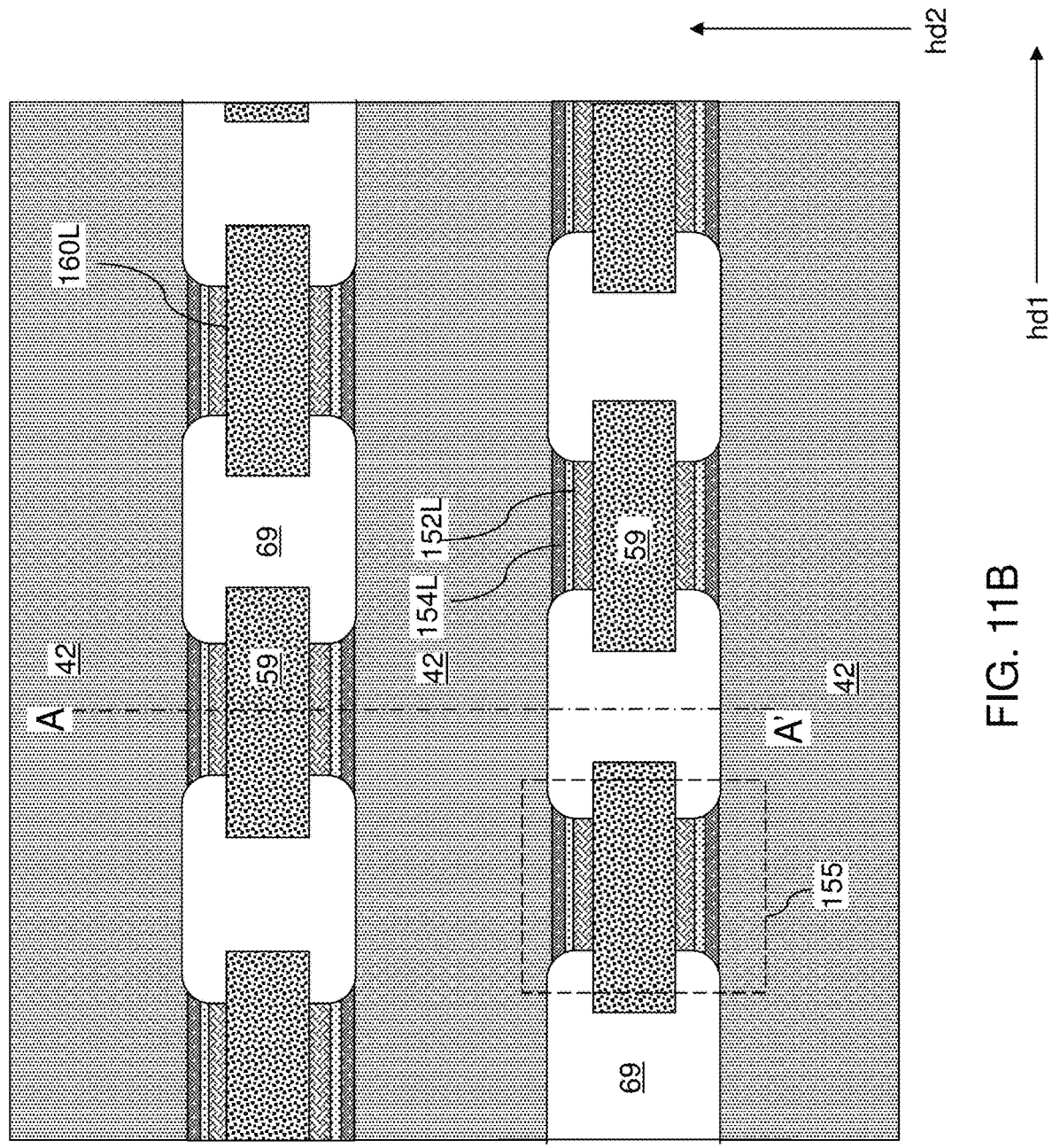
FIG. 11B is a horizontal cross-sectional view of the region of the first exemplary structure along the plane B-B' of FIG. 11A.

Referring to FIGS. 11A and 11B, portions of the semiconductor channel material layer 160L, the continuous front-side gate dielectric layer 152L, and the continuous ferroelectric material layer 154L are removed from each vertical cavity (69, 69'). In one embodiment, the portions of the semiconductor channel material layer 160L, the continuous front-side gate dielectric layer 152L, and the continuous ferroelectric material layer 154L can be sequentially etched around each vertical cavity (69, 69') by a sequence of etch processes. The duration of each etch process can be selected such that the etch distance is within a range from the thickness of each etched material layer to twice the thickness of the etched material layer. The sequence of etch processes can include a first wet etch process that etches the material of the semiconductor channel material layer 160L, a second wet etch process that etches the material of the continuous front-side gate dielectric layer 152L, and a third wet etch process that etches the material of the continuous ferroelectric material layer 154L. In an illustrative example, the semiconductor channel material layer 160L can include amorphous silicon or polysilicon, and the first wet etch process can use hot trimethyl-2 hydroxyethyl ammonium hydroxide ("hot TMY") or tetramethyl ammonium hydroxide (TMAH). The continuous front-side gate dielectric layer 152L can include aluminum oxide and/or silicon oxide and the second wet etch process can use a mixture of at least two of ammonium hydroxide, phosphoric acid, methyl hydroxide, bromine, hydrogen peroxide, and deionized water for aluminum oxide and/or dilute hydrofluoric acid for silicon oxide. The chemistry of the third wet etch process can be selected based on the composition of the continuous ferroelectric material layer 154L.

Figure 12A:
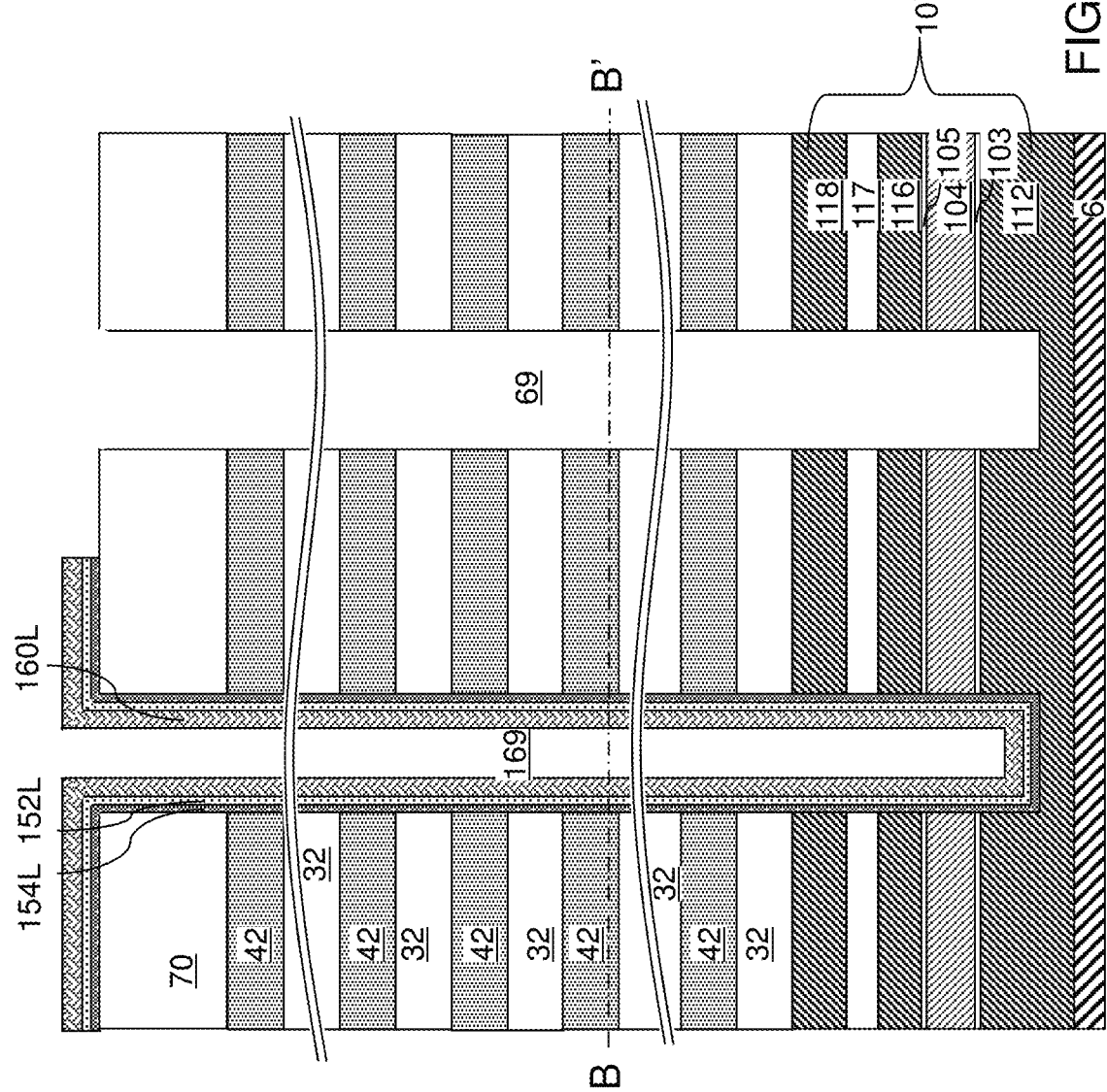
FIG. 12A is a vertical cross-sectional view of a region of the first exemplary structure after formation of line cavities by removal of remaining portions of the sacrificial line trench fill material layer according to the first embodiment of the present disclosure.
Figure 13A:
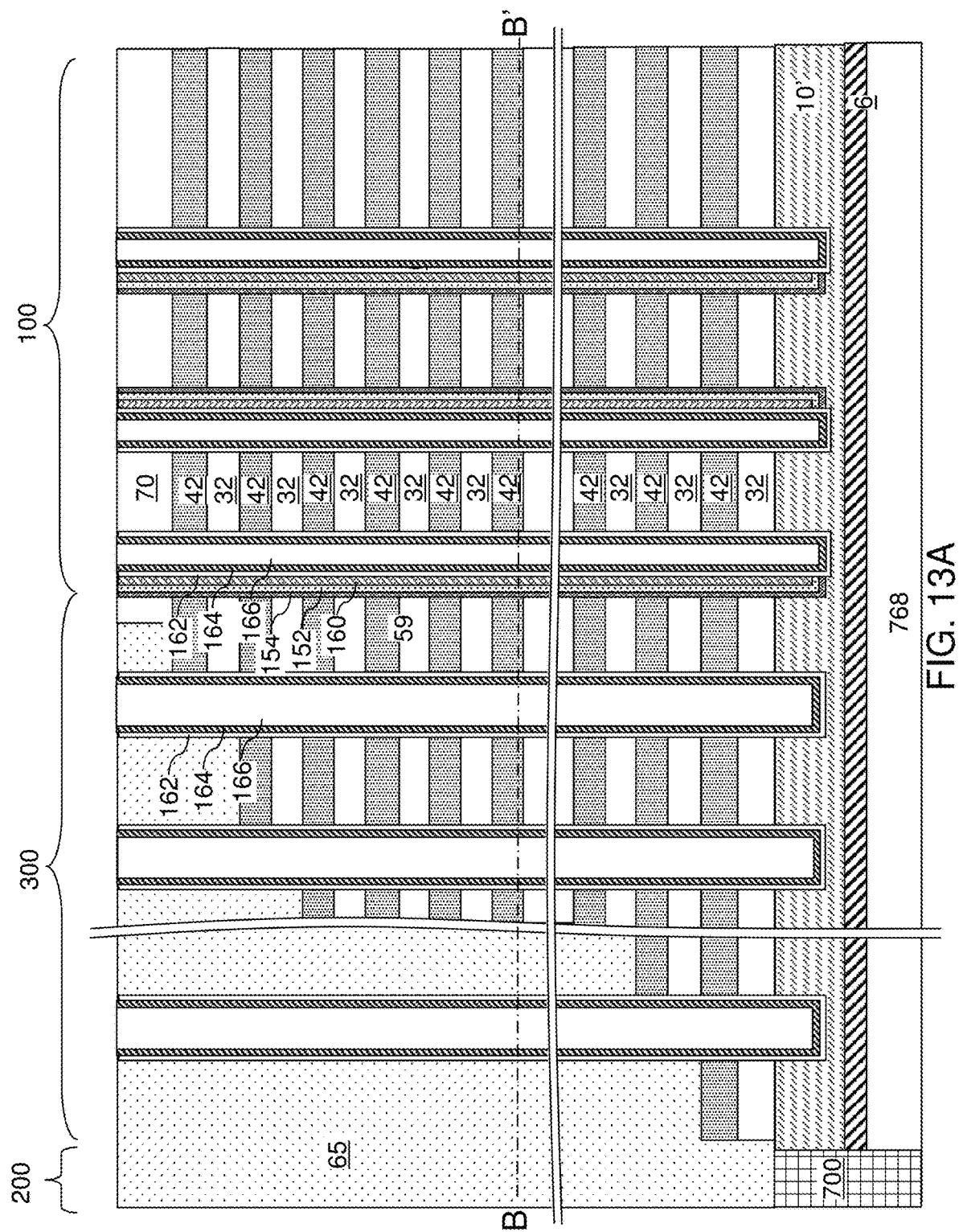
FIG. 13A is a vertical cross-sectional view of the first exemplary structure after formation of a backside gate dielectric layer, a backside gate electrode, and a laterally undulating dielectric rail within each line cavity according to the first embodiment of the present disclosure.
Figure 13B:
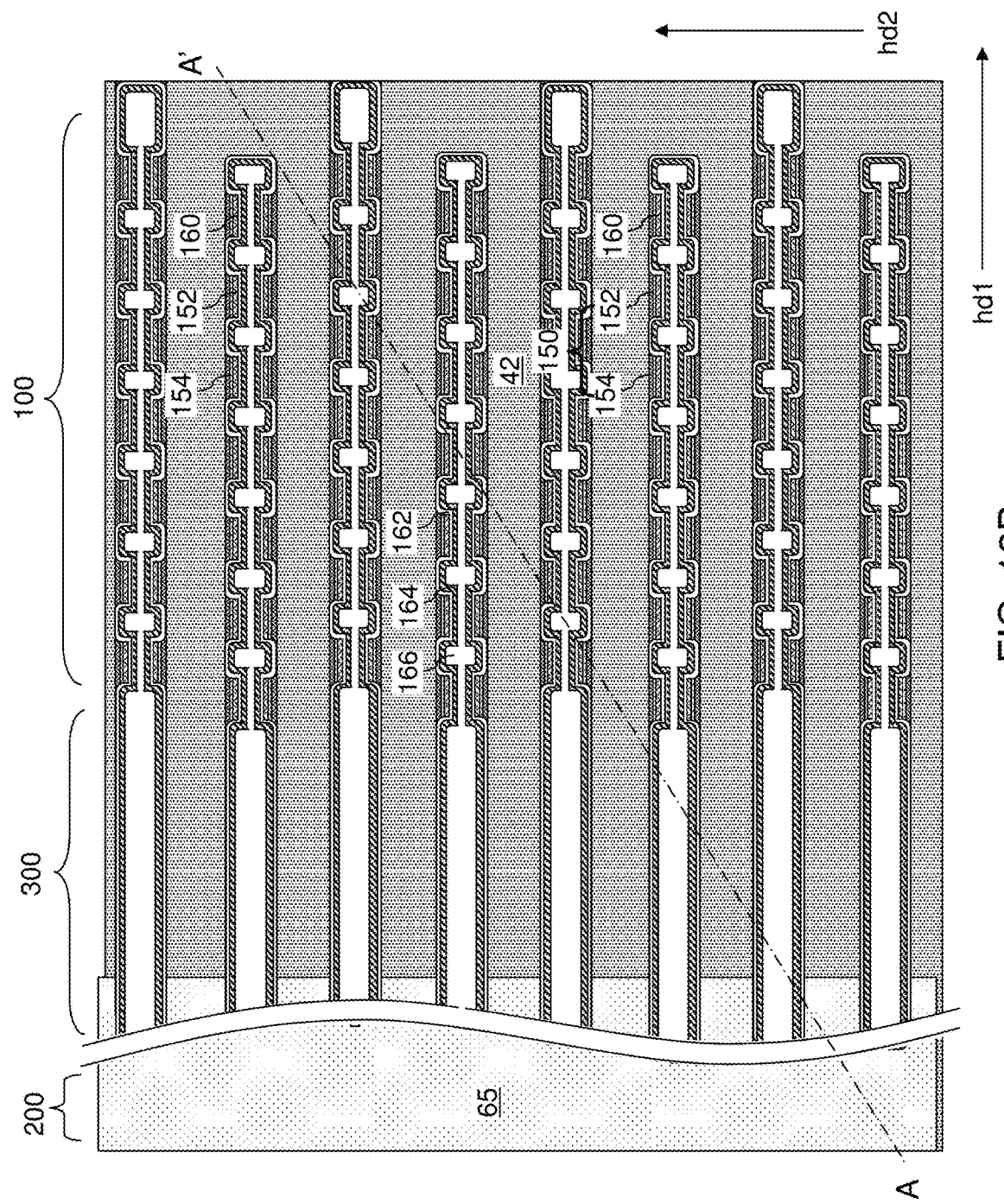
FIG. 13B is a top-down view of the first exemplary structure of FIG. 13A. The vertical plane A-A' is the plane of the cross-section for FIG. 13A.
Figure 13C:
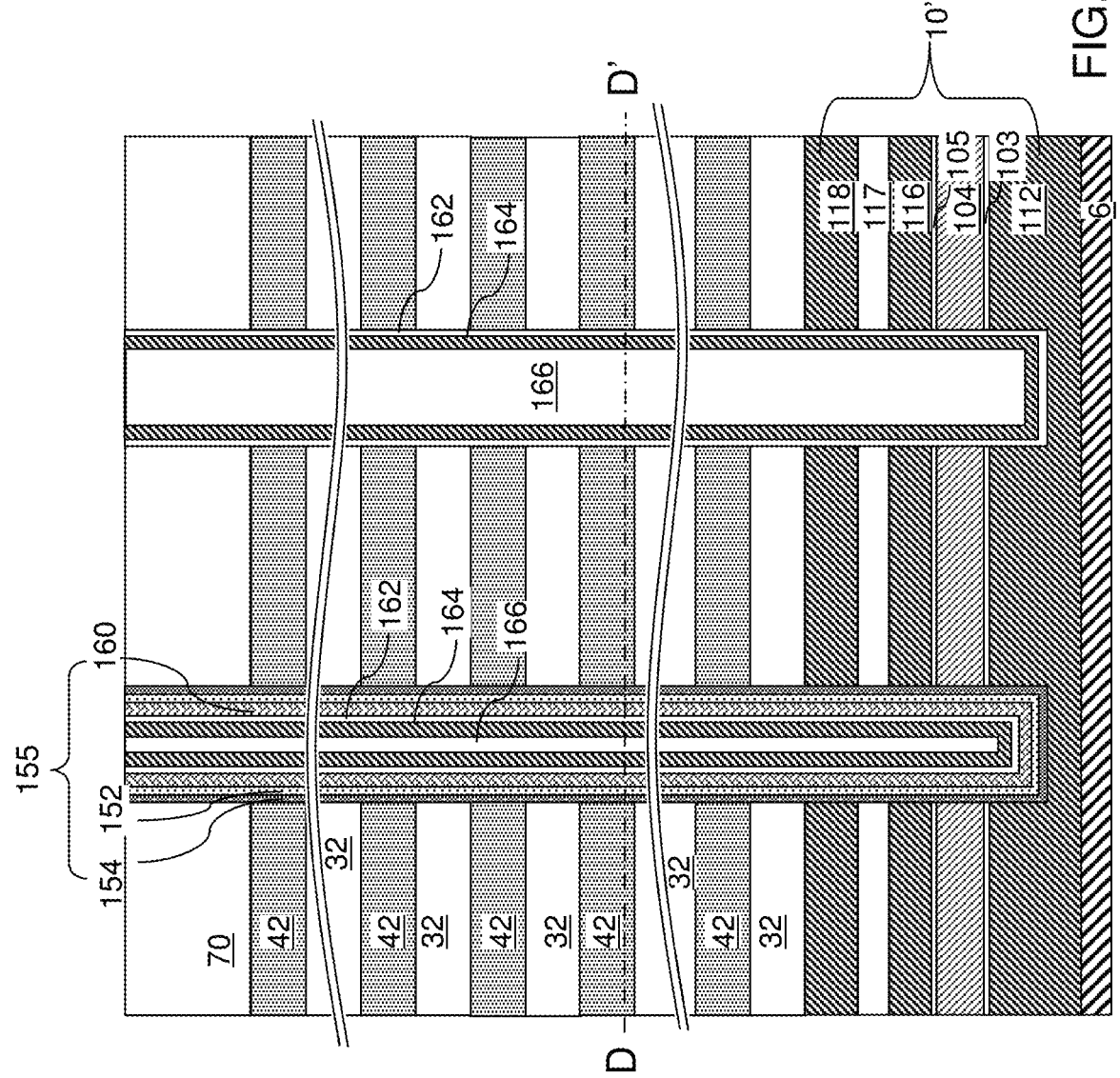
FIG. 13C is a vertical cross-sectional view of a region of the first exemplary structure of FIG. 13A.
Figure 13D:
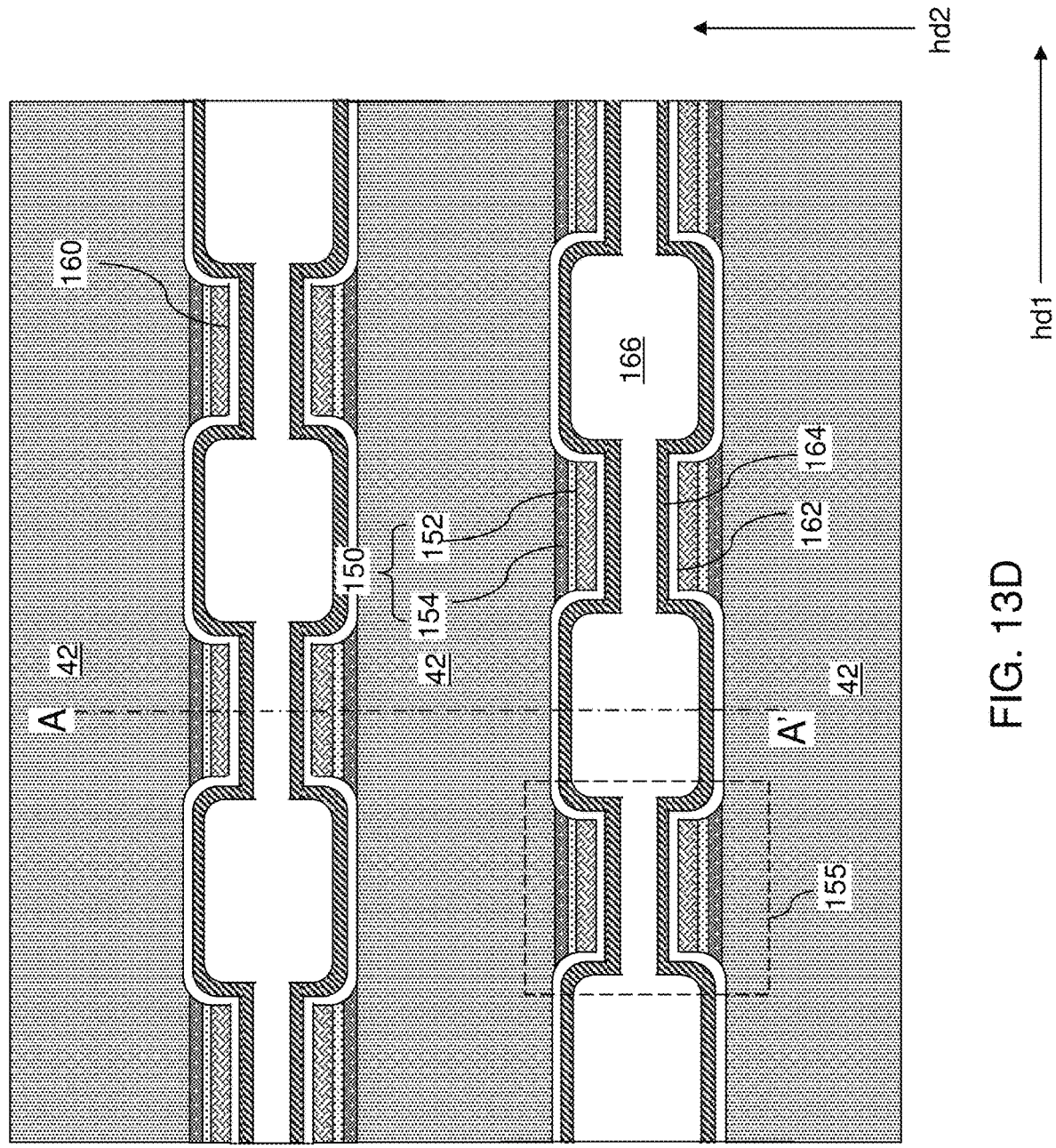
FIG. 13D is a horizontal cross-sectional view along the plane D-D' of FIG. 13C. The vertical plane C-C' is the plane of the cross-section for FIG. 13C.

Referring to FIGS. 12A and 12B, the sacrificial line trench fill material layers 59L can be removed selective to the semiconductor channel material layer 160L, the continuous front-side gate dielectric layer 152L, the continuous ferroelectric material layer 154L, and the vertically alternating sequence (32, 42). For example, the sacrificial line trench fill material layer 59L may be removed by ashing or by dissolution in an organic solvent. Upon removal of the sacrificial line trench fill material layer 59L, a neck cavity 169 is formed from each volume within the line trenches 149 from which a portion of the sacrificial line trench fill material layer 59L is removed. Each neck cavity 169 is adjoined to at least one neighboring pillar cavity 69. Laterally undulating cavities (69, 169) are formed within the unfilled volumes of the line trenches 149. Each laterally undulating cavity (69, 169) has a laterally undulating width, and is formed within a respective one of the line trenches 149. The volumes of the laterally undulating cavities (69, 169) include all volumes of the pillar cavities 69 and all volumes within the line trenches 149 from which the sacrificial line trench fill material layer 59L is removed. Each laterally undulating cavity (69, 169) can laterally extend along the first horizontal direction hd1 and can have a periodically undulating width along the second horizontal direction hd2 within the memory array region 100. Each laterally undulating cavity (69, 169) includes a laterally alternating sequence of pillar cavities 69 (corresponding to bulbous regions) and neck cavities 169 (corresponding to neck regions). Each laterally undulating cavity (69, 169) can laterally extend through the memory array region 100 and the contact region 300 along the first horizontal direction hd1.

Referring to FIGS. 13A-13D, at least one dielectric material can be conformally deposited in each continuous line cavity 269 by a conformal deposition process to form a backside gate dielectric layer. The backside gate dielectric layer can include a silicon oxide layer, and may optionally include a dielectric metal oxide layer, such as an aluminum oxide layer. The thickness of the backside gate dielectric layer can be in a range from 1 nm to 10 nm, such as from 2 nm to 6 nm, although lesser and greater thicknesses can also be used.

A conductive material is conformally deposited to form a gate electrode material layer. The gate electrode material layer can include a heavily doped semiconductor material layer and/or a metallic material that can be used as a gate electrode material. For example, the gate electrode material layer can include doped polysilicon. For example, the gate electrode material layer can have a thickness in a range from 4 nm to 100 nm, such as from 6 nm to 40 nm, although lesser and greater thicknesses can also be used.

A dielectric fill material can be deposited by a conformal deposition process or a self-planarizing process. For example, low pressure chemical vapor deposition (LPCVD) may be used to conformally deposit a silicate glass material, or spin coating may be used to deposit a spin-on glass. Optionally, an anneal process may be performed to densify or reflow the silicate glass material.

Excess portions of the semiconductor channel material layer 160L, the continuous front-side gate dielectric layer 152L, the continuous ferroelectric material layer 154L, the backside gate dielectric layer, the gate electrode material layer, and the dielectric fill material can be removed from above the horizontal plane including the top surface of the insulating cap layer 70 by a planarization process, which can include a recess etch or chemical mechanical planarization. Each of the semiconductor channel material layer 160L, the continuous front-side gate dielectric layer 152L, the continuous ferroelectric material layer 154L, the backside gate dielectric layer, the gate electrode material layer, and the dielectric fill material is divided into multiple discrete portions by the planarization process. Each divided material portion can be located within a volume of a respective one of the line trenches 149.

Each remaining portion of the dielectric fill material constitutes a laterally undulating dielectric rail 166 that includes a respective laterally alternating sequence of bulbous regions and neck regions. Each remaining portion of the gate electrode material layer constitutes a backside gate electrode 164, which can have a U-shaped vertical cross-sectional profile and laterally extends along the first horizontal direction hd1. Each remaining portion of the backside gate dielectric layer constitutes a backside gate dielectric 162, which can have a U-shaped vertical cross-sectional profile and laterally extends along the first horizontal direction hd1. Each remaining portion of the semiconductor channel material layer 160L constitutes a vertical semiconductor channel 160, which can have a U-shaped vertical cross-sectional profile. Each line trench 149 includes a one-dimensional array of vertical semiconductor channels 160. Each remaining portion of the continuous front-side gate dielectric layer 152L constitutes a front-side gate dielectric 152, which can have a U-shaped vertical cross-sectional profile. Each line trench 149 includes a one-dimensional array of front-side gate dielectrics 152. Each remaining portion of the continuous ferroelectric material layer 154L constitutes a ferroelectric material layer 154, which can have a U-shaped vertical cross-sectional profile. Each line trench 149 includes a one-dimensional array of ferroelectric material layers 154.

Each set of a front-side gate dielectric 152 and a ferroelectric material layer 154 constitutes a memory film 150. Each set of a vertical semiconductor channel 160 and a memory film 150 constitutes a memory stack structure 155, which is subsequently modified to form a completed memory stack structure. The continuous ferroelectric material layer 154L, the continuous front-side gate dielectric layer 152L, and the semiconductor channel material layer 160L are patterned into the memory stack structures 155. Thus, each set of remaining portions of the semiconductor channel material layer 160L, the continuous front-side gate dielectric layer 152L, and the continuous ferroelectric material layer 154L constitutes a memory stack structure 155. Each memory stack structure 155 comprises a ferroelectric material layer 154, a front-side gate dielectric 152 contacting the ferroelectric material layer 154, and a vertical semiconductor channel 160 contacting the front-side gate dielectric 152.

A backside gate dielectric 162 and a backside gate electrode 164 are formed within each of the line trenches 149 over a respective subset of the vertical semiconductor channels 160. Each backside gate dielectric 162 can comprise a conformal dielectric material layer. Each backside gate electrode 164 can include a laterally alternating sequence of neck regions and bulbous regions. Each of the bulbous regions of a backside gate electrode 164 has a greater lateral extent than the neck regions of the backside gate electrode 164 along the second horizontal direction hd2 that is perpendicular to the first horizontal direction hd1. Each line trench 149 is filled with a respective line trench fill structure (154, 152, 160, 162, 164, 166), which includes two rows of ferroelectric material layers 154, two rows of front-side gate dielectrics 152, a one-dimensional array of vertical semiconductor channels 160, a backside gate dielectric 162, a backside gate electrode 164, and a laterally undulating dielectric rail 166.

Figure 14A:
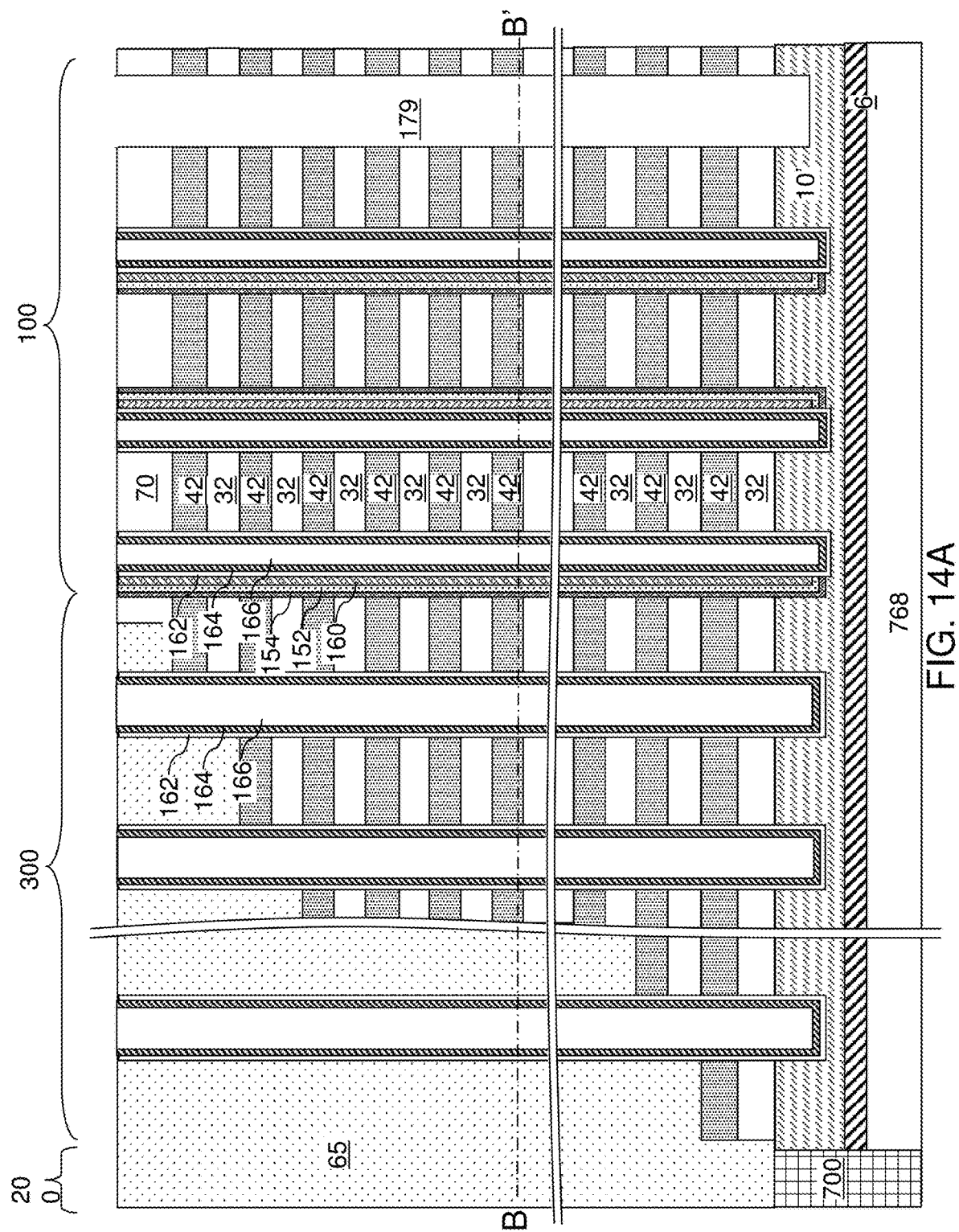
FIG. 14A is a vertical cross-sectional view of the first exemplary structure after formation of backside via cavities according to the first embodiment of the present disclosure.
Figure 14B:
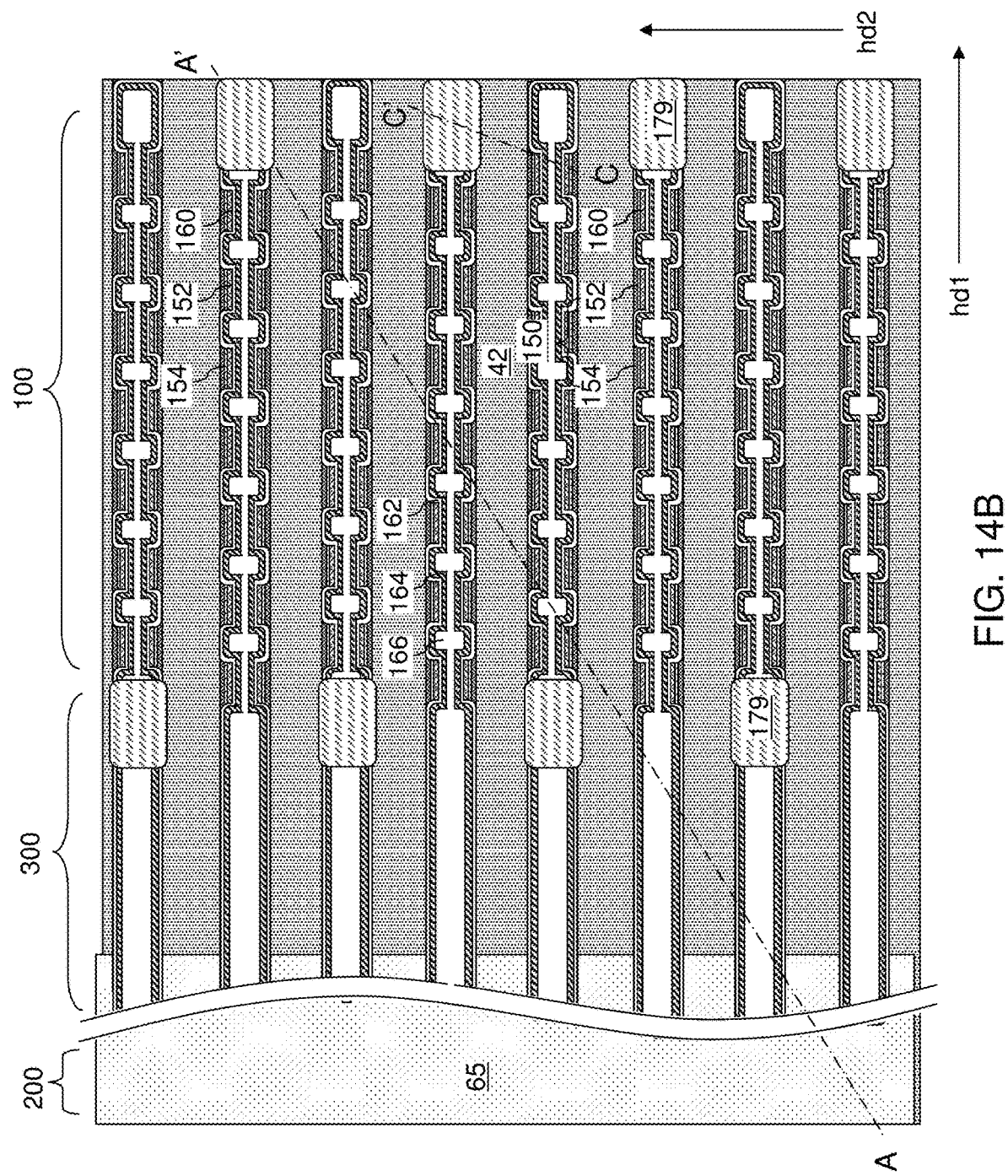
FIG. 14B is a top-down view of the first exemplary structure of FIG. 14A. The vertical plane A-A' is the plane of the cross-section for FIG. 14A.
Figure 14C:
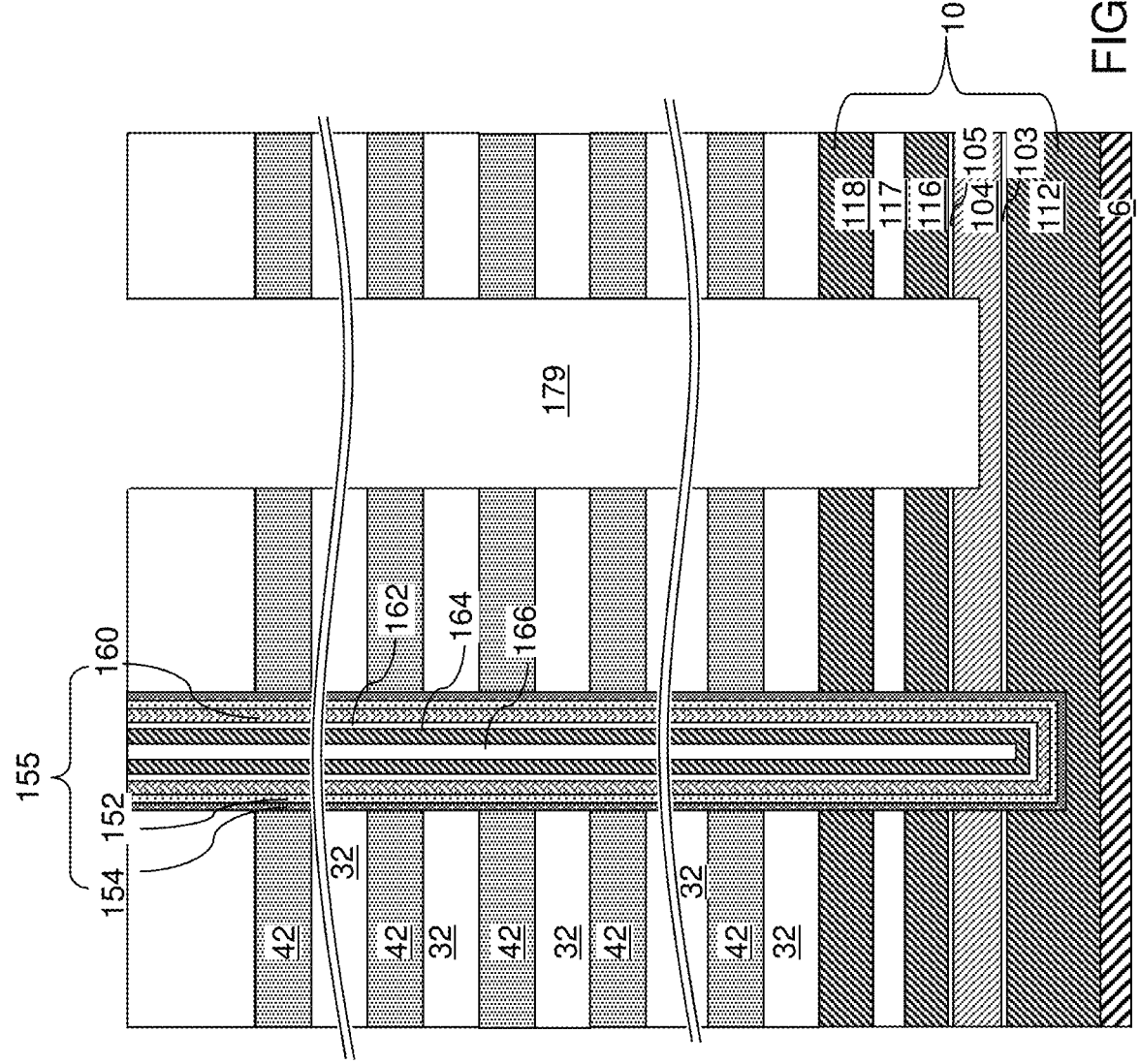
FIG. 14C is a vertical cross-sectional view of a region of the first exemplary structure along the vertical plane C-C' of FIG. 14C.

Referring to FIGS. 14A-14C, backside via cavities 179 can be formed through discrete regions of the laterally undulating dielectric rail 166 and through regions of the vertically alternating sequence (32, 42) that are located in proximity to end regions of the laterally undulating dielectric rail 166. In one embodiment, a first subset of the backside via cavities 179 can be formed within areas of lateral extension of the line trenches 149 along the first horizontal direction hd1 within the memory array region 100. Further, a second subset of the backside via cavities 179 can be formed within areas that overlap with the laterally undulating dielectric rails 166, and/or within the areas of lateral extension of the line trenches 149 along the first horizontal direction hd1 within the contact region 300. Thus, the combination of the line trenches 149 and the first subset of the backside via cavities 179 can divide the vertically alternating sequence of the insulating layers 32 and the sacrificial material layers 42 into a plurality of alternating stacks of insulating strips and sacrificial material strips. Each patterned portion of the insulating layers 32 constitutes an insulating strip, and each patterned portion of the sacrificial material layers 42 constitutes a sacrificial material strip. As such, each insulating strip is henceforth referred to using the same reference numeral as the insulating layers 32, and each sacrificial material strip is henceforth referred to using the same reference numeral as the sacrificial material layers 42.

The locations of the backside via cavities 179 can be selected such that each point within the sacrificial material strips 42 is laterally spaced from a most proximal one of the backside via cavities 179 by a lateral distance that does not exceed a lateral etch distance during a subsequent etch process that etches the material of the sacrificial material strips 42 selective to the materials of the insulating strips 32 and the ferroelectric material layers 154. The width of each backside via cavity 179 along the second horizontal direction hd2 may be the same as, or greater than, the width of the line trenches 149 along the second horizontal direction hd2, and is less than the pitch of the line trenches 149 along the second horizontal direction hd2. The length of each backside via cavity 179 along the first horizontal direction hd1 may be the same as, less than, or greater than, the length of the bulbous regions of the laterally undulating dielectric rails 166.

The insulating strips 32 and the sacrificial material strips 42, i.e., the remaining portions of the vertically alternating sequence, comprise alternating stacks of insulating strips 32 and sacrificial material strips 42. Within each alternating stack of insulating strips 32 and sacrificial material strips 42, the insulating strips 32 and the sacrificial material strips 42 alternate vertically, and laterally extend along the first horizontal direction hd1. The alternating stacks of insulating strips 32 and sacrificial material strips 42 and the line trench fill structures (154, 152, 160, 162, 164, 166) are formed over a substrate 8. The alternating stacks (32, 42) laterally extend along a first horizontal direction hd1 and are laterally spaced apart one from another by the line trench fill structures (154, 152, 160, 162, 164, 166) along a second horizontal direction hd2. The alternating stacks (32, 42) and the line trench fill structures (154, 152, 160, 162, 164, 166) laterally alternate along the second horizontal direction hd2.

Figure 15A:
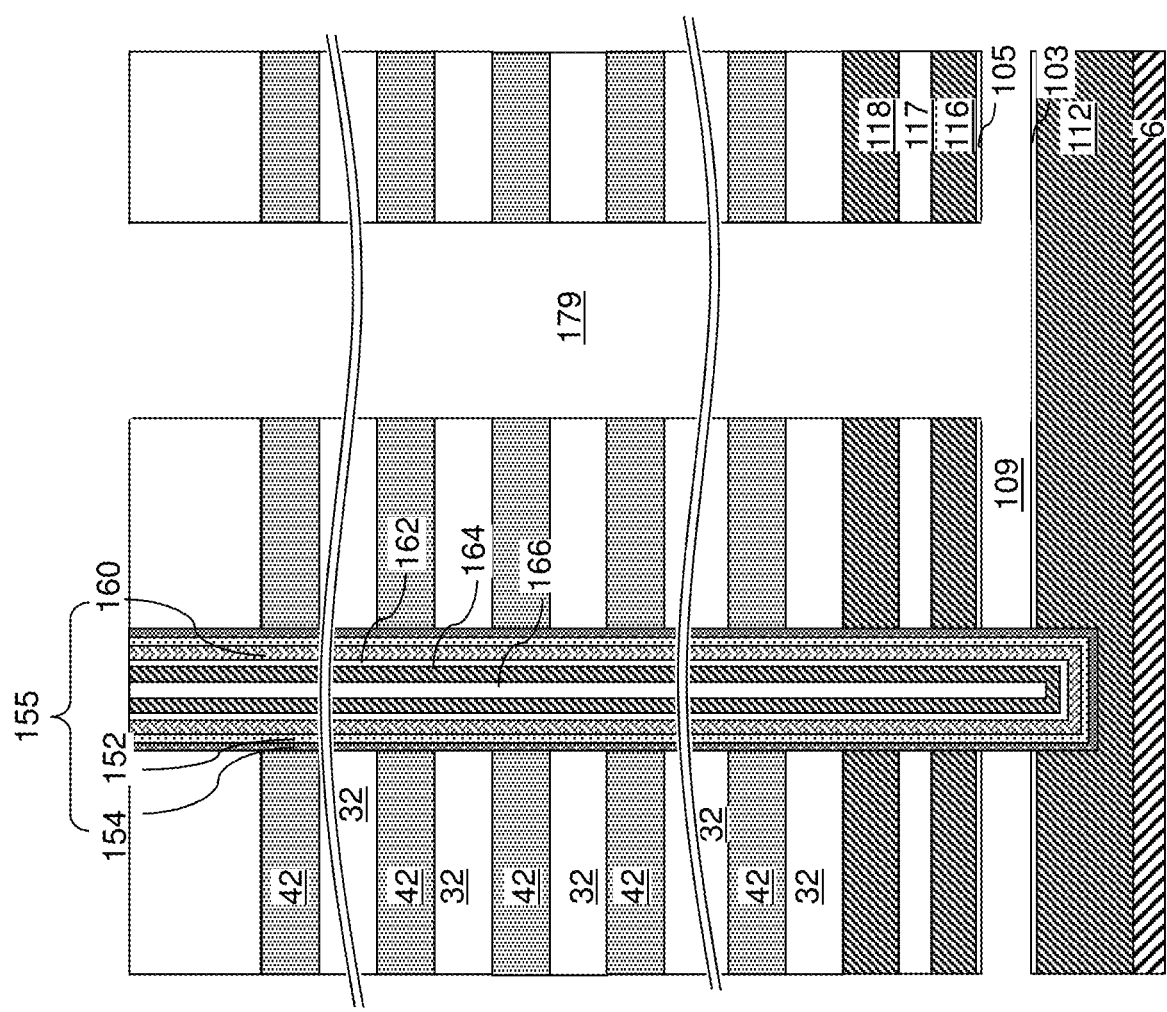
FIGS. 15A-15C are sequential vertical cross-sectional views of a region of the first exemplary structure during replacement of in-process source-level material layers with source-level material layers according to the first embodiment of the present disclosure.
Figure 15B:
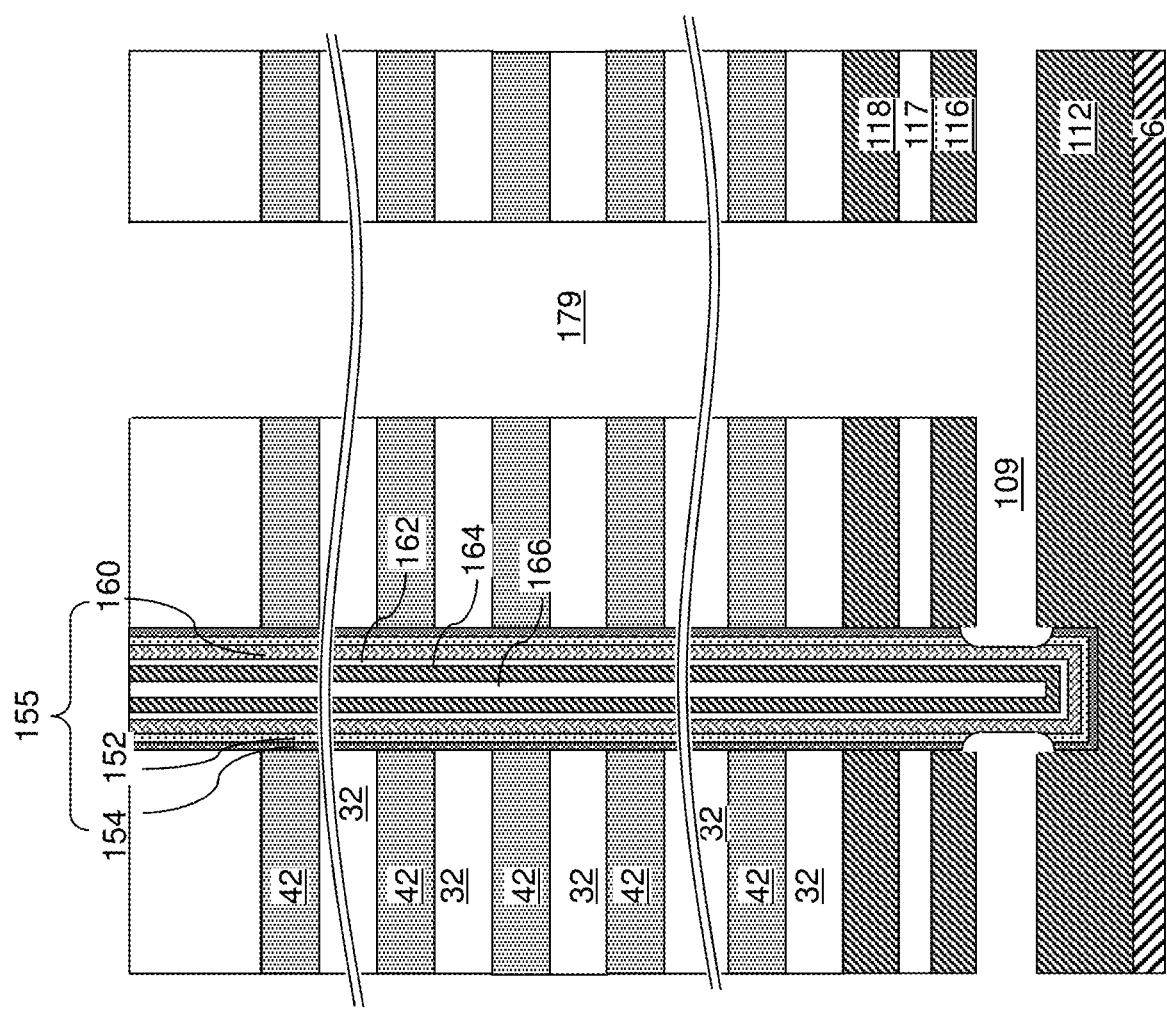
Figure 15C:
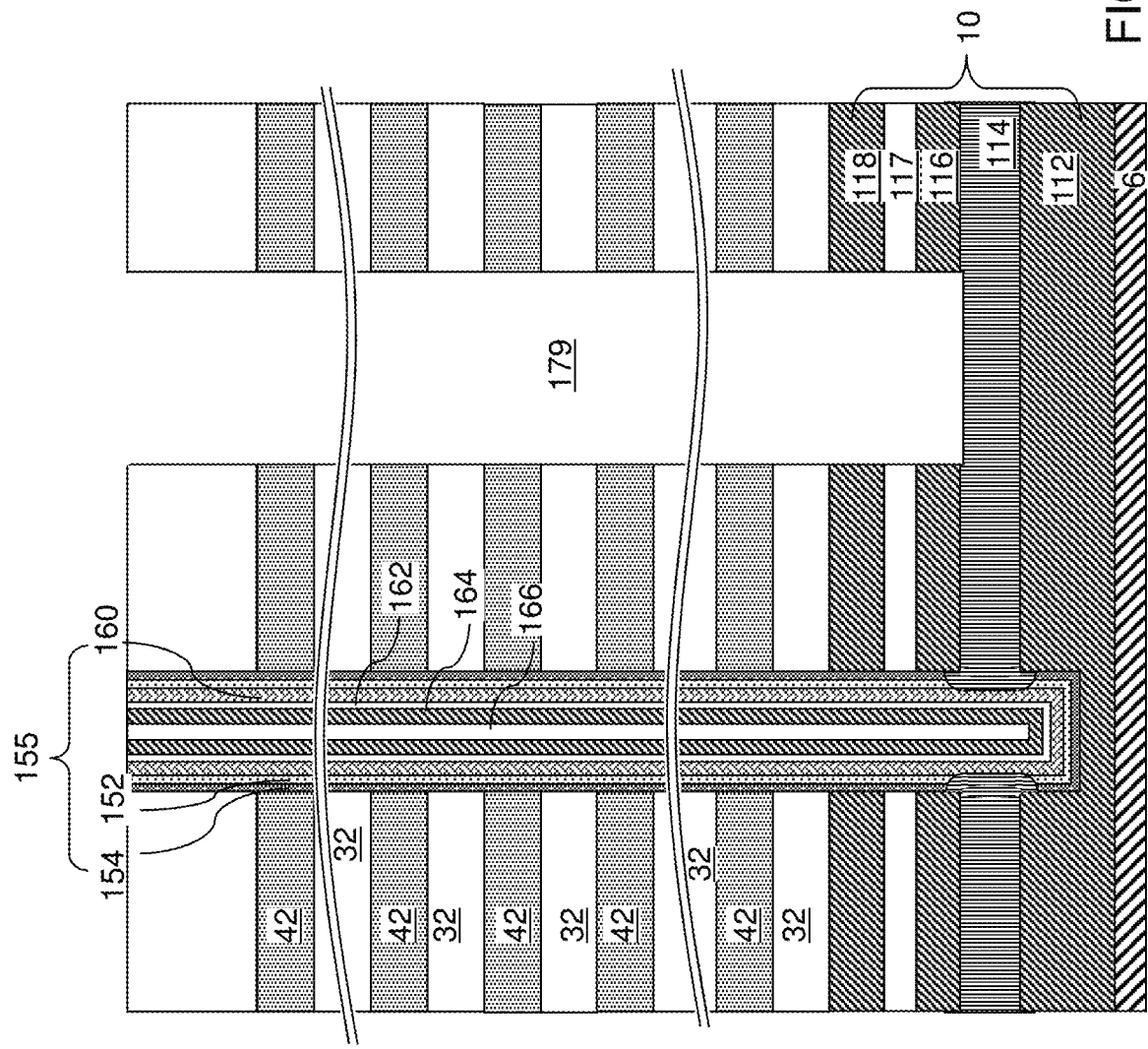

FIGS. 15A-15C are sequential vertical cross-sectional views of a region of the first exemplary structure during replacement of in-process source-level material layers 10' with source-level material layers according to an embodiment of the present disclosure.

Referring to FIG. 15A, an etchant that etches the material of the source-level sacrificial layer 104 selective to the materials of the lower source layer 112, the upper source layer 116, the optional source-select-level conductive layer 118, the alternating stack (32, 42), the insulating cap layer 70, and the source-level insulating strip 117 can be introduced into the backside trenches in an isotropic etch process. For example, if the source-level sacrificial layer 104 includes undoped amorphous silicon or an undoped amorphous silicon-germanium alloy, the lower source layer 112, the upper source layer 116, and the optional source-select-level conductive layer 118 include heavily n-doped silicon, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) can be used to remove the source-level sacrificial layer 104 selective to the lower source layer 112, the upper source layer 116, the optional source-select-level conductive layer 118, the alternating stack (32, 42), the insulating cap layer 70, and the source-level insulating strip 117, and the upper and lower sacrificial liners (105, 103). A source cavity 109 is formed in the volume from which the source-level sacrificial layer 104 is removed.

Referring to FIG. 15B, a sequence of isotropic etchants, such as wet etchants, can be applied to the physically exposed portions of the memory films 150. The component layers of the memory films 150 are etched from outside to inside. Cylindrical surfaces of the vertical semiconductor channels 60 are physically exposed at the level of the source cavity 109. The upper and lower sacrificial liners (105, 103) can be collaterally etched during removal of the portions of the memory films 150 located at the level of the source cavity 109. The source cavity 109 can be expanded in volume by removal of the portions of the memory films 150 at the level of the source cavity 109 and the upper and lower sacrificial liners (105, 103). A top surface of the lower source layer 112 and a bottom surface of the upper source layer 116 can be physically exposed to the source cavity 109.

Each one-dimensional array of U-shaped ferroelectric material layers 154 in a line trench 149 is divided into two rows of ferroelectric material layers 154. Each one-dimensional array of U-shaped front-side gate dielectrics 152 is divided into two rows of front-side gate dielectrics 152. A stacked cap of a first material portion including a same material as a ferroelectric material layer 154 and a second material portion including a same material as a front-side gate dielectric 152 is formed underneath each U-shaped vertical semiconductor channel 160 below the level of the source cavity 109.

Referring to FIG. 15C, a doped semiconductor material having a doping of the second conductivity type can be deposited by a selective semiconductor deposition process. A semiconductor precursor gas, an etchant, and a dopant precursor gas can be flowed concurrently into a process chamber including the first exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine. The deposited doped semiconductor material forms a source contact layer 114, which can contact sidewalls of the vertical semiconductor channels 60. The duration of the selective semiconductor deposition process can be selected such that the source cavity 109 is filled with the source contact layer 114. Thus, the source contact layer 114 can be formed by selectively depositing a doped semiconductor material from semiconductor surfaces around the source cavity 109. In one embodiment, the doped semiconductor material can include doped polysilicon.

The layer stack including the lower source layer 112, the source contact layer 114, and the upper source layer 116 constitutes a buried source layer (112, 114, 116), which functions as a common source region that is connected each of the vertical semiconductor channels 60 and has a doping of the second conductivity type. The average dopant concentration in the buried source layer (112, 114, 116) can be in a range from $5.0 \times 10^{19}/cm^3$ to $2.0 \times 10^{21}/cm^3$, although lesser and greater dopant concentrations can also be used. The set of layers including the buried source layer (112, 114, 116), the source-level insulating strip 117, and the optional source-select-level conductive layer 118 constitutes source-level material layers 10, which replaces the in-process source-level material layers 10'. Optionally, an oxidation process can be performed to convert a surface portion of the source contact layer 114 into a semiconductor oxide portion (not illustrated) underneath each backside via cavity 179. The surface portion of each semiconductor layer (114, 116, 118) exposed in each backside via cavity 179 can optionally be oxidized to form semiconductor oxide (e.g., silicon oxide) cover portions.

Figure 16:
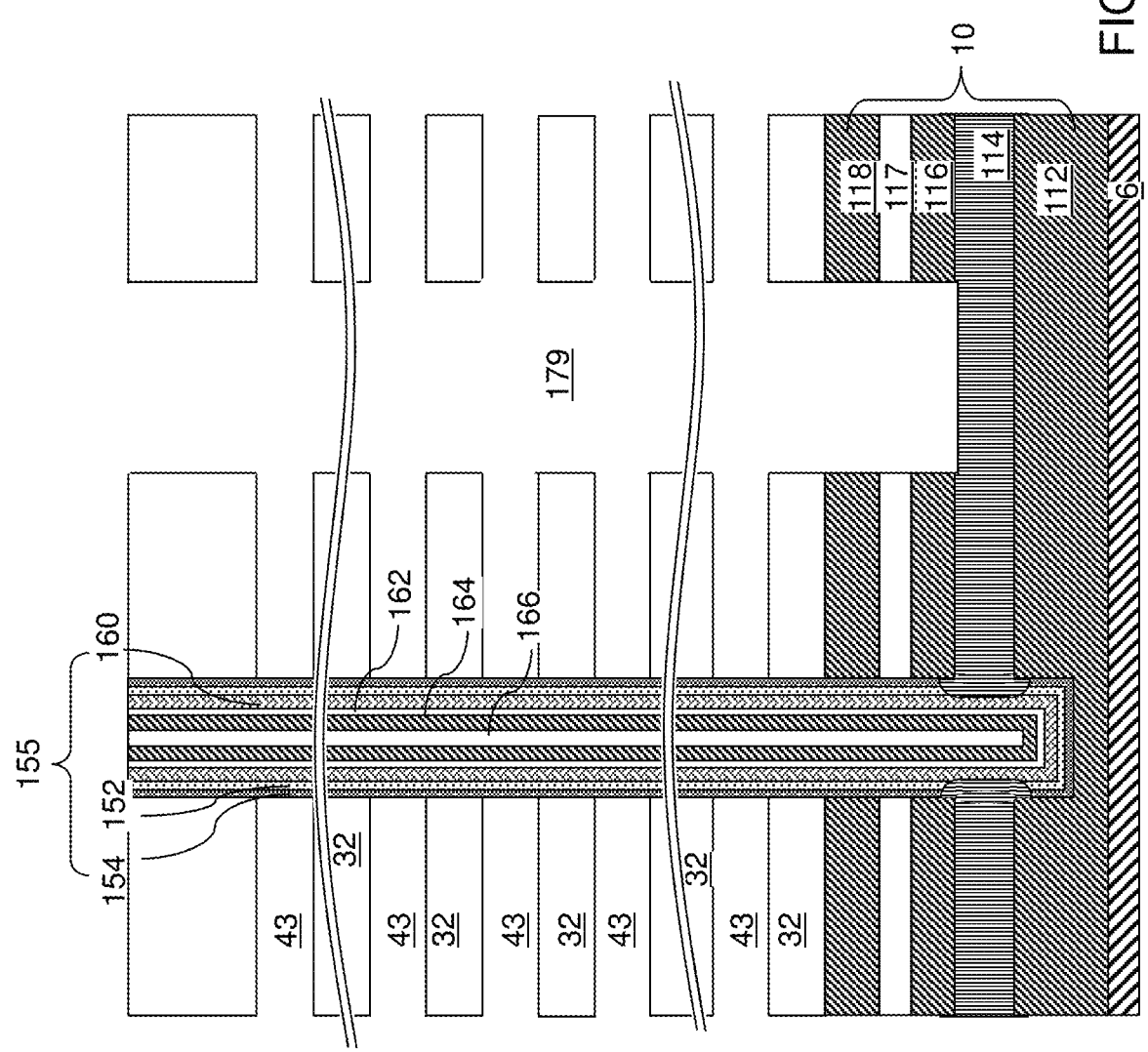
FIG. 16 is a vertical cross-sectional view of a region of the first exemplary structure after formation of backside recesses according to the first embodiment of the present disclosure.

Referring to FIG. 16, an etchant that selectively etches the second material of the sacrificial material strips 42 with respect to the first material of the insulating strips 32 and the source-level material layers 10 can be introduced into the backside via cavities 179, for example, using an isotropic etch process. Backside recesses 43 are formed in volumes from which the sacrificial material strips 42 are removed. The removal of the second material of the sacrificial material strips 42 can be selective to the first material of the insulating strips 32, the ferroelectric material of the ferroelectric material layers 154, the material of the retro-stepped dielectric material portion 65, and the materials of the source-level material layers 10.

The isotropic etch process that removes the second material selective to the first material and the outermost layer of the memory films 150 can be a wet etch process using a wet etch solution, or can be a gas phase (dry) etch process in which the etchant is introduced in a vapor phase into the backside via cavities 179. For example, if the sacrificial material strips 42 include silicon nitride, and if the insulating strips 32 and the retro-stepped dielectric material portion 65 include silicon oxide/oxynitride materials such as undoped silicate glass and/or a doped silicate glass and/or thermal silicon oxide or oxynitride, the etch process can be a wet etch process in which the first exemplary structure is immersed within a wet etch tank including phosphoric acid, which etches silicon nitride selective to silicon oxide. The duration of the isotropic etch process can be selected such that the sacrificial material strips 42 are completely removed from each alternating stack (32, 42) of insulating strips 32 and sacrificial material strips 42. Each backside recess 43 can be a laterally extending cavity having a lateral dimension that is greater than the vertical extent of the cavity. In other words, the lateral dimension of each backside recess 43 can be greater than the height of the backside recess 43.

In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings. Each of the plurality of backside recesses 43 can extend substantially parallel to the top surface 7 of the substrate 8. A backside recess 43 can be vertically bounded by a top surface of an underlying insulating strip 32 and a bottom surface of an overlying insulating strip 32. In one embodiment, each backside recess 43 can have a uniform height throughout.

Figure 17:
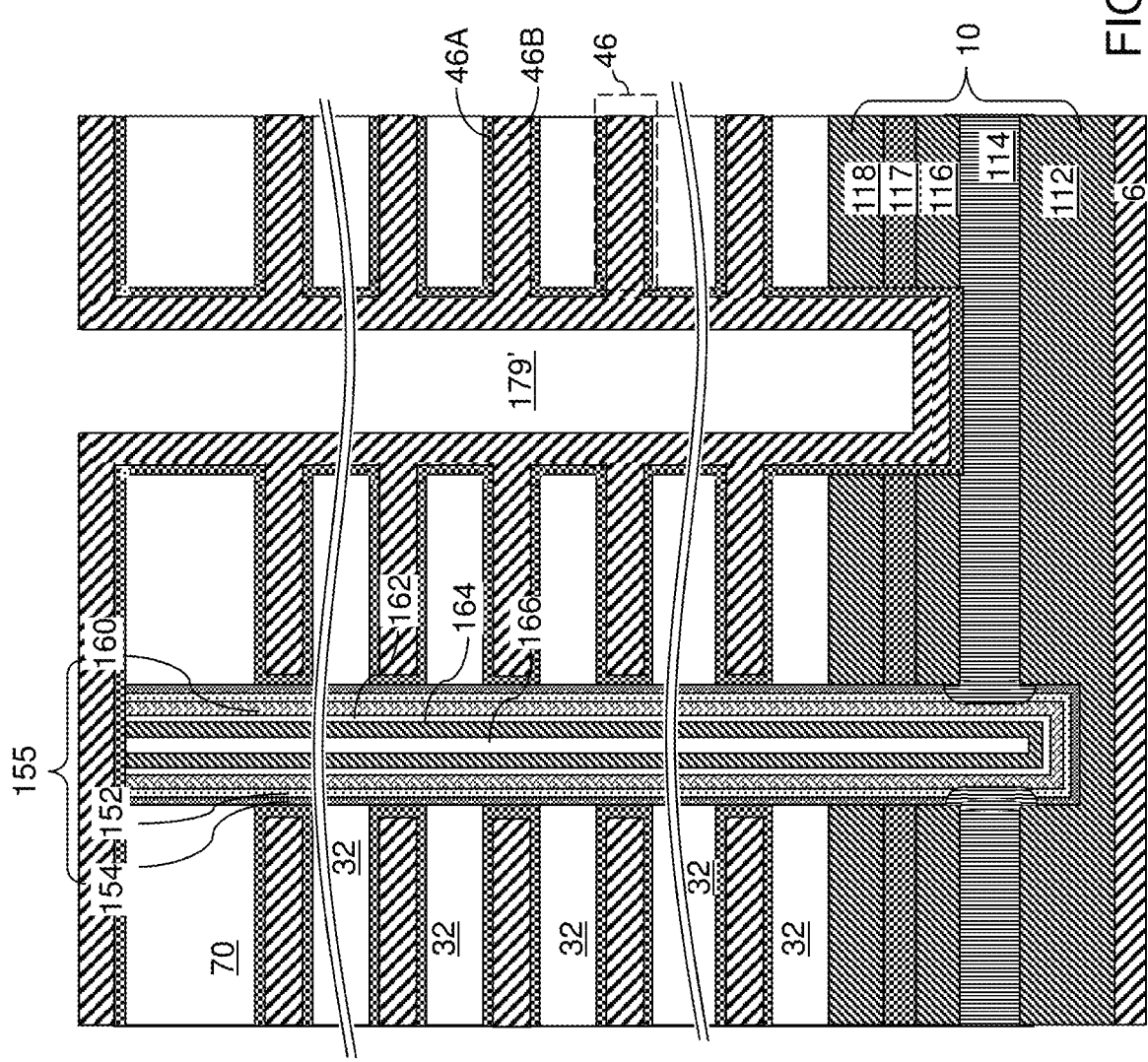
FIG. 17 is a vertical cross-sectional view of a region of the first exemplary structure after formation of electrically conductive strips according to the first embodiment of the present disclosure.

Referring to FIG. 17, a metallic barrier layer 46A can be deposited in the backside recesses 43 directly on the physically exposed outer sidewalls of the ferroelectric material layers 154. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be used. In one embodiment, the metallic barrier layer 46A can consist essentially of a conductive metal nitride such as TiN.

A metal fill material is deposited in remaining volumes of backside recesses 43, on the sidewalls of the at least one the backside via cavity 179, and over the top surface of the insulating cap layer 70 to form a metallic fill material portion 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material portion 46B can consist essentially of at least one elemental metal. The at least one elemental metal of the metallic fill material portion 46B can be selected, for example, from tungsten, cobalt, ruthenium, titanium, and tantalum. In one embodiment, the metallic fill material portion 46B can consist essentially of a single elemental metal. In one embodiment, the metallic fill material portion 46B can be deposited using a fluorine-containing precursor gas such as $WF_6$. In one embodiment, the metallic fill material portion 46B can be a tungsten layer including a residual level of fluorine atoms as impurities.

A plurality of electrically conductive strips 46 (i.e., electrically conductive strips having strip shapes) can be formed in the plurality of backside recesses 43, and a continuous metallic material layer can be formed on the sidewalls of each backside via cavity 179 and over the insulating cap layer 70. Each electrically conductive strip 46 includes a portion of the metallic barrier layer 46A and a metallic fill material portion 46B that are located between a vertically neighboring pair of dielectric material strips such as a pair of insulating strips 32.

Figure 18:
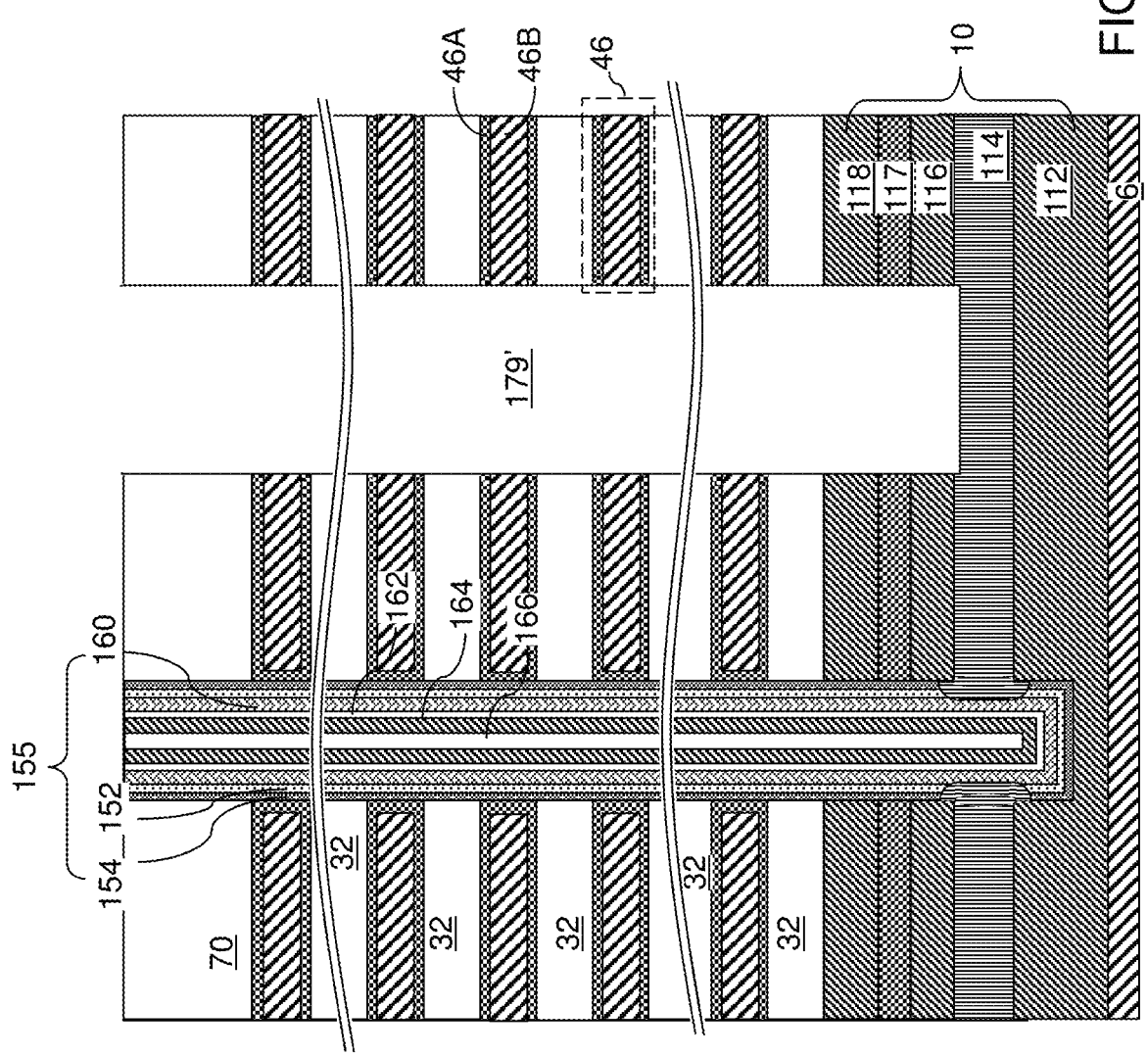
FIG. 18 is a vertical cross-sectional view of a region of the first exemplary structure after removal of the deposited metallic material from inside the backside via cavities according to the first embodiment of the present disclosure.

Referring to FIG. 18, the deposited metallic material of the continuous electrically conductive material layer is etched back from the sidewalls of each backside via cavity 179 and from above the insulating cap layer, for example, by an isotropic wet etch, an anisotropic dry etch, or a combination thereof. Each remaining portion of the deposited metallic material in the backside recesses 43 constitutes an electrically conductive strip 46. Each electrically conductive strip 46 can be a conductive line structure. Thus, the sacrificial material strips 42 are replaced with the electrically conductive strips 46.

Each electrically conductive strip 46 can function as a combination of a plurality of control gate electrodes located at a same level and a word line electrically interconnecting, i.e., electrically connecting, the plurality of control gate electrodes located at the same level. The plurality of control gate electrodes within each electrically conductive strip 46 are the control gate electrodes for the vertical memory devices including the memory stack structures 155. In other words, each electrically conductive strip 46 can be a word line that functions as a common control gate electrode for the plurality of vertical memory devices.

While the present disclosure is described using an embodiment in which the division of a vertically alternating sequence into multiple alternating stacks of insulating strips 32 and sacrificial material strips 42 occurs upon formation of the backside via cavities 179, embodiments are expressly contemplated herein in which the division of the vertically alternating sequence into multiple alternating stacks of insulating strips 32 and sacrificial material strips 42 occurs at different processing steps. In one embodiment, division of a vertically alternating sequence into multiple alternating stacks of insulating strips 32 and spacer material strips 42 can occur upon formation of the line trenches 149 (i.e., at the processing steps of FIGS. 4A and 4B in case the line trenches 149 extend through the entire length of the contact region 300 along the first horizontal direction hd1).

Generally, the electrically conductive strips 46 of various embodiments can be formed directly on sidewalls of the ferroelectric material layers 154. The electrically conductive strips 46 can comprise at least one conductive material selected from a metal (such as a conductive metallic nitride material, tungsten, cobalt, molybdenum, and/or copper) and a doped semiconductor material including electrical dopants at an atomic concentration of at least $1.0 \times 10^{20}/cm^3$. The vertical semiconductor channels 60 can include a semiconducting material including electrical dopants at an atomic concentration in a range from $1.0 \times 10^{14}/cm^3$ to $1.0 \times 10^{18}/cm^3$.

Figure 19A:
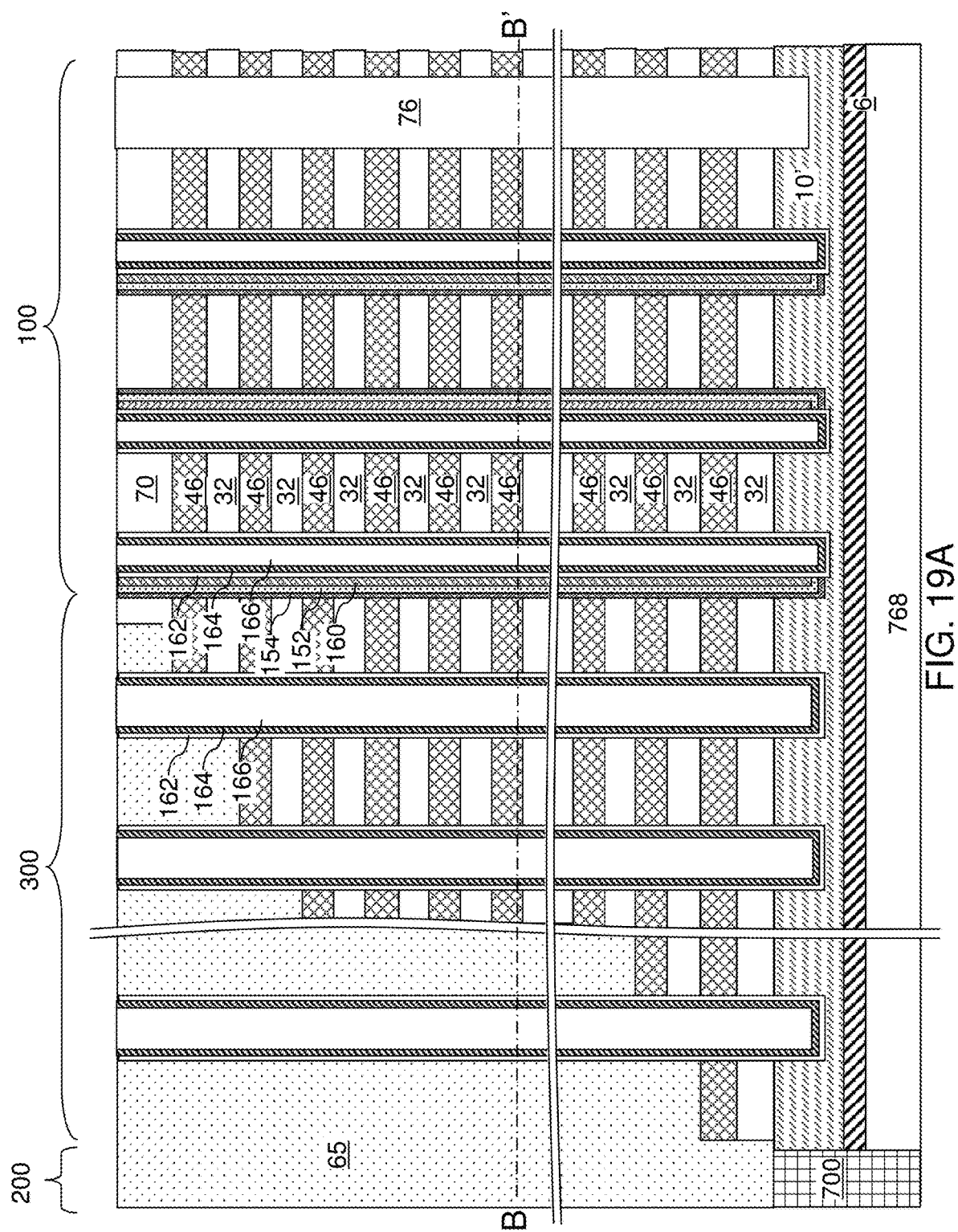
FIG. 19A is a vertical cross-sectional view of the first exemplary structure after formation of dielectric pillar structures in the backside via cavities according to the first embodiment of the present disclosure.
Figure 19B:
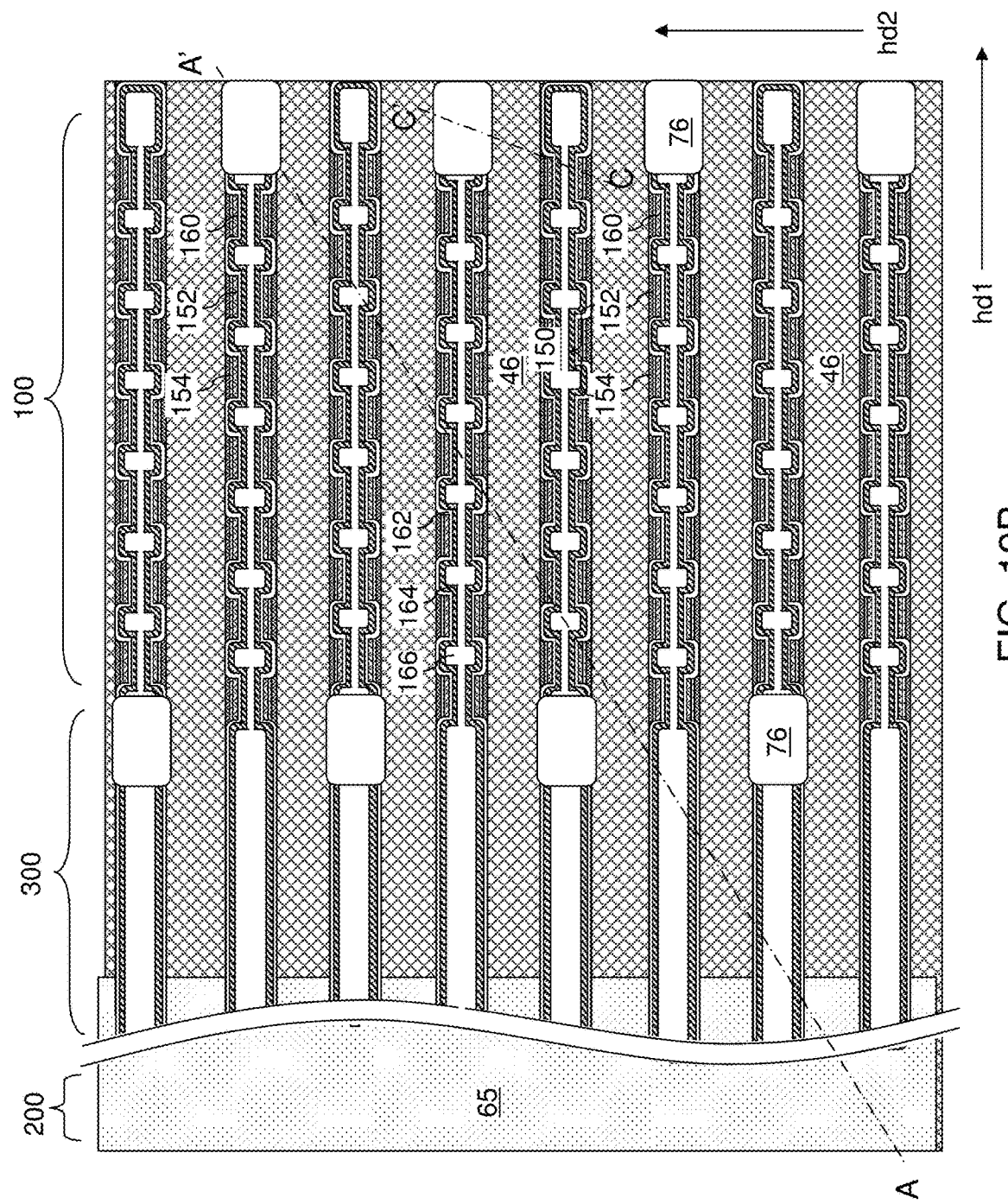
FIG. 19B is a top-down view of the first exemplary structure of FIG. 19A. The vertical plane A-A' is the plane of the cross-section for FIG. 19A.
Figure 19C:
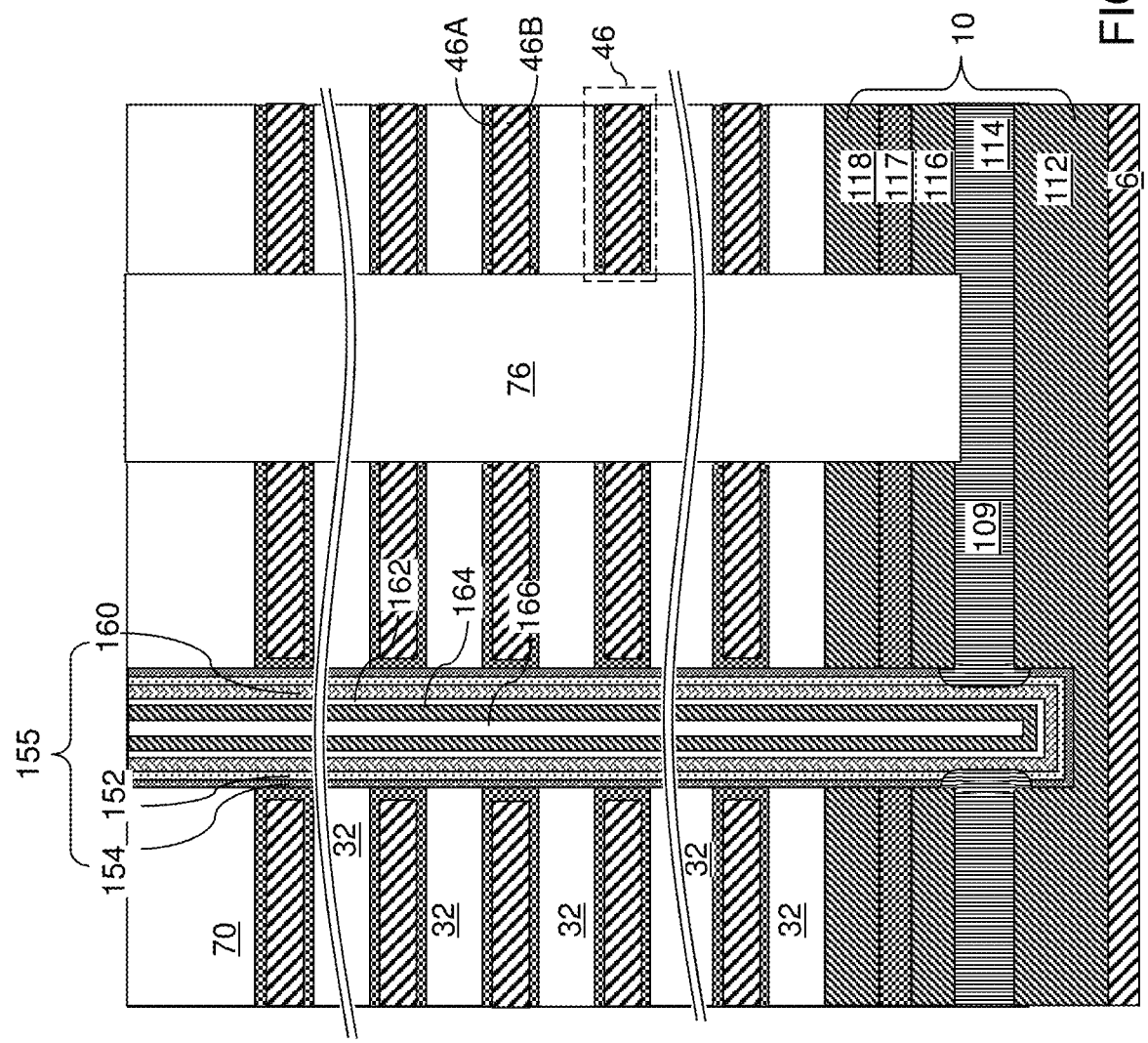
FIG. 19C is a vertical cross-sectional view of a region of the first exemplary structure along the vertical plane C-C' of FIG. 19B.

Referring to FIGS. 19A-19C, an insulating material can be formed in the backside via cavities 179 and over the insulating cap layer 70 by a conformal deposition process or a self-planarizing process. Exemplary conformal deposition processes include, but are not limited to, chemical vapor deposition and atomic layer deposition. An exemplary self-planarizing process is spin coating. The insulating material can include silicon oxide, silicon nitride, a dielectric metal oxide, an organosilicate glass, or a combination thereof. In one embodiment, the insulating material can include silicon oxide. Optionally, excess portions of the insulating material may be removed from above the horizontal plane including the top surface of the insulating cap layer 70 by a recess etch or chemical mechanical planarization. Each remaining portion of the insulating material constitutes a dielectric pillar structure 76.

Figure 20:
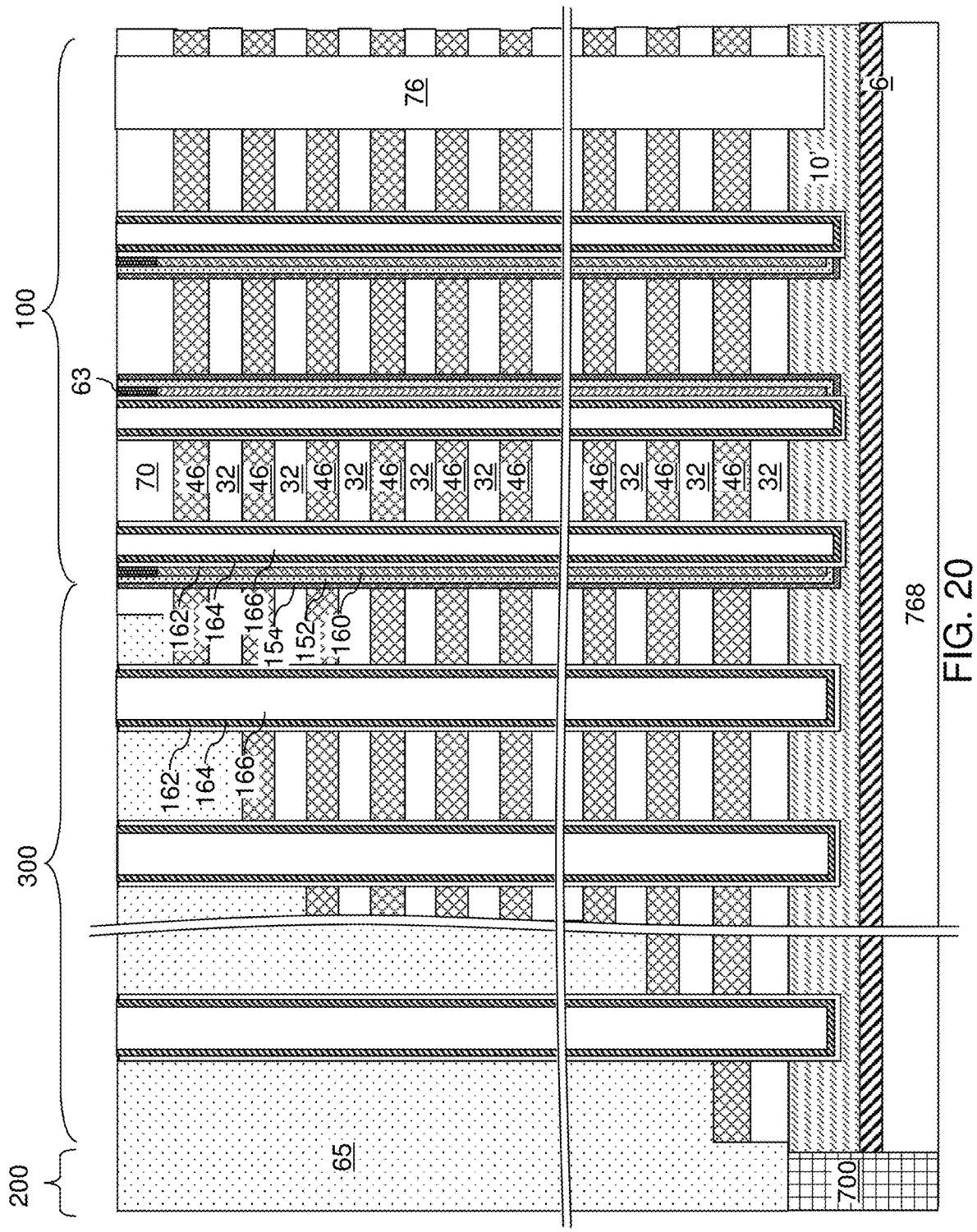
FIG. 20 is a vertical cross-sectional view of the first exemplary structure after formation of drain regions according to the first embodiment of the present disclosure.

Referring to FIG. 20, a drain region 63 including a doped semiconductor material having a doping of the second conductivity type can be formed in contact with each of the vertical semiconductor channels 60. The drain regions 63 can be formed by implanting dopants of the second conductivity type into the top portions of each of the vertical semiconductor channels 60. Alternatively, each of the vertical semiconductor channels 60 can be recessed by a selective recess etch followed by depositing a doped semiconductor material having a doping of the second conductivity type into the recesses above the vertical semiconductor channels 60 to form the drain regions 63. Optionally, dopants of the second conductivity type can be implanted into the drain regions 63 to increase the dopant concentration therein. The atomic concentration of dopants of the second conductivity type in the drain regions 63 can be in a range from $5.0 \times 10^{19}/cm^3$ to $2.0 \times 10^{21}/cm^3$, although lesser and greater atomic concentrations can also be used. Each set of a memory stack structure 55 and a drain region 63 constitutes a memory stack assembly 58.

Figure 21A:
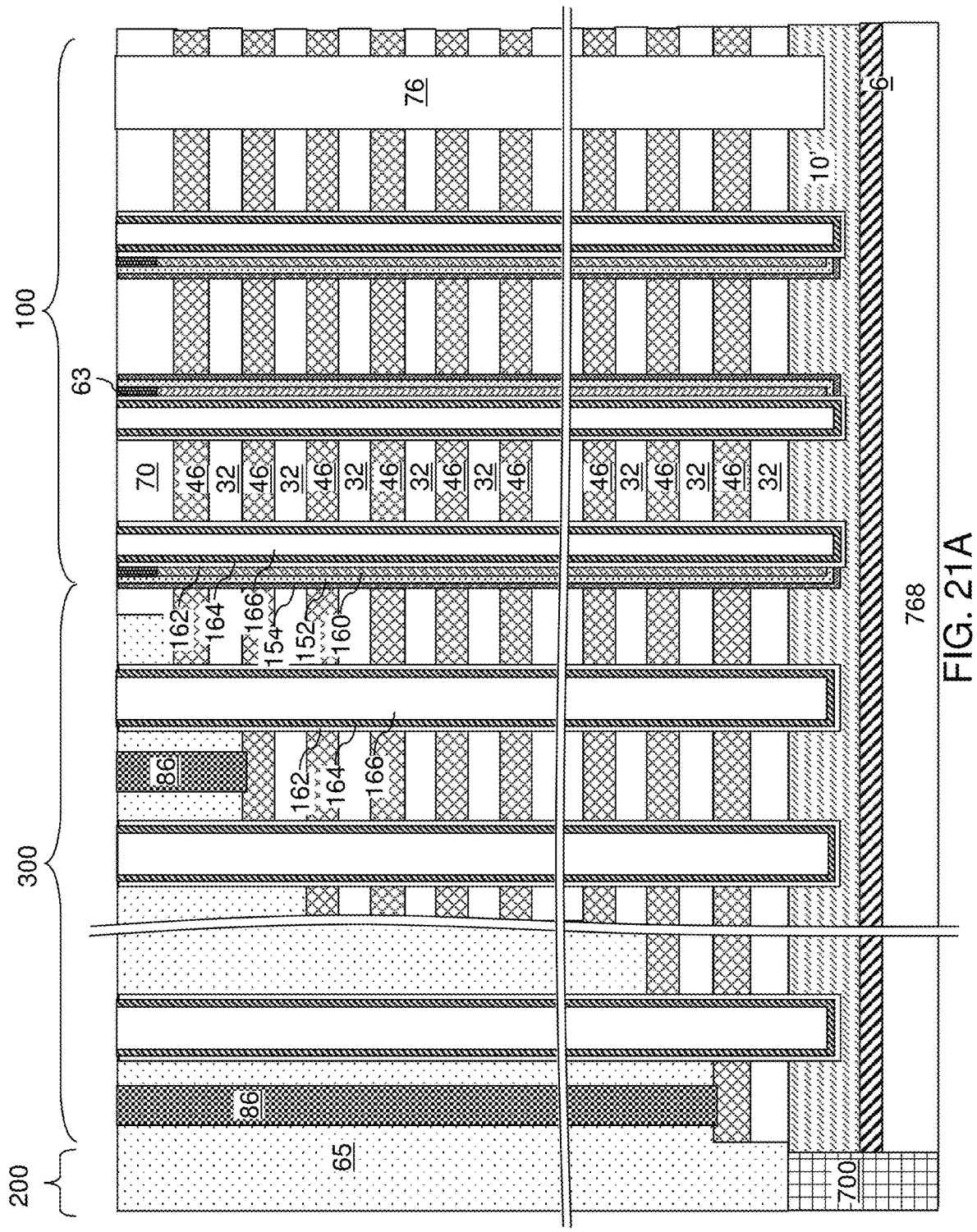
FIG. 21A is a schematic vertical cross-sectional view of the first exemplary structure after formation of word line contact via structures according to the first embodiment of the present disclosure.
Figure 21B:
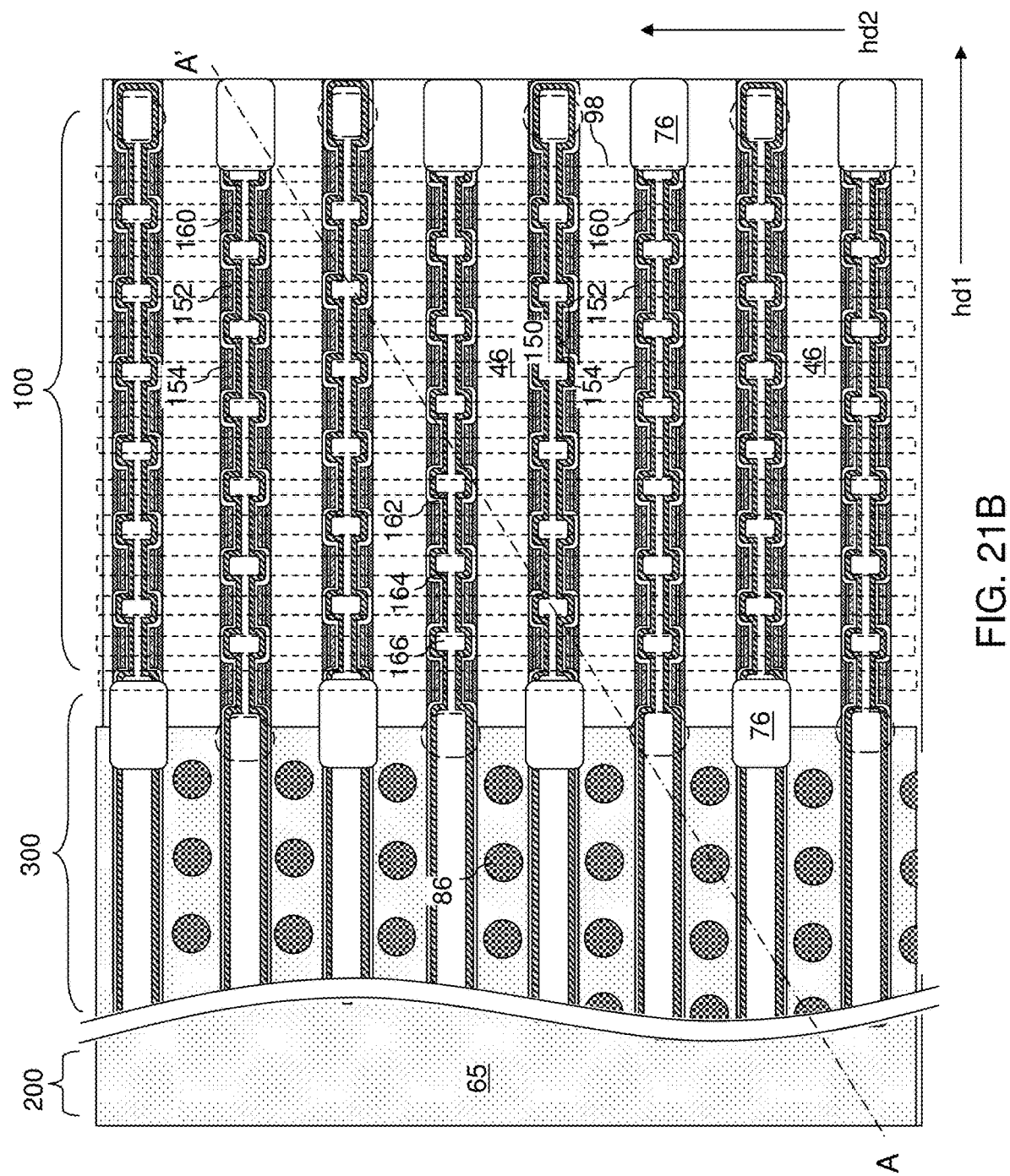
FIG. 21B is a top-down view of the first exemplary structure of FIG. 21A. The vertical plane A-A' is the plane of the cross-section for FIG. 21A.

Referring to FIGS. 21A and 21B, contact via structures 86 (which are herein referred to as word line contact via structures) can be formed on the electrically conductive strips 46 through the retro-stepped dielectric material portion 65. A two-dimensional array of contact via structures 86 can be formed on a top surface of a respective one of the electrically conductive strips 46 in the contact region 300.

Additional contact via structures and additional dielectric material layers can be formed over the insulating cap layer 70. For example, drain contact via structures (not expressly illustrated) can be formed on a top surface of each drain region 63. Bit lines 98 can be formed to electrically contact every other drain region 63 along the second horizontal direction hd2, i.e., a respective set of drain regions 63 located within every other line trench 149 along the second horizontal direction hd2. An exemplary layout for the bit lines 98 is illustrated in FIG. 21B. In this configuration, each electrically conductive strip 46, functioning as a word line, activates only a single portion of the memory cell (e.g., a single portion of the memory film 50) per bit line 98, and can program or read the uniquely selected memory cell corresponding to a single activated portion of one of the memory films 50.

Referring to all drawings for the first exemplary structure and according to various embodiments of the present disclosure, a three-dimensional memory device is provided, which comprises: alternating stacks of insulating strips 32 and electrically conductive strips 46 located over a substrate 8 and laterally spaced apart one from another by line trenches 149, wherein the line trenches 149 laterally extend along a first horizontal direction hd1 and are spaced apart along a second horizontal direction hd2; and line trench fill structures (155, 162, 164, 166, 63) located in the line trenches 149, wherein each of the line trench fill structures (155, 162, 164, 166, 63) comprises a respective set of memory stack structures 155, a backside gate dielectric 162 that contacts each memory stack structure 155 within the respective set of memory stack structures 155, and a backside gate electrode 164 contacting the backside gate dielectric 162, wherein each memory stack structure 155 comprises a ferroelectric material layer 154, a front-side gate dielectric 152 contacting the ferroelectric material layer 154, and a vertical semiconductor channel 160 contacting the front-side gate dielectric 152 and the backside gate dielectric 162.

In one embodiment, each set of memory stack structures 155 comprises a respective row of discrete memory stack structures arranged along the first horizontal direction hd1.

In one embodiment, each of the ferroelectric material layers 154, the front-side gate dielectrics 152, and the vertical semiconductor channels 160 vertically extends from a first horizontal plane including bottom surfaces of bottommost ones of the electrically conductive strips 46 of the alternating stacks (32, 46) to a second horizontal plane including top surfaces of topmost ones of the electrically conductive strips 46 of the alternating stacks (32, 46).

In one embodiment, each of the backside gate electrodes 164 laterally extends along the first horizontal direction hd1 and is configured to apply a backside bias voltage to each of the vertical semiconductor channels 160 within a respective one of the line trench fill structures (155, 162, 164, 166, 63).

In one embodiment, each of the backside gate electrodes 164 has a laterally undulating profile, the ferroelectric material layers 154 comprise hafnium oxide, and the electrically conductive strips 46 contacts sidewalls of the ferroelectric material layers 154.

Referring to FIG. 22, a second exemplary structure according to second embodiment of the present disclosure is shown. The second exemplary structure includes a substrate 10, which includes a substrate semiconductor layer 9. The substrate semiconductor layer 9 is a semiconductor material layer located at least in an upper portion of a substrate, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

An optional dielectric material portion 13 can be formed within the substrate semiconductor layer 9, for example, by forming a shallow trench in an upper portion of the substrate semiconductor layer 9, filling the shallow trench with a dielectric material, and removing an excess portion of the dielectric material from above the top surface of the substrate semiconductor layer 9 using a planarization process such as a chemical mechanical planarization (CMP) process. The remaining portion of the dielectric material constitutes the dielectric material portion. The dielectric material portion includes a dielectric material such as silicon oxide, silicon nitride, a dielectric metal oxide, or a combination thereof.

A patterned conductive material layer 14 can be formed on the top surface of the dielectric material portion 13. The patterned conductive material layer 14 can be formed, for example, by depositing a layer of a conductive material over the substrate 10, and patterning the deposited conductive material by a combination of lithographic methods and an etch process. For example, a photoresist layer may be applied and patterned to mask a portion of the deposited conductive material, and unmasked portions of the deposited conductive material can be removed by an etch process. The remaining portion of the conductive material constitutes the patterned conductive material layer 14. In one embodiment, the conductive material layer 14 can be a metallic material layer. In one embodiment, the conductive material layer 14 can include a stack, from bottom to top, of a conductive metallic nitride layer including a conductive metallic nitride (such as TiN, TaN, and WN) and a metallic material layer including an elemental metal or an alloy thereof (such as W, Al, Cu, or an alloy thereof). The thickness of the conductive material layer 14 can be in a range from 2 nm to 40 nm, although lesser and greater thicknesses can also be used. In one embodiment, the entire periphery of the conductive material layer 14 can be entirely within an area defined by the periphery of the dielectric material portion 13.

Alternatively, the conductive material layer 14 may be formed as a doped semiconductor layer within an upper portion of the substrate 10. In this case, the doped semiconductor layer can be electrically isolated from the substrate semiconductor layer 9 by a reverse-biased p-n junction between the doped semiconductor layer and the substrate semiconductor layer 9. The dielectric material portion 13 electrically isolates the conductive material layer 14 from the substrate semiconductor layer 9.

A bottommost insulator layer 132 can be formed over the substrate 10 and the conductive material layer 14. The bottommost insulator layer 132 includes an electrically insulating material. Electrically insulating materials that can be used for the bottommost insulator layer 132 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the bottommost insulator layer 132 can include the same material as insulator layers to be subsequently formed. In one embodiment, the bottommost insulator layer 132 includes silicon oxide.

A temporary material layer 41 can be formed over the bottommost insulator layer 132. The temporary material layer 41 includes a material that can be removed selective to a first material of the insulator layers to be subsequently formed and selective to a second material of sacrificial material layers to be subsequently formed. As used herein, a "temporary material" refers to a material that is present on a structure during at least one processing step, and is removed from the structure prior to completion of the structure, i.e., prior to the termination of the last processing step.

A stack of an alternating plurality of first material layers (which can be insulating layers 32) and second material layers (which can be sacrificial material layers 42) is formed over the top surface of the substrate, which can be, for example, on the top surface of the temporary material layer 41. The alternating plurality of first material layers and second material layers may begin with an instance of the first material layers, and end with another instance of the first material layers. In one embodiment, an instance of the first elements and an instance of the second elements may form a unit that is repeated with periodicity within the alternating plurality of layers.

Each first material layer includes a first material, and each second material layer includes a second material that is different from the first material. In one embodiment, each first material layer 32 can be an insulating layer, and each second material layer 142 can be a spacer material layer that provides vertical spacing between vertically neighboring pairs of first material layers 32. In one embodiment, the spacer material layers can be a sacrificial material layer. In this case, the stack can include an alternating plurality of insulator layers 32 and sacrificial material layers 42.

While the present disclosure is described using an example embodiment in which the spacer material layers are formed as sacrificial material layers 42, in other embodiments the spacer material layers are formed as electrically conductive layers. In such embodiments, processing steps for replacing the sacrificial material layers with electrically conductive layers can be omitted.

The stack of the alternating plurality is herein referred to as an alternating stack (32, 42). In one embodiment, the alternating stack (32, 42) can include insulator layers 32 composed of the first material and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be used for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 is silicon oxide.

The second material of the sacrificial material layers 42 is a sacrificial material that can be removed selective to the first material of the insulator layers 32. The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including germanium or a silicon-germanium alloy.

In one embodiment, the insulator layers 32 can include silicon oxide, and sacrificial material layers can include silicon nitride. The first material of the insulator layers 32 can be deposited, for example, by chemical vapor deposition (CVD). For example, if silicon oxide is used for the insulator layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the bottommost insulator layer 132, the temporary material layer 41, the insulator layers 32, and the sacrificial material layers 42 can be in a range from 20 nm to 50 nm, although lesser and greater thicknesses can be used for each layer. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

In one embodiment, the bottommost insulator layer 132 and the insulator layers 32 can include silicon oxide, the sacrificial material layers 42 can include silicon nitride, and the temporary material layer 41 can include a semiconductor material. The semiconductor material of the temporary material layer 41 can be, for example, a Group IV semiconductor material, a III-V compound semiconductor material, a II-VI semiconductor material, an organic semiconductor material. In an illustrative example, the semiconductor material can be amorphous silicon or polysilicon.

In another embodiment, the bottommost insulator layer 132 and the insulator layers 32 can include silicon oxide, the sacrificial material layers 42 can include a semiconductor material that can be etched selective to the semiconductor material of the semiconductor material layer 10, and the temporary material layer 41 can include silicon nitride. The semiconductor material of the sacrificial material layers 42 can be, for example, germanium, a silicon-germanium alloy, a III-V compound semiconductor material, a II-VI semiconductor material, or an organic semiconductor material.

Referring to FIG. 23, a lithographic material stack (not shown) including at least a photoresist layer can be formed over the alternating stack (32, 42), and can be lithographically patterned to form openings therein. The pattern in the lithographic material stack can be transferred through the entirety of the alternating stack (32, 42) by at least one anisotropic etch that uses the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. Optionally, the conductive material layer 14 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the alternating stack (32, 42), the temporary material layer 41, and the bottommost insulator layer 132 so that the memory openings 49 extend from the top surface of the alternating stack (32, 42) to the top surface of the conductive material layer 14 over the substrate 10. The region in which the array of memory openings 49 is formed is herein referred to as a device region. In one embodiment, each memory opening 49 can have a cylindrical shape, and a horizontal cross-sectional shape of each memory opening can be circular, elliptical, polygonal, or of a general curvilinear closed shape.

Figure 24:
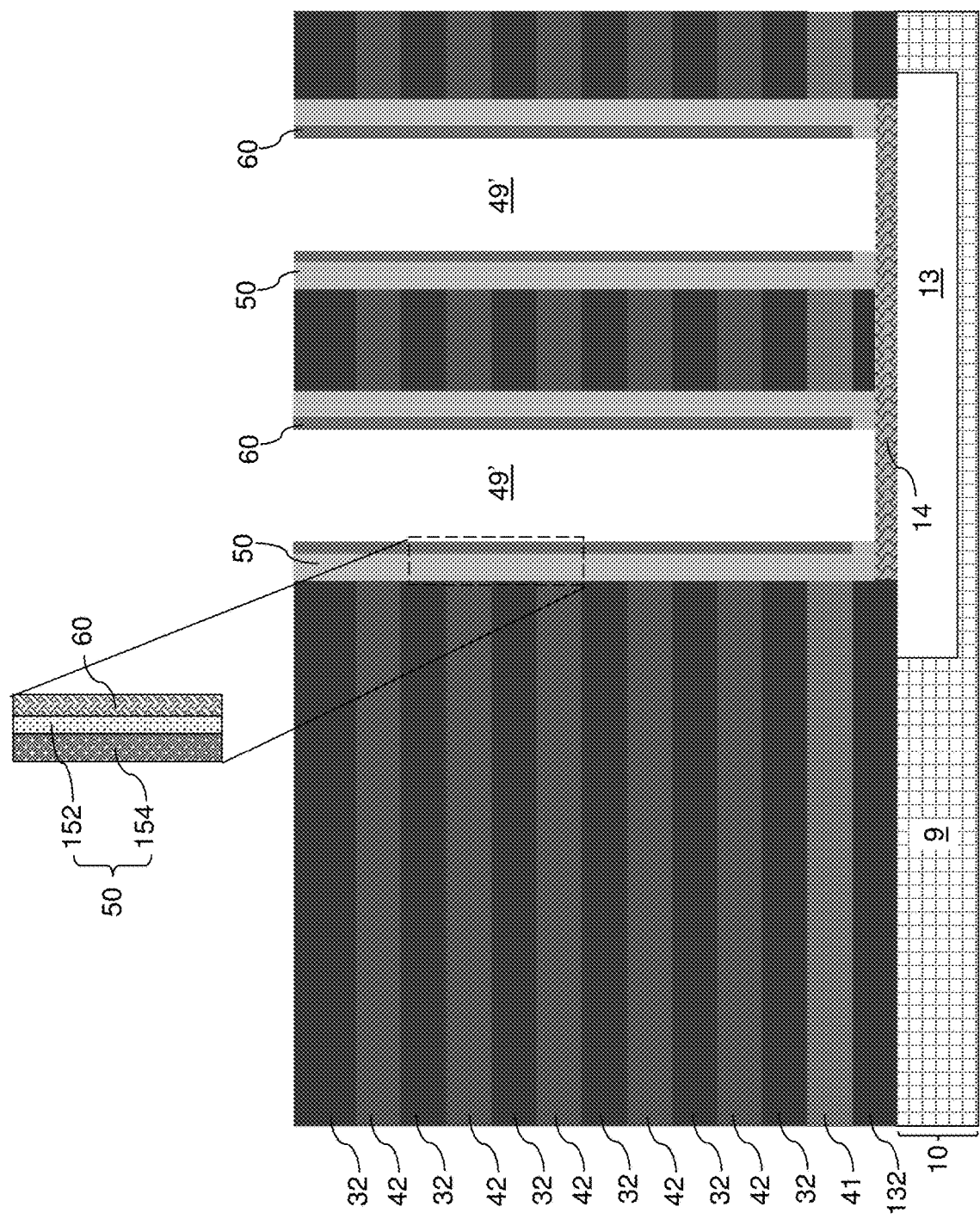
FIG. 24 is a vertical cross-sectional view of the second exemplary structure after formation of a ferroelectric material layer and a front-side gate dielectric and a vertical semiconductor channel within each memory opening according to the second embodiment of the present disclosure.

Referring to FIG. 24, a continuous ferroelectric material layer, a continuous front-side gate dielectric layer, and a continuous vertical semiconductor channel material layer are sequentially deposited into the array of memory openings 49 and over the alternating stack (32, 42). The continuous ferroelectric material layer can have the same composition and the same thickness as the continuous ferroelectric material layer 154L of the first embodiment. The continuous ferroelectric material layer can be formed directly on the top surface of the conductive material layer 14. The continuous front-side gate dielectric layer can have the same composition and the same thickness as the front-side gate dielectric layer 152L. The continuous vertical semiconductor channel material layer can have the same material composition and thickness as the continuous vertical semiconductor channel material layer 160L according to the first embodiment.

Horizontal portions of the continuous vertical semiconductor channel material layer, the continuous front-side gate dielectric layer, and the continuous ferroelectric material layer can be anisotropically etched from above the alternating stack (32, 42) and at the bottom of each memory opening 49. Each remaining discrete portion of the continuous vertical semiconductor channel material layer constitutes a vertical semiconductor channel 60. Each remaining discrete portion of the continuous front-side gate dielectric layer constitutes a front-side gate dielectric 152. Each remaining discrete portion of the continuous ferroelectric material layer constitutes a ferroelectric material layer 154. Each ferroelectric material layer 154 can be formed directly on the top surface of the conductive material layer 154. Each combination of a ferroelectric material layer 154 and a front-side gate dielectric 152 constitutes a memory film 50. Each vertical semiconductor channel 60, which includes a semiconductor material such as at least one elemental semiconductor material, at least one III-V compound semiconductor material, at least one II-VI compound semiconductor material, at least one organic semiconductor material, or other semiconductor materials known in the art.

A cavity 49' can be present within a volume of each memory opening 49 that is not filled with a memory film 50 and a vertical semiconductor channel 60. An annular horizontal portion of the memory film 50 can underlie the vertical semiconductor channel 60 within each memory opening. A top surface of the conductive material layer 14 can be physically exposed at the bottom of each cavity 49'. The vertical semiconductor channel 60 is electrically isolated from the substrate 10 by the memory film 50 within each memory opening 49. Each memory film 50 can be topologically homeomorphic to a torus. Each memory film 50 can be topologically homeomorphic to a torus. As used herein, an element is homeomorphic to a geometrical shape if the shape of the element can be mapped to the geometrical shape by continuous deformation without creation or destruction of any hole.

Figure 25:
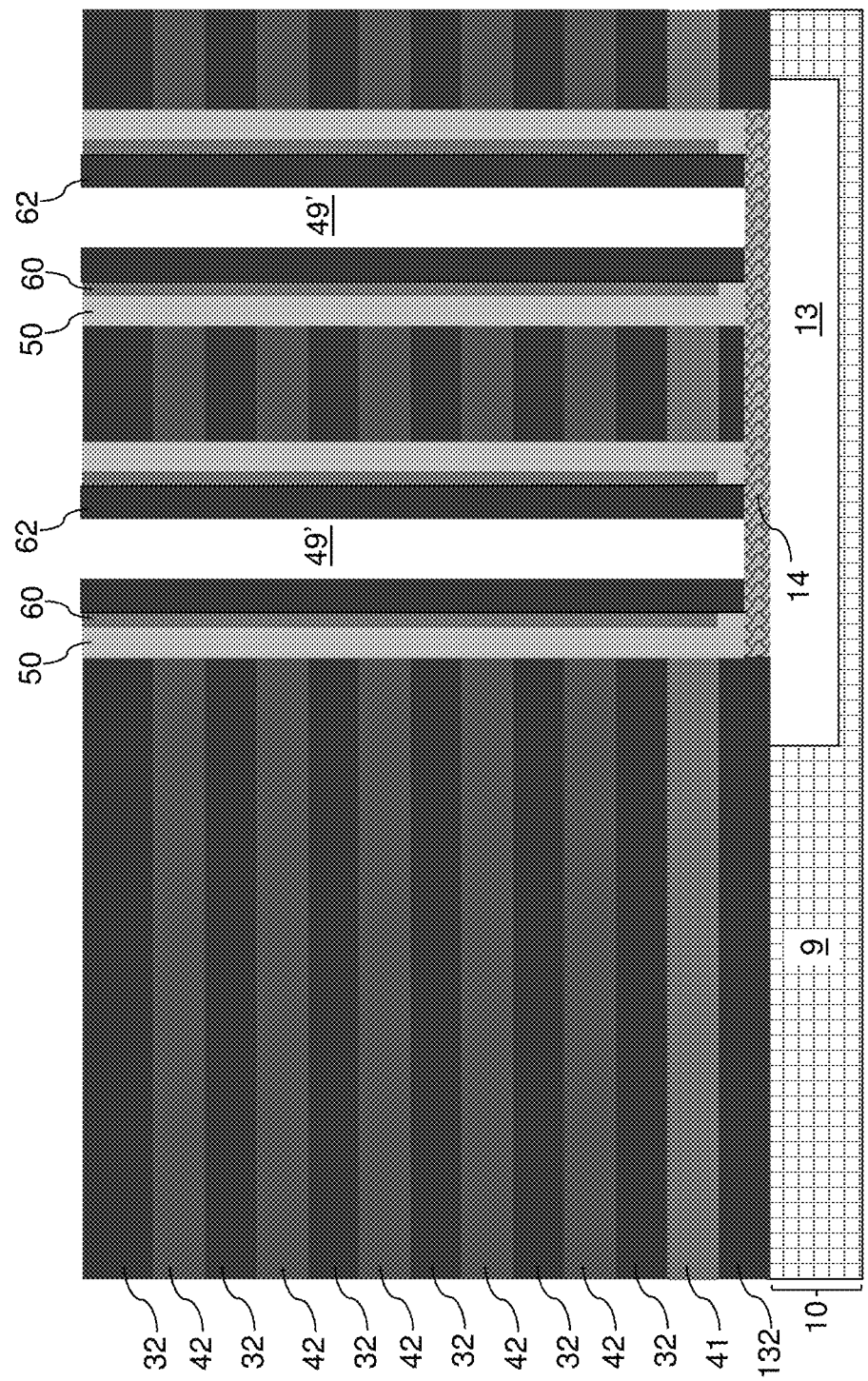
FIG. 25 is a vertical cross-sectional view of the second exemplary structure after formation of backside gate dielectrics according to the second embodiment of the present disclosure.

Referring to FIG. 25, backside gate dielectrics 62 can be formed on the inner sidewalls of the vertical semiconductor channels 60 inside each memory opening. In one embodiment, the backside gate dielectrics 62 can be formed by depositing a backside gate dielectric layer in the memory openings and over the alternating stack (32, 42), and by anisotropically etching the backside gate dielectric layer. An opening is formed through each horizontal portion of the backside gate dielectric layer at a bottom portion of each memory opening. Each remaining vertical portion of the backside gate dielectric layer constitutes a backside gate dielectric 62.

The backside gate dielectrics 62 include at least one dielectric material. The dielectric materials that can be included in the backside gate dielectrics 62 include, but are not limited to, silicon oxide, silicon nitride, a dielectric metal oxide, an organosilicate glass, or a combination thereof. In one embodiment, the backside gate dielectrics 62 can include a stack of a silicon oxide layer and a dielectric metal oxide layer. The thickness of each backside gate dielectric 62 can be in a range from 3 nm to 30 nm, although lesser and greater thicknesses can also be used. A bottom surface of each backside gate dielectric 62 can contact a top surface of the conductive material layer 14. An outer sidewall of each backside gate dielectric 62 can contact an inner sidewall of a vertical semiconductor channel 60 and an inner sidewall of a memory film 50. Each backside gate dielectric 62 can be topologically homeomorphic to a torus.

Figure 26:
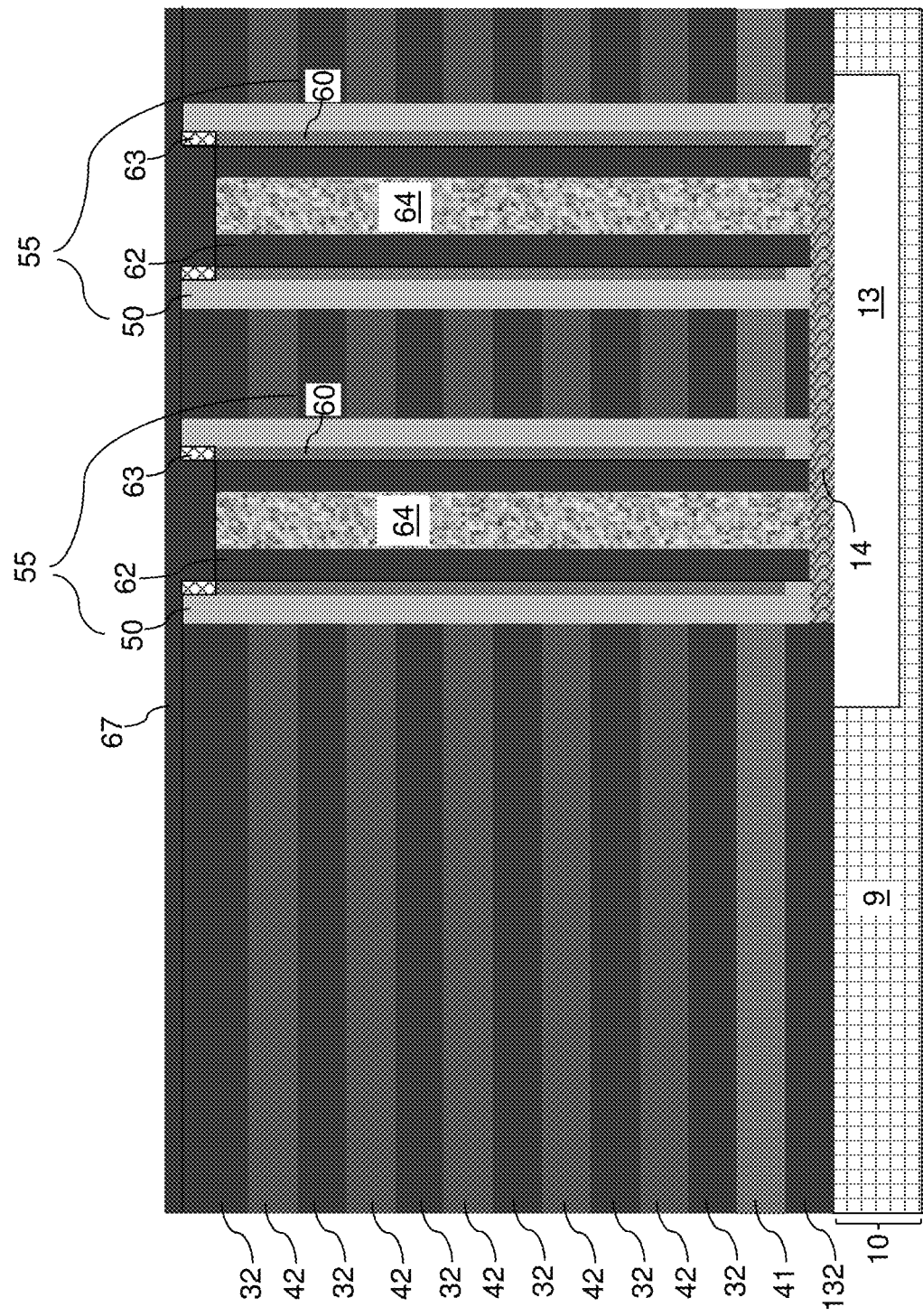
FIG. 26 is a vertical cross-sectional view of the second exemplary structure after formation of backside gate electrodes and a dielectric cap layer according to the second embodiment of the present disclosure.

Referring to FIG. 26, backside gate electrodes 64 can be formed within each cavity 49' that is laterally surrounded by a backside gate dielectric 62. At least one conductive material can be deposited within each cavity 49' that is laterally enclosed by a backside gate dielectric 62 and over the alternating stack (32, 42). The at least one conductive material can include, for example, a conductive metallic nitride liner material (such as TiN, TaN, and/or WN) and a conductive fill material (such as an elemental metal (e.g., W), an intermetallic alloy, a doped semiconductor material, a metal-semiconductor alloy material, or a combination thereof). The deposited conductive material can be removed from above the topmost surface of the alternating stack (32, 42) by a planarization process. Chemical mechanical planarization (CMP) and/or a recess etch process can be used for the planarization process.

The remaining portion of the deposited conductive material can be vertically recessed, for example, by a recess etch below a horizontal plane including the top surface of the alternating stack (32, 42). The recess depth below the horizontal plane including the top surface of the alternating stack (32, 42) can be in a range from 3 nm to 300 nm, although lesser and greater recess depths can also be used. Each remaining portion of the deposited conductive material constitutes a backside gate electrode 64. Each backside gate electrode 64 can be in contact with the conductive material layer 14.

In one embodiment, the top surface of each backside gate electrode 64 can be formed above a horizontal plane including the top surface of the topmost sacrificial material layer 42 within the alternating stack (32, 42). In one embodiment, a top portion of each backside gate dielectric 62 can be collaterally recessed vertically during the vertical recessing of the deposited conductive material to form the backside gate electrodes 64. In another embodiment, the recessing of the deposited conductive material to form the backside gate electrodes 64 can be performed selective to the dielectric material of the backside gate dielectrics 62, i.e., without substantially etching the dielectric material of the backside gate dielectrics 62. In this case, the top surface of each backside gate electrode 64 can be recessed below the horizontal plane including the topmost surface of the alternating stack (32, 42).

In one embodiment, electrical dopants, which can be p-type dopants or n-type dopants, can be introduced into a top end portion of each vertical semiconductor channel 60 to convert each implanted portion into a drain region 63. A drain region 63 can be formed on top a remaining portion of a vertical semiconductor channel 60. Each drain region 63 can be an annular structure, i.e., can be topologically homeomorphic to a torus. Each drain region 63 can contact an inner sidewall of a memory film 50, and may contact a topmost portion of an outer sidewall of a backside gate dielectric 62.

A dielectric cap layer 67 can be deposited into the recesses within the memory openings and over the alternating stack (32, 42). The dielectric cap layer 67 includes a dielectric material, which can be the same as, or different from, a dielectric material contained within the backside gate dielectrics 62. The dielectric cap layer 67 can include a material that is different from the material of the sacrificial material layers 42. In one embodiment, the dielectric cap layer 67 can include silicon oxide or a dielectric metal oxide such as aluminum oxide. Optionally, the top surface of the dielectric cap layer 67 can be planarized. The dielectric cap layer 67 can contact an inner sidewall and a top surface of each drain region 63, a top surface of each backside gate dielectric 62, and a top surface of each backside gate electrode 64.

Each set of a memory film 50 and a vertical semiconductor channel 60 within a memory opening constitutes a memory stack structure 55. A backside gate electrode 64 and a set of nested layers laterally surrounding the backside gate electrode 64 within a memory opening collectively constitute a pillar structure (64, 62, 60, 63, 50). The set of nested layers include, from inside to outside, a backside gate dielectric 62, a vertical semiconductor channel 60, and a memory film 50.

Figure 27:
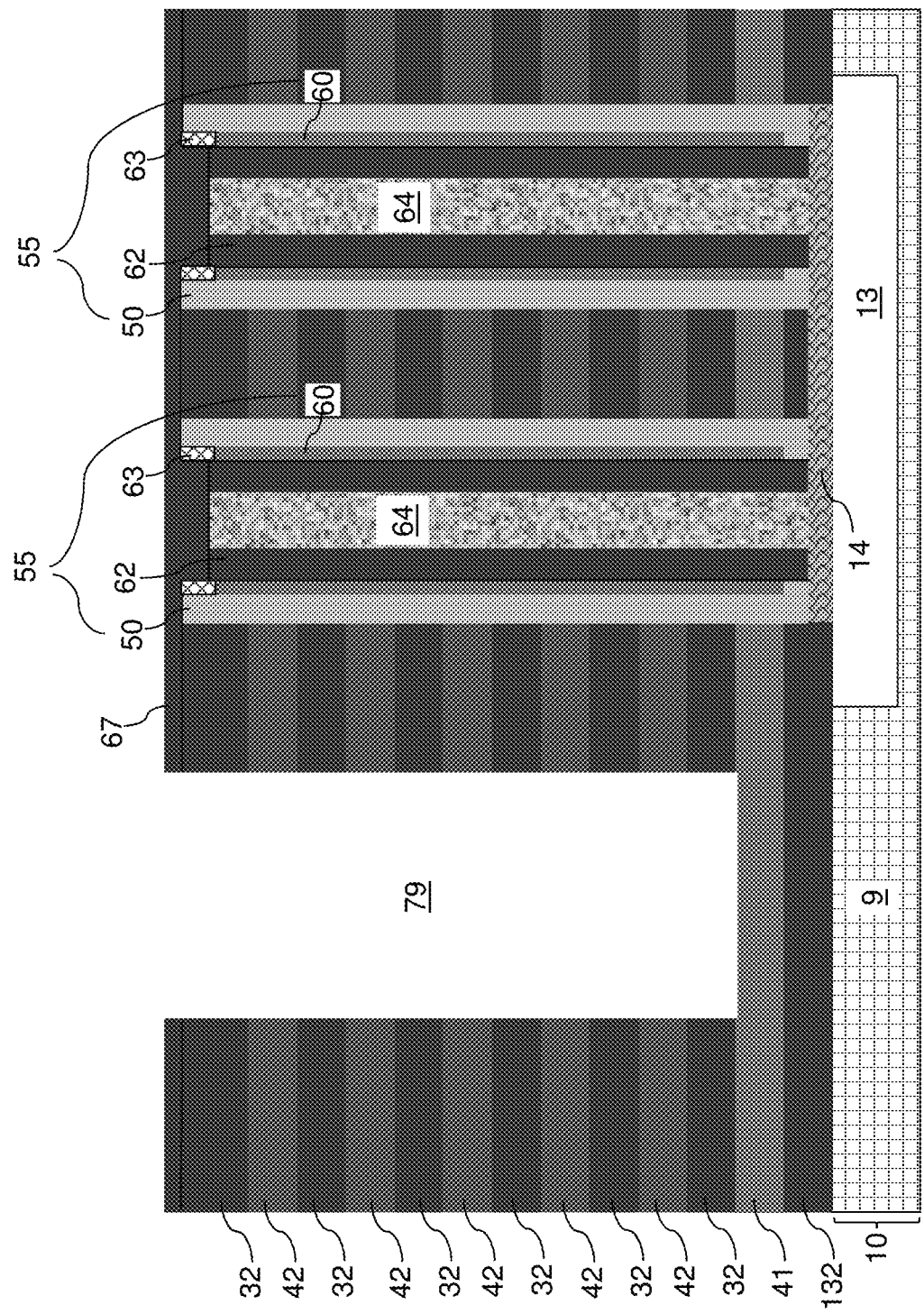
FIG. 27 is a vertical cross-sectional view of the second exemplary structure after formation of a backside cavity according to the second embodiment of the present disclosure.

Referring to FIG. 27, a photoresist layer (not shown) can be applied over the dielectric cap layer 67 and the alternating stack (32, 42), and can be lithographically patterned to form openings therein. The pattern in the photoresist layer can be transferred through the dielectric cap layer 67 and the alternating stack (32, 42) using an anisotropic etch to form the at least one backside contact trench 79. Each backside contact trench 79 can extend through the entirety of the alternating stack (32, 42), and can have a horizontal surface of the temporary material layer 41 as a bottom surface. In one embodiment, the anisotropic etch can be selective to the material of the temporary material layer 41, and the bottom surface of each backside contact trench 79 can be coincident with the top surface of the temporary material layer 41. In another embodiment, the bottom surface of a backside contact trench 79 can be located between a first horizontal plane including the topmost surface of the temporary material layer 41 and the bottom surface of the temporary material layer 41. The sidewalls of each backside contact trench 79 can be substantially vertical or tapered. The photoresist layer can be subsequently removed, for example, by ashing.

Figure 28:
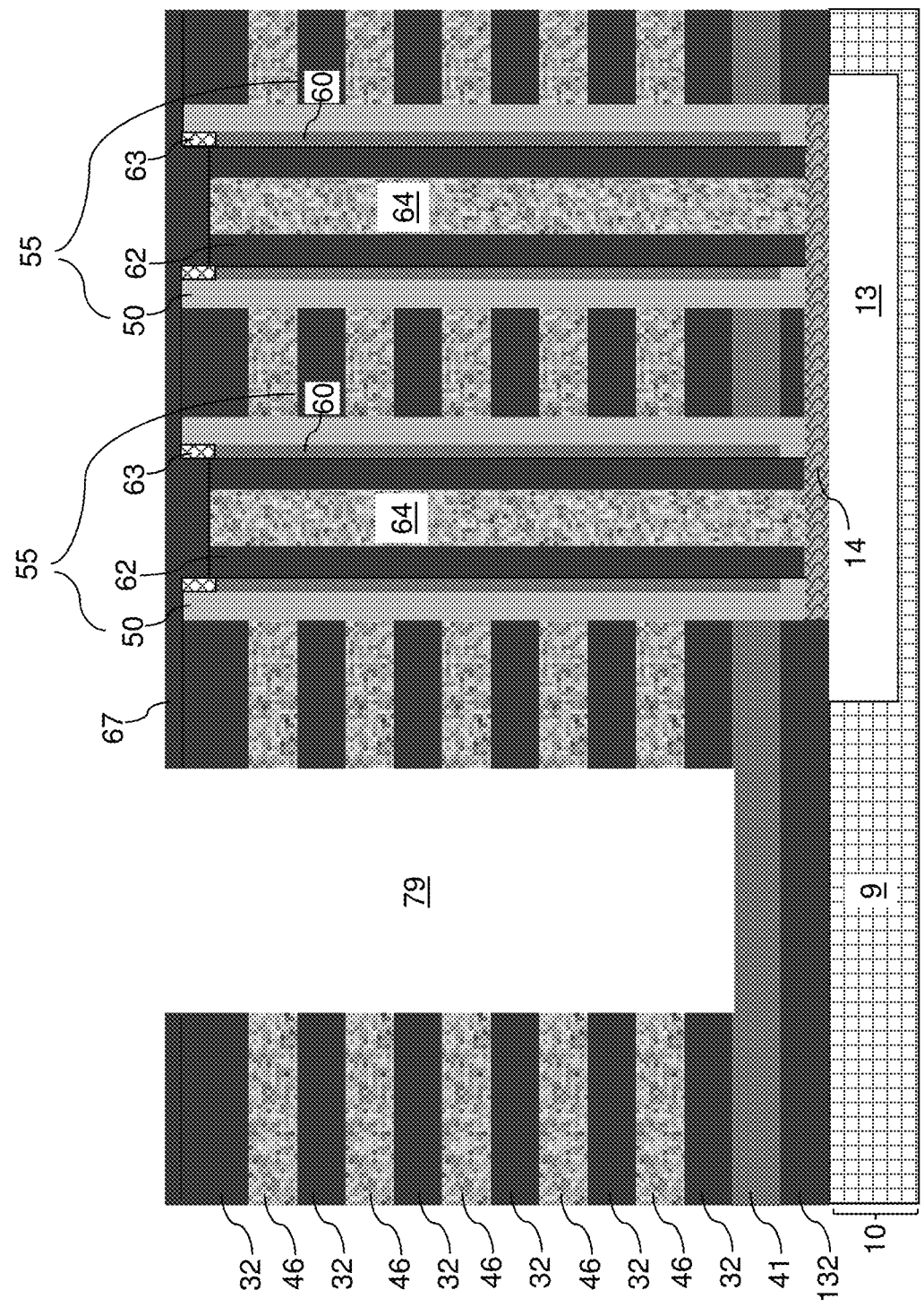
FIG. 28 is a vertical cross-sectional view of the second exemplary structure after replacement of sacrificial material layers with electrically conductive layers according to the second embodiment of the present disclosure.

Referring to FIG. 28, an etchant that selectively etches the second material of the sacrificial material layers 42 with respect to the first material of the insulator layers 32 and the temporary material layer 41 can be introduced into the at least one backside contact trench 79, for example, using an etch process. Backside recesses are formed in volumes from which the sacrificial material layers 42 are removed. The removal of the second material of the sacrificial material layers 42 can be selective to the first material of the insulator layers 32, the material of the temporary material layer 41, and the material of the outermost layer of the memory films 50. In an illustrative example, the sacrificial material layers 42 can include silicon nitride, the material of the insulator layers 32 can be silicon oxide, and the material of the temporary material layer 41 can be germanium, a silicon-germanium alloy, amorphous silicon, or polysilicon. In another embodiment, the sacrificial material layers 42 can include a semiconductor material such as germanium, a silicon-germanium alloy, or silicon, the material of the insulator layers 32 can include silicon oxide, and the material of the temporary material layer 41 can include silicon nitride.

The etch process that removes the second material selective to the first material and the outermost layer of the memory films 50 can be a wet etch process using a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art.

Each backside recess can be a laterally extending cavity having a lateral dimension that is greater than the vertical extent of the cavity. In other words, the lateral dimension of each backside recess can be greater than the height of the backside recess. A plurality of backside recesses can be formed in the volumes from which the second material of the sacrificial material layers 42 is removed. The memory openings in which the memory stack structures 55 are formed are herein referred to as front side openings or front side cavities in contrast with the backside recesses. In one embodiment, the device region comprises an array of monolithic three-dimensional NAND strings having a plurality of device levels disposed above the substrate 10. In this case, each backside recess can define a space for receiving a respective word line of the array of monolithic three-dimensional NAND strings.

Each of the plurality of backside recesses can extend substantially parallel to the top surface of the substrate 10. The backside recess can be vertically bounded by a top surface of an underlying insulator layer 32 and a bottom surface of an overlying insulator layer 32. In one embodiment, each backside recess can have a uniform height throughout.

A conductive material can be deposited in the plurality of backside recesses, on sidewalls of the at least one backside contact trench 79, and over the top surface of the dielectric cap layer 67. As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses can be selected from tungsten and a combination of titanium nitride and tungsten. In one embodiment, the conductive material can be deposited by chemical vapor deposition.

A plurality of electrically conductive layers 46 can be formed in the plurality of backside recesses, and a conductive material layer (not shown) can be formed on the sidewalls of each backside contact trench 79 and over the dielectric cap layer 67. Thus, at least a portion of each sacrificial material layer 42 can be replaced with an electrically conductive layer 46, which is a conductive material portion. In one embodiment, the electrically conductive layers 46 can be formed in the shapes of electrically conductive strips that laterally extend along a first horizontal direction and laterally spaced apart along a second horizontal direction that is perpendicular to the first horizontal direction.

Subsequently, the deposited conductive material of the conductive material layer can be etched back from the sidewalls of each backside contact trench 79 and from above the dielectric cap layer 67, for example, by an isotropic etch. Each remaining portion of the deposited conductive material in the backside recesses constitutes an electrically conductive layer 46. Each electrically conductive layer 46 can be a conductive line structure.

Each electrically conductive layer 46 can function as a combination of a plurality of control gate electrodes and a word line electrically connecting, i.e., electrically connecting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

Each memory stack structure 55 includes a memory film 50 and a vertical semiconductor channel 60 located within a memory opening 49. The total number of ferroelectric memory elements within a memory stack structure 55 can be the same as the total number of levels of the control gate electrodes, which can be end portions of the electrically conductive layers 46, if each control gate electrode 46 laterally surrounds the entire periphery of memory stack structure 55. Alternatively, if more than one control gate electrode is formed in proximity to a memory stack structure 55 at the same level, the total number of ferroelectric memory elements at the corresponding level of the memory stack structure 55 can be the same as the total number of control gate electrodes 46 located in proximity to the memory stack structure 55 at the corresponding level. If a total of N control gate electrodes are located in proximity to the memory film 50 at each level of the electrically conductive layers 46, the total number of ferroelectric memory elements per memory film 50 can be the product of the total number of levels of the electrically conductive layer 46 and the integer N.

Figure 29:
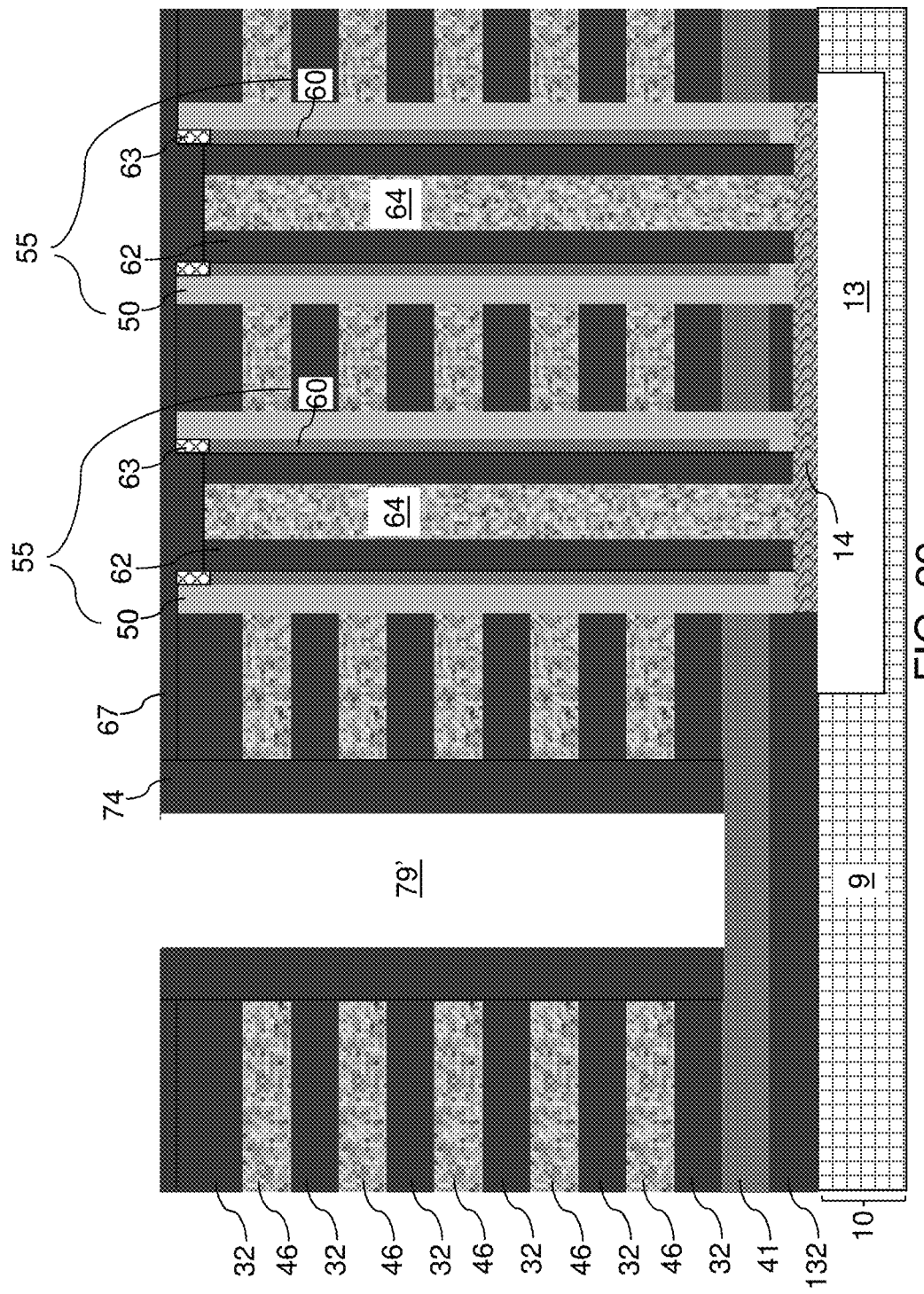
FIG. 29 is a vertical cross-sectional view of the second exemplary structure after formation of a backside via spacer according to the second embodiment of the present disclosure.

Referring to FIG. 29, an insulating spacer 74 can be formed on the sidewalls of the backside contact trench 79 by depositing a dielectric material layer and anisotropically etching horizontal portions of the dielectric material layer. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be used. In one embodiment, the thickness of the insulating spacer 74 can be in a range from 3 nm to 10 nm. A cavity 79' is formed in a volume of each backside contact trench 79 that is not filled with the insulating spacer 74.

Figure 30:
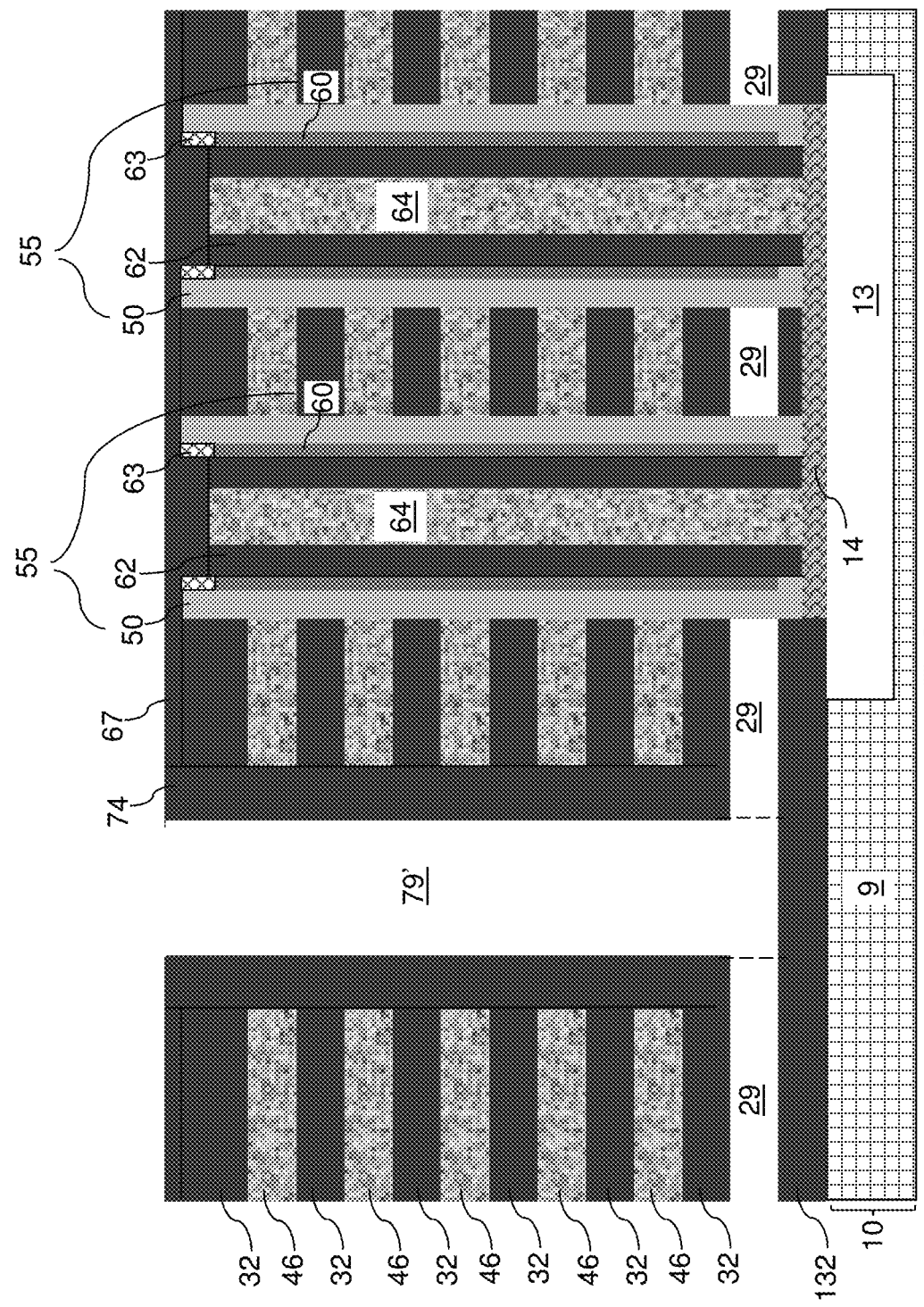
FIG. 30 is a vertical cross-sectional view of the second exemplary structure after formation of a source-level cavity according to the second embodiment of the present disclosure.

Referring to FIG. 30, an etchant that selectively etches the material of the temporary material layer 41 with respect to the first material of the insulator layers 32 can be introduced into the at least one backside contact trench 79, for example, using an etch process. A bottommost backside cavity is formed in the volume from which the temporary material layer 41 is removed. The bottommost backside cavity is herein referred to as a source-level backside recess 29. The source-level backside recess 29 is a backside cavity that is located at the source level, i.e., the level at which source regions are to be subsequently formed. In one embodiment, the removal of the material of the temporary material layer 41 can be selective to the first material of the insulator layers 32, and to the material of the insulating spacer 74.

The etch process that removes the material of the temporary material layer 41 selective to the first material can be a wet etch process using a wet etch solution, or can be a gas phase (dry) etch process in which the etchant is introduced in a vapor phase into the at least one backside contact trench 79. For example, if the temporary material layer 41 includes silicon nitride, the etch process can be a wet etch process in which the exemplary structure is immersed within a wet etch tank including phosphoric acid, which etches silicon nitride selective to silicon oxide, silicon, and various other materials used in the art. In another example, if the temporary material layer 41 includes germanium or a silicon-germanium alloy, the etchant can include a combination of hydrogen peroxide and dilute hydrofluoric acid.

Figure 31:
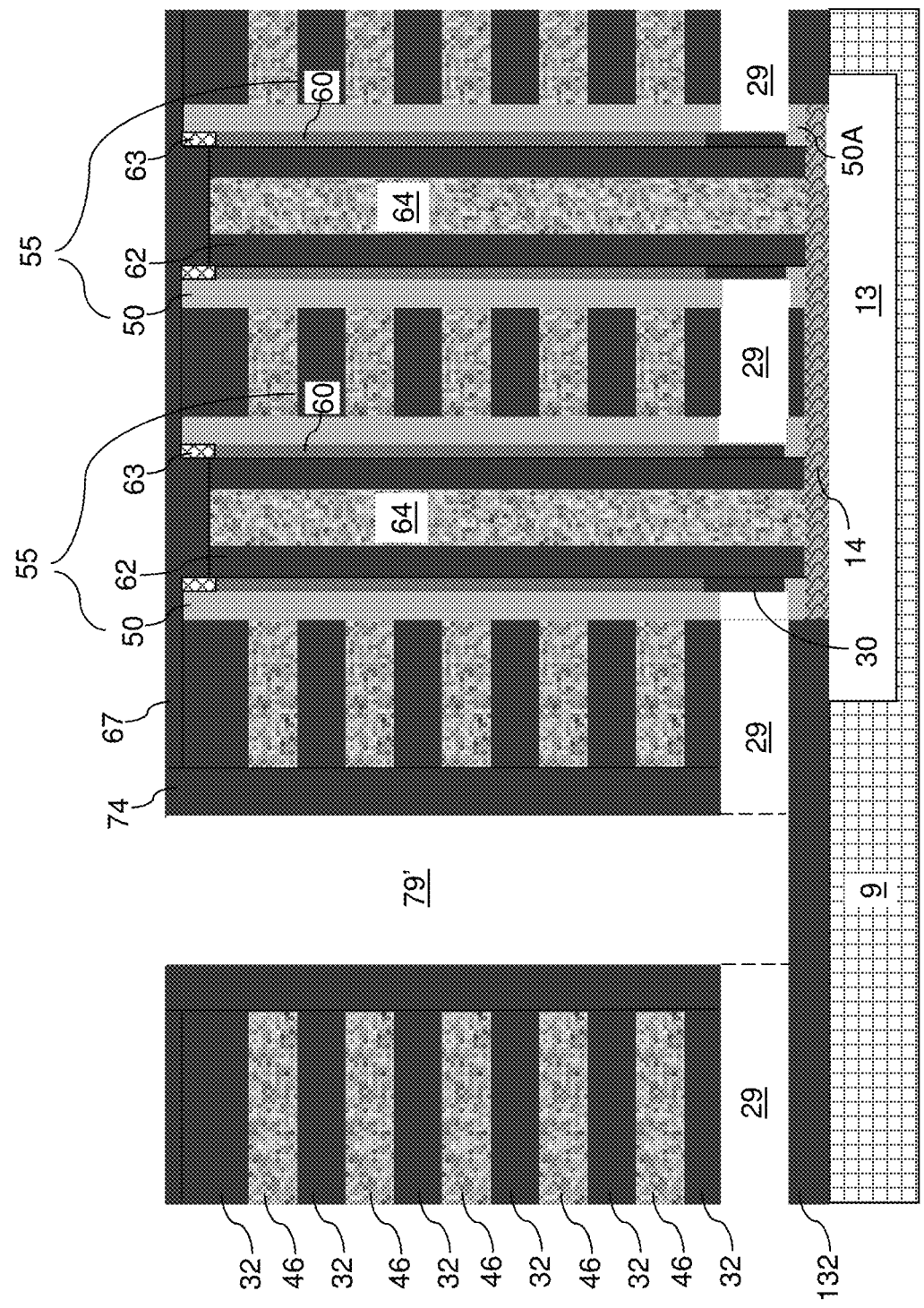
FIG. 31 is a vertical cross-sectional view of the second exemplary structure after formation of source regions according to the second embodiment of the present disclosure.

Referring to FIG. 31, a portion of each memory film 50 physically exposed to the source-level backside recess 29 can be removed by at least one etch process, which can be a series of isotropic etch processes. The chemistry of each isotropic etch process can be selected to sequentially remove the various materials of the memory films 50 from outside to inside. If each memory film 50 includes a ferroelectric material layer 154 and a front-side gate dielectric 152, a first isotropic etch process can etch a portion of the ferroelectric material layer 154, and a second isotropic etch process can etch a portion of the front-side gate dielectric 152. An annular dielectric material portion 50A that includes a remaining portion of the memory film 50 can be formed underneath each source region 30. The annular dielectric material portion 50A provides electrical isolation between a source region 30 and the underlying patterned conductive material layer 14.

Subsequently, electrical dopants can be introduced through the cavity 79' and into the physically exposed portion of the sidewall of each vertical semiconductor channel 60. The electrical dopants can be p-type dopants or n-type dopants. Exemplary p-type dopants include B, Ga, and In. Exemplary n-type dopants include P, As, and Sb. Each portion of the vertical semiconductor channel 60 into which the electrical dopants are introduced is converted into a source region 30.

The electrical dopants can be introduced into physically exposed portions of the vertical semiconductor channels 60 by a plasma doping process and/or a gas phase doping process. If a plasma doping process is used, the exemplary structure can be placed in a process chamber in which a plasma of the electrical dopants is generated. Non-limiting examples of process gases from which the plasma can be generated include $B_2H_6$, $PH_3$, $AsH_3$, and $SbH_3$. In a gas phase doping process, the exemplary structure is placed in a process chamber, and is subjected to a dopant gas at an elevated temperature, which can be, for example, in a range from 600 degrees Celsius to 1,000 degrees Celsius. The atomic concentration of the electrical dopants in each source region 30 can be in a range from $1.0 \times 10^{19}/cm^3$ to $1.0 \times 10^{21}/cm^3$, although lesser and greater atomic concentrations can also be used.

Within each memory opening, the source region 30 can have a same horizontal cross-sectional shape and areas as the overlying vertical semiconductor channel 60. The source region 30 includes the same semiconductor material as the remaining portions of the vertical semiconductor channel 60, and further includes the electrical dopants. In one embodiment, the composition of the source regions 30 can differ from the composition of the vertical semiconductor channel 60 by the presence of the electrical dopant atoms in the source region 30, while the vertical semiconductor channel 60 is substantially free of the electrical dopants or doped with electrical dopants of opposite conductivity dopants than the source region 30. Further, the composition of drain region 63 can differ from the composition of the vertical semiconductor channel 60 by the presence of the electrical dopant atoms in the drain region 63, while the vertical semiconductor channel 60 is substantially free of the electrical dopants or doped with electrical dopants of opposite conductivity dopants than the source region 30. In one embodiment the source region 30 and the drain region 63 within a same memory opening can have a same lateral thickness, and can have a substantially same horizontal cross-sectional area. The source regions 30 and the drain regions 63 can have a same type of doping. For example, the source regions 30 and the drain regions 63 can be n-doped, or the source regions 30 and the drain regions 63 can be p-doped. The vertical semiconductor channel 60 can be p-doped, n-doped, or intrinsic.

Figure 32A:
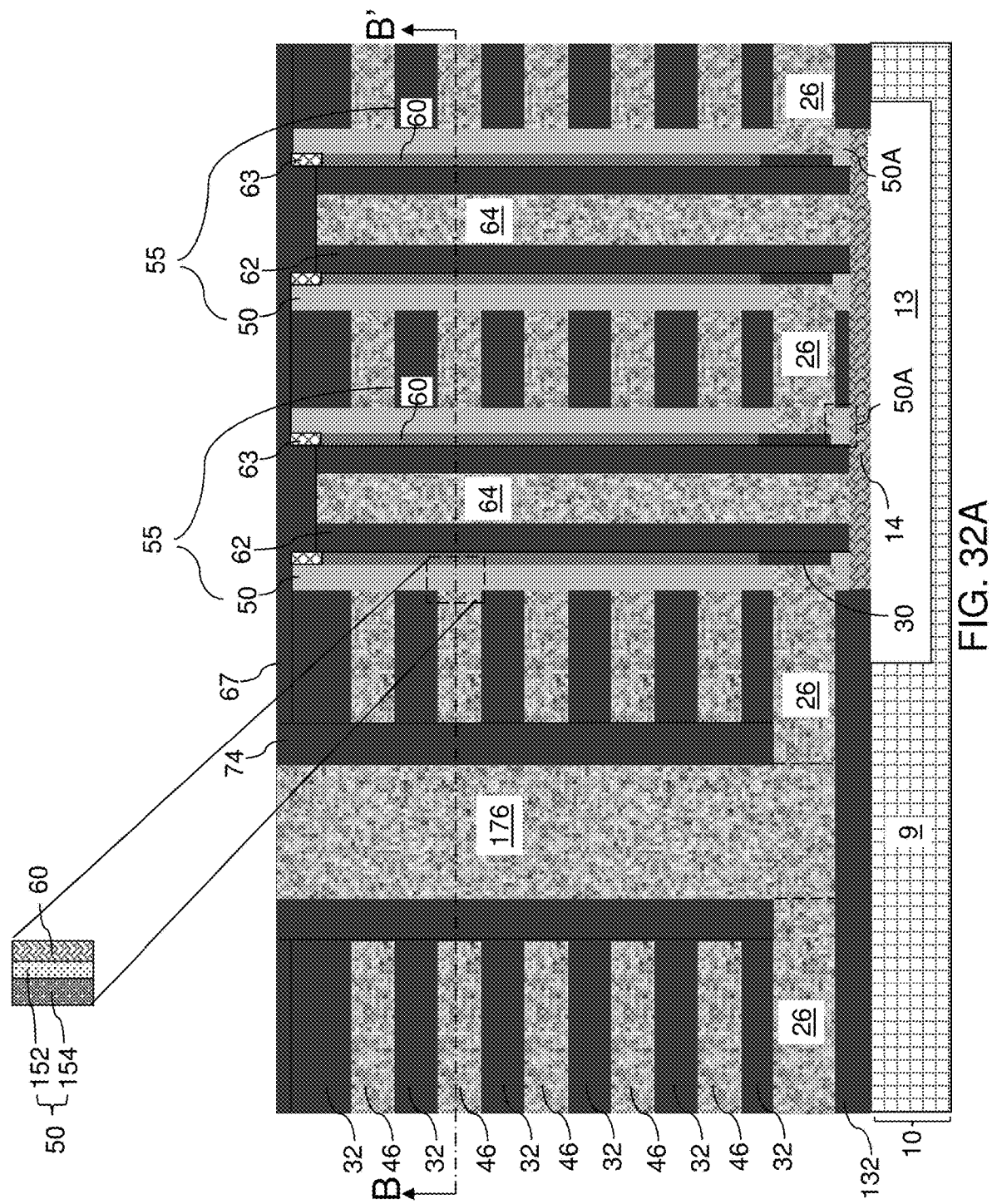
FIG. 32A is a vertical cross-sectional view of the second exemplary structure after formation of a source electrode and a backside contact via structure according to the second embodiment of the present disclosure.
Figure 32B:
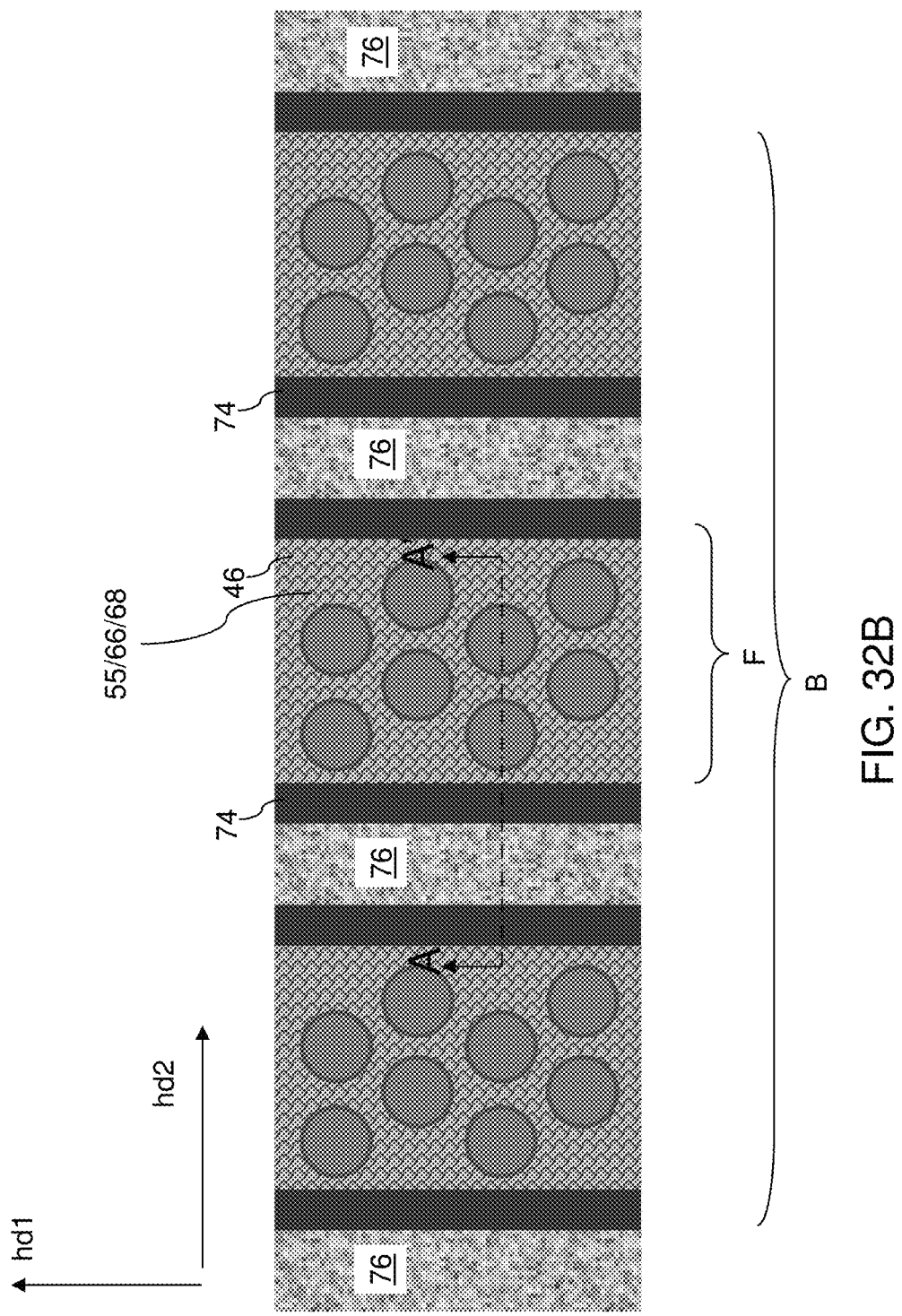
FIG. 32B is a horizontal cross-sectional view of the second exemplary structure of FIG. 32A along the plane B-B'. The vertical plane A-A' corresponds to the vertical plane of the vertical cross-sectional view of FIG. 32A.

Referring to FIGS. 32A and 32B, a conductive material can be deposited in the source-level backside recess 29 and the cavity 79' within the backside contact trench 79, and over the top surface of the dielectric cap layer 67. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. In one embodiment, the conductive material can comprise a metal such as tungsten and/or metal nitride. In one embodiment, the conductive material for filling the source-level backside recess 29 and the cavity 79' within the backside contact trench 79 can be selected from tungsten and a combination of titanium nitride and tungsten. In one embodiment, the conductive material can be deposited by chemical vapor deposition.

An excess portion of the conductive material deposited over the top surface of the dielectric cap layer 67 can be removed by a planarization process, which can be a chemical mechanical planarization (CMP) process and/or a recess etch process. A source electrode 26 can be formed in each source-level backside recess 29, and a backside contact via structure 176. Each source electrode 26 contacts a source region 30. Each source electrode 26 is formed directly on a source region 30 and an annular dielectric material portion 50A. A source electrode 26 can laterally surround a source region 30 and contact an entire outer periphery of the source region 30.

A dielectric material portion including an annular unetched portion 50A of a memory film 50 can be present between the source region 30 and an underlying conductive material layer 14. A plurality of conductive material layers 14 can be provided. A conductive material layer 14 can underlie a single memory stack structure 55, a plurality of memory stack structures 55 located between a neighboring pair of backside contact via structures 176, or a plurality of memory stack structures 55 that are located within an area including more than two backside contact via structures 176. The width of each portion of a conductive material layer 14 can correspond to the width of a word line finger F between a neighboring pair of backside contact via structures 176, or can correspond to the width of a block B including multiple backside contact via structures 176.

In one embodiment, the backside trenches and the backside contact via structures 176 can laterally extend along the first horizontal direction hd1, and can divide each of the insulating layers 32 into insulating strips 32 that laterally extend along the first horizontal direction hd1 and are laterally spaced apart along the second horizontal direction hd2. Further, the electrically conductive layers 46 can have the shapes of electrically conductive strips 46 that laterally extend along the first horizontal direction hd1 and are laterally spaced apart along the second horizontal direction hd2.

Figure 33A:
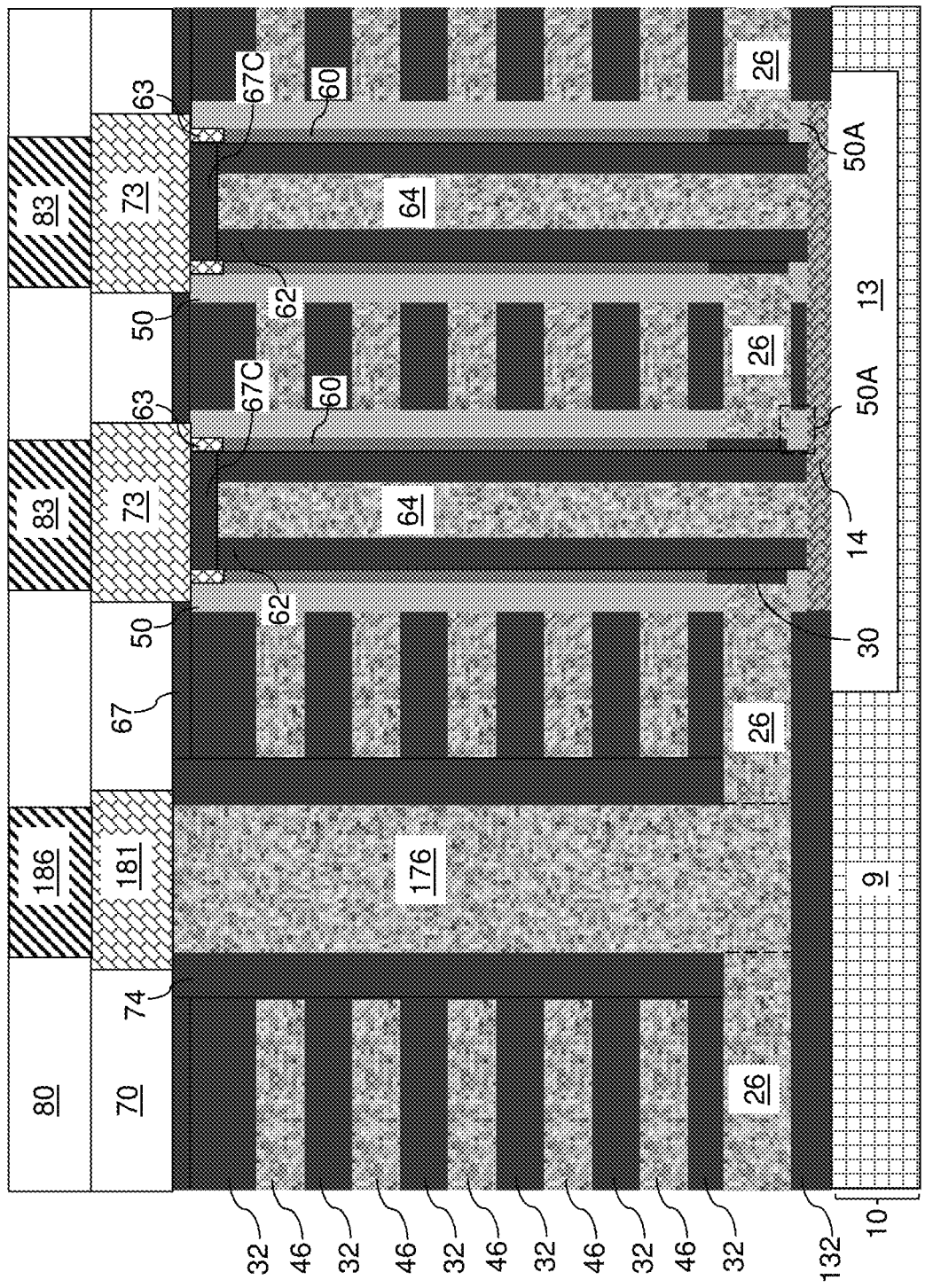
FIG. 33A is a vertical cross-sectional view of the second exemplary structure after formation of contact via structures and conductive line structures according to the second embodiment of the present disclosure.
Figure 33B:
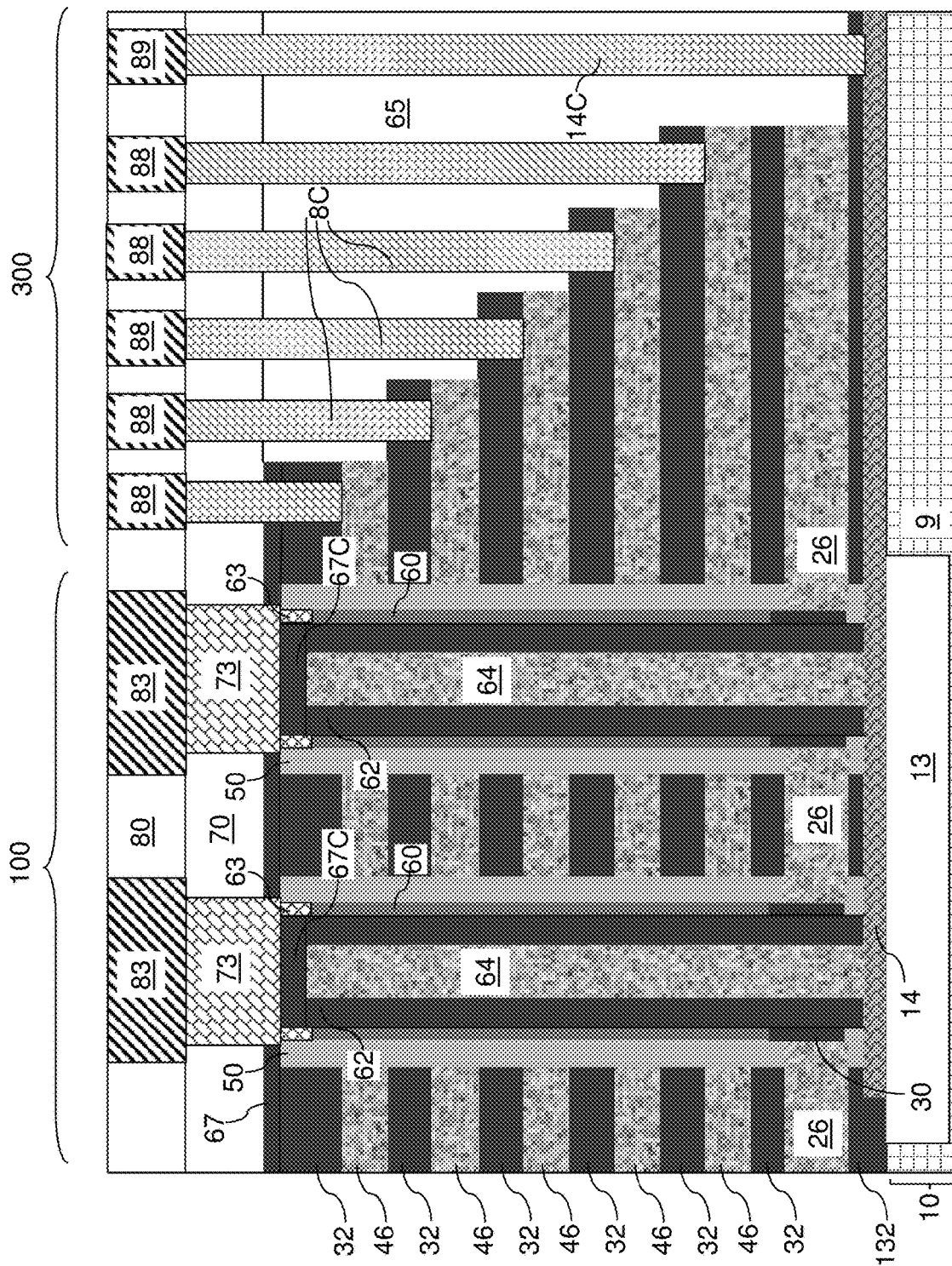
FIG. 33B is another vertical cross-sectional view of the second exemplary structure of FIG. 33A along a vertical plane that is perpendicular to the vertical cross-sectional plane of FIG. 33A.

Referring to FIGS. 33A and 33B, a contact cavity including a set of stepped surfaces can be formed within a contact region 300 of the second exemplary structure, for example, by repetition of a vertical anisotropic etch process and a horizontal opening expansion process (such as trimming) The contact region 300 is adjacent to a device region 100 that includes memory stack structures in memory openings and the backside contact via structures 46. The contact cavity can be filled with a retro-stepped dielectric material portion 65, which is a dielectric material portion of which the lateral extent is greater at levels farther away from the substrate 10 than at levels proximal to the substrate 10. The retro-stepped dielectric material portion 65 can be formed by deposition of a dielectric material such as silicon oxide, organosilicate glass, silicon nitride, or a combination thereof into the contact cavity, and removing an excess portion of the deposited dielectric material from above a horizontal plane including the top surface of the dielectric cap layer 67 by a planarization process. The planarization process can use a chemical mechanical planarization process (CMP) or a recess etch process.

A via level dielectric layer 70 can be formed over the dielectric cap layer 67 and the backside contact via structures 176. The via level dielectric layer 70 includes an interlayer dielectric material such as silicon oxide, silicon nitride, and organosilicate glass. The thickness of the via level dielectric layer 70 can be in a range from 30 nm to 1,000 nm, although lesser and greater thicknesses can also be used.

Various contact via structures can be formed through the via level dielectric layer 70 and underlying material layers. The various contact via structures can include at least one source contact via structure 181 that contacts the top surface of a backside contact via structure 176, and drain contact via structures 73 contacting top surfaces of the drain regions 63. The depth of each via cavity for the drain contact via structures 73 can be controlled such that the bottom surfaces of the via cavities for the drain contact via structures 73 are formed above the topmost surfaces of the backside gate electrodes 64. Each remaining portion of the dielectric cap layer 67 that remains over a gate electrode 64 is herein referred to as a dielectric cap portion 67C. Each dielectric cap portion 67C has the same composition as the remaining cap portion of the dielectric cap layer 67 that are present over the alternating stack (32, 46) of insulator layers 32 and the electrically conductive layers 46. A bottom surface of a drain contact via structure 73 can contact a top surface of a dielectric cap portion 67C and an annular top surface of a drain region 63. A top surface of a backside gate electrode 64 can contact a bottom surface of dielectric cap portion 67C.

Additional contact via structures (8C, 14C) can be formed through the via level dielectric layer 70, one of the dielectric cap layers 67 and the retro-stepped dielectric material portion 65, and to a top surface of an electrically conductive layer 46 or the at least one conductive material layer 14. Each control electrode contact via structure 8C can contact, or can be electrically connected to, an electrically conductive layer 46, and electrically isolated from the source electrodes 26 and other the electrically conductive lines 46 located at different levels. Each back gate contact via structure 14C can contact, or can be electrically connected to, the at least one conductive material layer 14, and electrically isolated from the source electrodes 26 and the electrically conductive lines 46. The back gate contact via structure 14C and the conductive material layer 14 provide an electrically conductive path to the backside gate electrodes 64 so that a backside bias voltage can be applied during operation of each memory stack structure. In one embodiment, the additional contact via structures (8C, 14C) may be formed in the same deposition step by deposition of a same conductive material and removal of excess portions of the deposited conductive material from a top surface of the via level dielectric layer 70.

A line level dielectric layer 80 can be formed over the via level dielectric layer 70. The line level dielectric layer 80 includes an interlayer dielectric material such as silicon oxide, silicon nitride, and organosilicate glass. The thickness of the line level dielectric layer 80 can be in a range from 30 nm to 1,000 nm, although lesser and greater thicknesses can also be used.

Various conductive line structures (83, 186, 88) can be formed through the line level dielectric layer 80. The various conductive line structures (83, 186, 88) can include at least one source line 186 that contacts a top surface of a source contact via structure 181, at least one drain line 83 (i.e., a bit line) that contacts a top surface of a drain contact via structures 73, gate control lines 88 contacting a respective control electrode contact via structure 8C, and a back gate control line 89 that contacts the back gate contact via structure 14C.

The second exemplary structure is a monolithic three-dimensional memory structure that comprises a stack (32, 46) including an alternating plurality of insulator layers 32 and electrically conductive layers 46, a memory opening 49 extending through the stack (32, 46), and a pillar structure (64, 62, 60, 63, 30, 50) located within the memory opening and comprising a backside gate electrode 64 and a set of nested layers laterally surrounding the backside gate electrode 64. The set of nested layers include, from inside to outside, a backside gate dielectric 62, a vertical semiconductor channel 60, and a memory film 50. A patterned conductive material layer 14 can contact a bottom surface of the backside gate electrode 64. The patterned conductive material layer 14 can be electrically isolated from the vertical semiconductor channel 60.

The second exemplary structure can further comprise an annular dielectric material portion 50A having a same composition as the memory film 50 and contacting an outer sidewall of the backside gate dielectric 62. The patterned conductive material layer 14 can contact a bottom surface of another backside gate electrode 64 located within another memory opening through the stack (32, 46). A dielectric material portion 13 can be included within an upper portion of the substrate 10, and can contact a bottom surface of the patterned conductive material layer 14.

A dielectric cap portion 67C can contact a top surface of the backside gate electrode 64, and a drain region 63 can contact a top surface of the vertical semiconductor channel 60 and a surface of the dielectric cap portion 67C. The drain region 63 can have an annular shape, and can contact a sidewall of the dielectric cap portion 67C.

A source region 30 can be adjoined to a bottom portion of the vertical semiconductor channel 60, and can laterally surround a portion of the backside gate dielectric 62. A source electrode 26 can contact, and laterally surround, the source region 30. The source electrode 26 is located over the substrate 10. The source electrode 26 can underlie the alternating stack (32, 46), and a backside contact via structure 176 can extend through the alternating stack (32, 46) and contact the source electrode 26. In one embodiment, the source region 30 can have a same horizontal cross-sectional shape as the vertical semiconductor channel 60, and can be laterally spaced from the backside gate electrode 64 by the backside gate dielectric 62.

Figure 34:
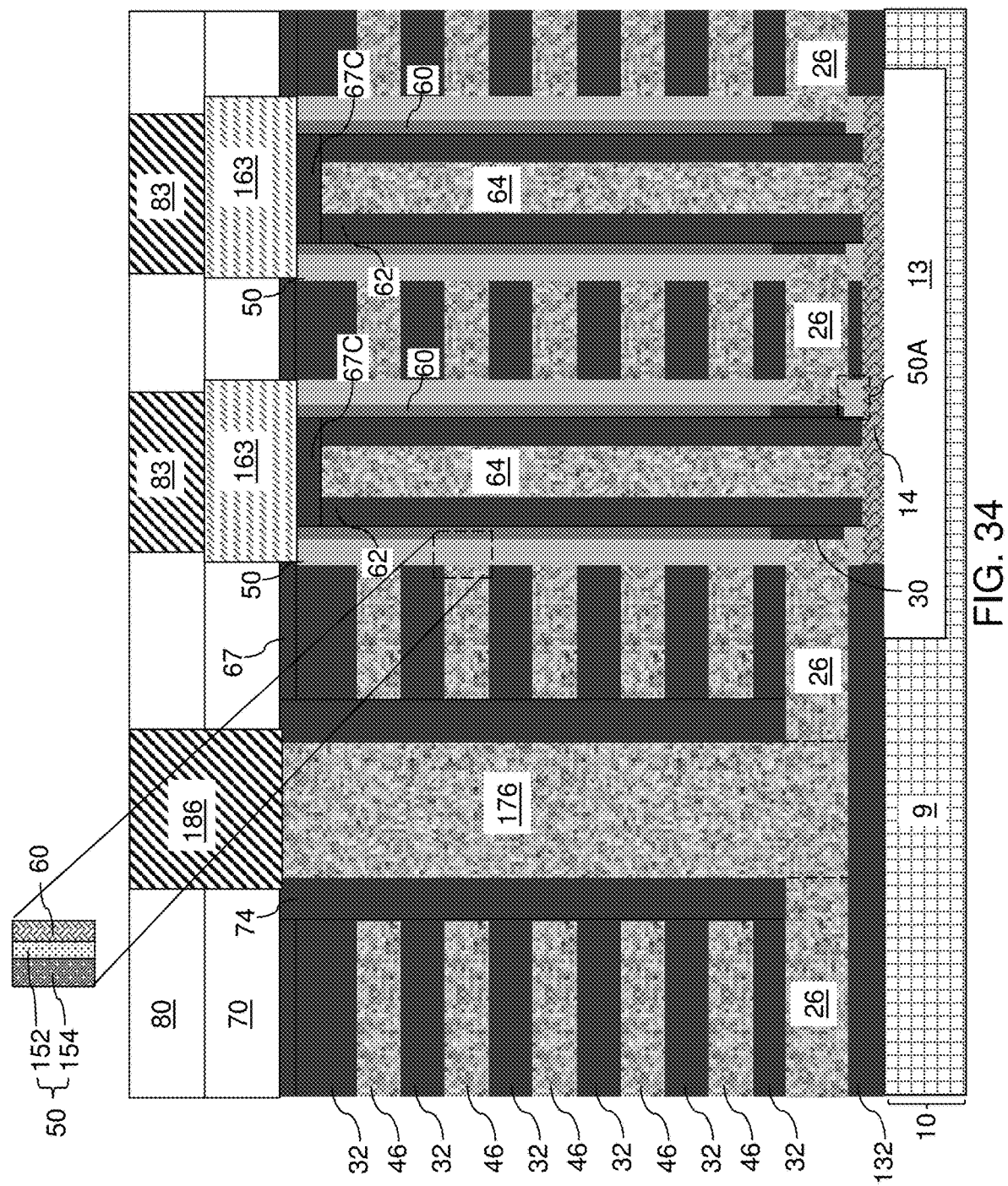
FIG. 34 is a vertical cross-sectional view of an alternate embodiment of the second exemplary structure according to the second embodiment of the present disclosure.

Referring to FIG. 34, an alternate embodiment of the second exemplary structure is illustrated, which can be derived from the second exemplary structure by omitting the processing step used to convert top portions of the vertical semiconductor channels 60 to drain regions 63 by introduction of electrical dopants as illustrated in FIG. 26. Thus, the drain regions 63 are not present within the various in-process structures between the processing steps of FIGS. 26-32B. After formation of the via level dielectric layer 70 and via cavities therethrough, a top surface of each vertical semiconductor channel 60 is physically exposed at bottom surfaces of the various via cavities. A doped semiconductor material can be deposited within the via cavities and over the via level dielectric layer 70. The deposited doped semiconductor material can be patterned, for example, by a planarization process, which can use chemical mechanical planarization (CMP) and/or a recess etch. Remaining portions of the doped semiconductor material can form drain regions 163. Each drain region 163 contacts a top surface of a vertical semiconductor channel 60. The dielectric cap portion 67C can contact a bottom surface of the drain region 63 and an inner sidewall of the vertical semiconductor channel 60.

In the alternate embodiment of the second exemplary structure, each dielectric cap portion 67C can be formed over a backside gate electrode 64 and on an inner sidewall of a vertical semiconductor channel 60. Each drain region 163 can be formed over, and on the top surface of, a dielectric cap portion 67C and on a top surface of a vertical semiconductor channel 60 by depositing and patterning a doped semiconductor material. Additional structures, such as the line level dielectric layer 80 and the conductive line structures (83, 186, 88), can be formed as in the second exemplary structure illustrated in FIGS. 33A and 33B.

Referring to all drawings and according to various embodiments of the present disclosure, a three-dimensional memory device is provided, which comprises: an alternating stack of insulator layers 32 and electrically conductive layers 46 and located over a top surface of a substrate (8 or 10); a memory stack structure (155 or 55) vertically extending through the alternating stack (32, 46) and comprising a ferroelectric material layer 154, a front-side gate dielectric 152 contacting the ferroelectric material layer 154, and a vertical semiconductor channel (160 or 60) contacting the front-side gate dielectric 152; a backside gate dielectric (162 or 62) contacting the vertical semiconductor channel (160 or 60); and a backside gate electrode (164 or 64) contacting the backside gate dielectric (162 or 62).

In one embodiment, the memory stack structure 55 is located within an opening 49 that extends through the alternating stack (32, 46) and has a generally cylindrical shape; and each of the ferroelectric material layer 154, the front-side gate dielectric 152, the vertical semiconductor channel 60, and the backside gate dielectric 62 has a respective generally annular cylindrical shape.

In some embodiments, each of the ferroelectric material layer 154, the front-side gate dielectric 152, the vertical semiconductor channel (160 or 60), and the backside gate dielectric (162 or 62) vertically extends from a first horizontal plane including a bottom surface of a bottommost one of the electrically conductive layers 46 to a second horizontal plane including a top surface of topmost one of the electrically conductive layers 46.

In one embodiment, a source region 30 can contact a bottom end of the vertical semiconductor channel 60, and a drain region 63 can contact a top end of the vertical semiconductor channel 60.

In one embodiment, the source region 30 has a first annular shape and laterally surrounds the backside gate electrode 64 and is contacted by a source electrode 26 that underlies the alternating stack (32, 46); and a bottom surface of the backside gate electrode 64 contact a top surface of a patterned conductive material layer 14 that underlies the source electrode 26.

Figure 35:
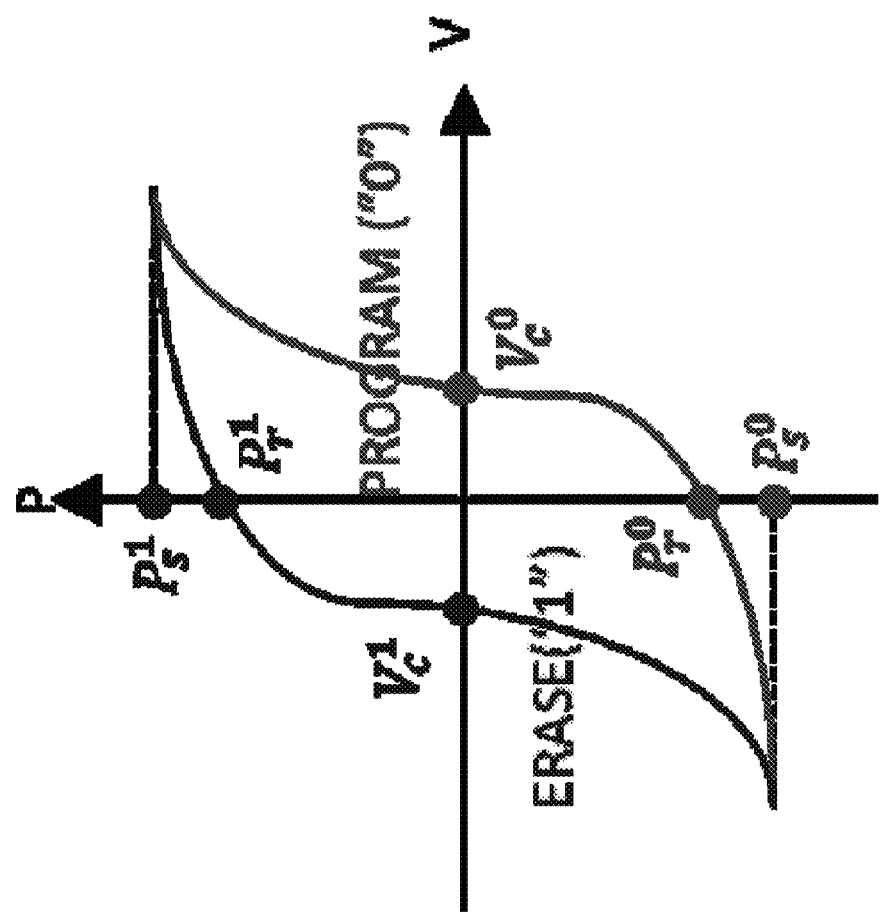
FIG. 35 illustrates definitions of various parameters used during operation of the ferroelectric memory devices of various embodiments of the present disclosure.

Referring to FIG. 35, a hysteresis curve is shown for the ferroelectric polarization P of a ferromagnetic material (e.g., hafnium oxide) as a function of an applied external voltage V. In a programming scheme utilizing the hysteresis characteristics illustrated in FIG. 35, a ferroelectric state corresponding to a programmed state of "0" is derived from an immediately preceding state having a positive ferroelectric saturation polarization $P_s^1$ without subsequent exposure to a negative programming voltage. A ferroelectric state corresponding to a programmed state of "1" is derived from an immediately preceding state having a negative ferroelectric saturation polarization $P_s^0$ without subsequent exposure to a positive programming voltage. A positive ferroelectric remnant polarization $P_r^1$ is the positive polarization that remains after the positive voltage that induces the positive ferroelectric saturation polarization $P_s^1$ is turned off. A negative ferroelectric remnant polarization $P_r^0$ is the negative polarization that remains after the negative voltage that induces the negative ferroelectric saturation polarization $P_s^1$ is turned off. A negative coercive voltage $V_c^1$ is the negative voltage that when applied results in zero ferroelectric polarization after the state of the positive ferroelectric saturation polarization $P_s^1$. A positive coercive voltage $V_c^0$ is the positive voltage that when applied results in zero ferroelectric polarization after the state of the negative ferroelectric saturation polarization $P_s^0$.

During a read operation in the vertical ferromagnetic NAND string cell array used in the devices of various embodiments, each portion of the vertical semiconductor channel (160 or 60) adjacent to an electrically conductive layer 46 has a threshold voltage $V_{th}$. A pass voltage $V_{pass}$ is applied to each unselected electrically conductive layer 46 to ensure that the portions of the vertical semiconductor channel (160 or 60) adjacent to the unselected electrically conductive layers 46 are turned on. The vertical field effect transistor including the vertical semiconductor channel (160 or 60) should be operated in a saturation regime. Further, the pass voltage should be applied in a manner that avoids inverting the ferroelectric polarization at the levels of the unselected electrically conductive layers 46. Maintaining the pass voltage $V_{pass}$ less than the coercive voltage $V_c$ prevents collateral flipping of the ferroelectric polarization at the unselected levels. To summarize, various embodiments permit the following conditions to be met:

(a) $V_{th} \ll V_{pass}$;
(b) $V_{pass} \ll V_{th} + V_{DS}$ (source-drain voltage); and
(c) $V_{pass} \ll V_c$.

Generally, the pass voltage $V_{pass}$ for turning on unselected levels of the vertical semiconductor channel is greater than the coercive voltage $V_c$ of the ferroelectric material. Thus, a ferroelectric memory device in a conventional vertical NAND configuration in which the switching on a vertical semiconductor channel at the unselected levels relies on the pass voltage applied to word lines alone is not operable because of collateral polarization switching. In other words, attempt to read a polarization state of a selected level results in switching of the polarization state of unselected levels in the ferroelectric memory device in the conventional vertical NAND configuration.

According to an aspect of the present disclosure, the backside gate electrode (164 or 64) applies an additional bias voltage to enable turning on the portions of the vertical semiconductor channel (160, 60) located at the unselected levels. Thus, while the applied pass voltage $V_{pass}$ at the electrically conductive layers 46 is less than the threshold voltage $V_{th}$ of the vertical semiconductor channel (160, 60), the backside bias voltage $V_{BG}$ applied to the backside gate electrode (164, 64) turns on the unselected portions of the vertical semiconductor channel (160, 60). The applied pass voltage $V_{pass}$ at the electrically conductive layers 46 is less than the coercive voltage $V_c$ of the ferroelectric material of the ferroelectric material layer 154, thus inversion of the ferromagnetic state does not occur at the unselected levels.

Figure 36A:
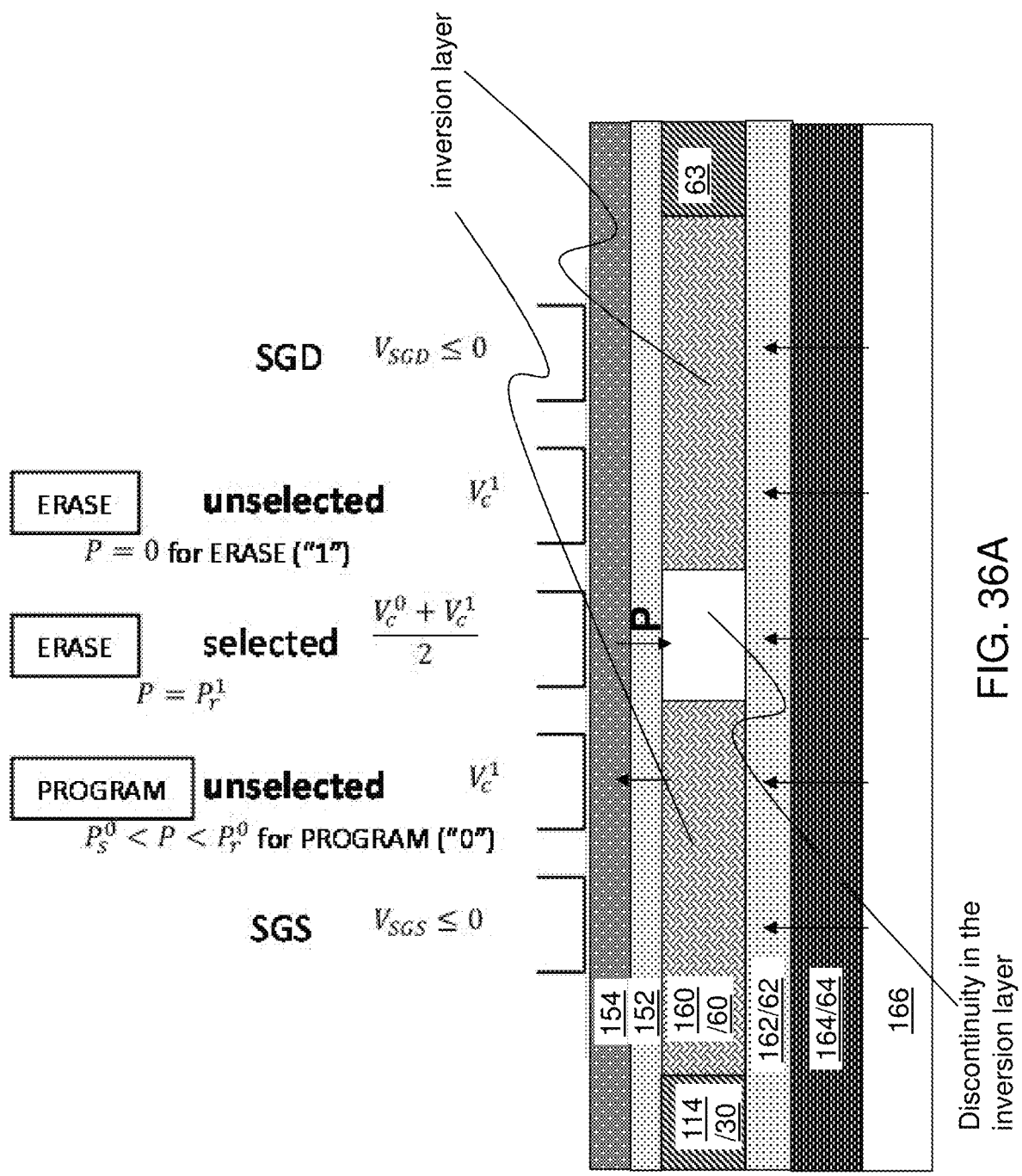
FIG. 36A illustrates the configuration of an inversion layer within a vertical semiconductor channel during sensing of a selected ferroelectric memory cell in an "erase" state according to an embodiment of the present disclosure.
Figure 36B:
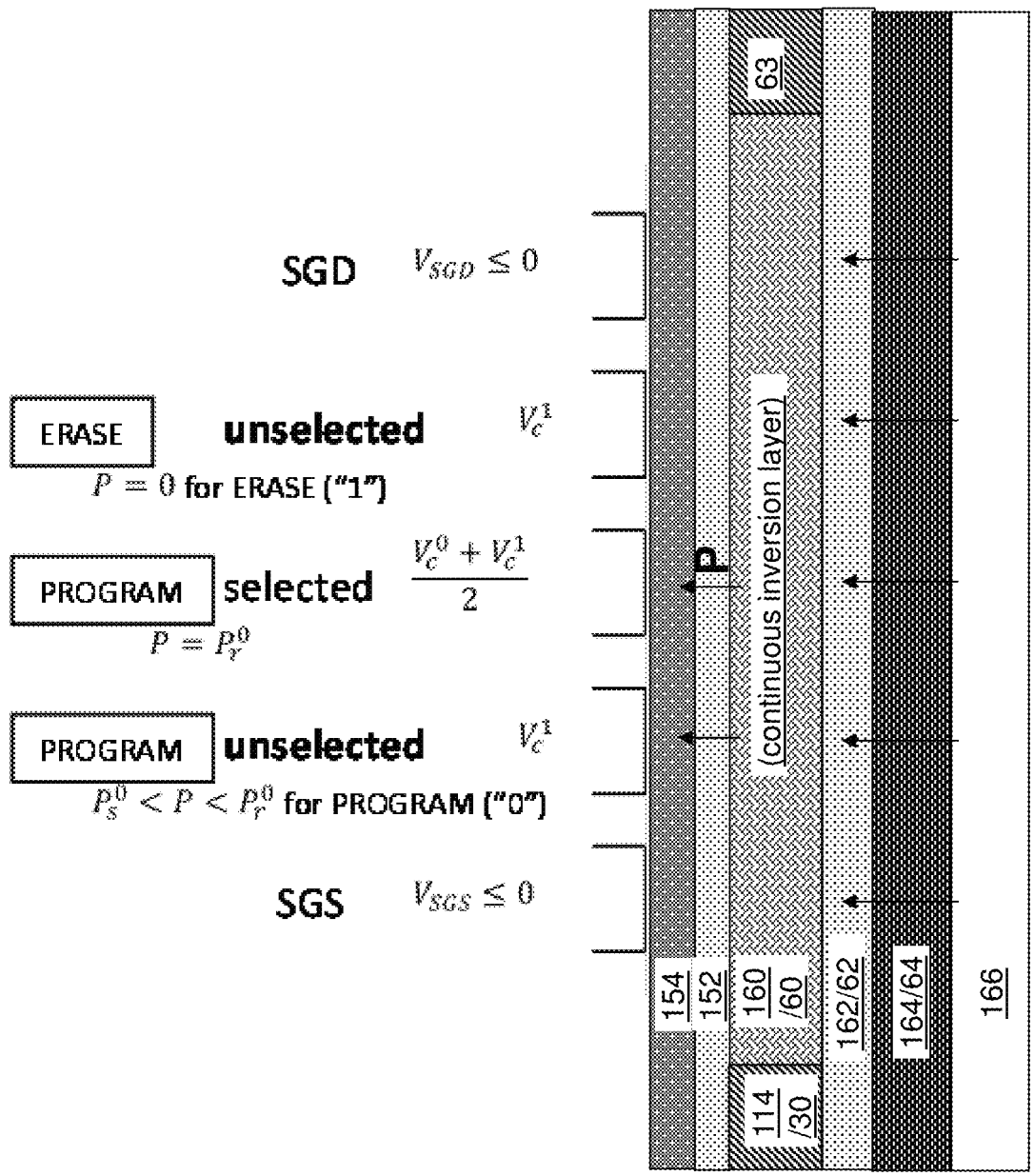
FIG. 36B illustrates the configuration of an inversion layer within a vertical semiconductor channel during sensing of a selected ferroelectric memory cell in a "program" state according to an embodiment of the present disclosure.

FIG. 36A and FIG. 36B illustrates formation of an inversion layer within a vertical semiconductor channel (160, 60) during sensing of a selected ferroelectric memory cell by application of the backside bias voltage $V_{BG}$ to the backside gate electrode (164, 64). A source-side select gate (SGS) and a drain-side select gate (SGD) are illustrated, which can be implemented as a bottommost electrically conductive layer 46 and a topmost electrically conductive layer, respectively. A suitable source-side select voltage $V_{SGS}$ and a suitable drain-side select voltage $V_{SGD}$ can be applied to activate a selected ferroelectric memory vertical NAND cell. While more than four levels (such as 8-1,024 levels) of ferroelectric memory cells can be present within a ferroelectric memory vertical NAND cell, only three levels are shown for illustrative purposes. Specifically, a selected level is shown, which corresponds to a selected ferroelectric memory element located within a portion of the ferroelectric material layer 154 adjacent to the electrically conductive layer 46 corresponding to the word line for the selected ferroelectric memory element. FIG. 36A shows the case in which the selected level is programmed in an "erase" state. FIG. 36B shows the case in which the selected level is programmed in a "programmed" state. An unselected level in an "erase" state is shown, which represent the state of each ferroelectric memory element in the "erase" state. An unselected level in a "program" state is shown, which represent the state of each ferroelectric memory element in the "program" state.

In order to sense the ferroelectric state of the selected ferroelectric memory element, a sense voltage of about $(V_c^0 + V_c^1)/2$ is applied to the electrically conductive layer 46 corresponding to the word line for the selected ferroelectric memory element. An unselected gate voltage, or a pass voltage, of about $V_c^1$ (or less) is applied to each electrically conductive layer 46 corresponding to the word lines for the unselected ferroelectric memory elements. A backside bias voltage $V_{BG}$ that is significantly higher than the threshold voltage $V_{th}$ is applied to the backside gate electrode (164, 64). If the selected ferroelectric memory element is in an "erase" state as in illustrated in FIG. 36A, the polarization of the portion of the ferroelectric material layer 154 at the selected level is about $P_r^1$. The vertical semiconductor channel (160, 60) is turned off at the selected level, and the state of "0" is detected for the selected ferroelectric memory element. If the selected ferroelectric memory element is in a "program" state as in illustrated in FIG. 36B, the polarization of the portion of the ferroelectric material layer 154 at the selected level is about $P_r^0$. The vertical semiconductor channel (160, 60) is turned on at all levels, and the state of "1" is detected for the selected ferroelectric memory element.

Various embodiments of the disclosure provide three-dimensional memory devices that leverage ferroelectric to provide advantages in scalability that exhibit small coercive fields and voltages within thin dielectrics, providing low voltage switching that are no susceptible to unintended polarization inversion. Various embodiments enable non-selected transistor to be switched on without polarization inversion of the associated ferroelectric layer. Various embodiments also enable detection of the difference between the drain source currents IDS between "erase" and "program" states.

The number of levels that can be stacked in a three-dimensional memory device depends on the thickness uniformity of the ferroelectric material layers 154 throughout the device. In some embodiments, the ferroelectric material layers 154 can include, and/or consist essentially of, hafnium oxide, which can be readily deposited using a conformal deposition process such as atomic layer deposition. A ferroelectric memory device in a three-dimensional NAND array configuration can thus be provided.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A three-dimensional memory device, comprising:
alternating stacks of insulating strips and electrically conductive strips located over a substrate and laterally spaced apart one from another by line trenches, wherein the line trenches laterally extend along a first horizontal direction and are spaced apart along a second horizontal direction; and line trench fill structures located in the line trenches, wherein each of the line trench fill structures comprises a respective set of memory stack structures and each set of memory stack structures comprises a respective row of discrete memory stack structures located in a respective one of the line trenches and arranged along the first horizontal direction, a backside gate dielectric that contacts each memory stack structure within the respective set of memory stack structures, and a backside gate electrode contacting the backside gate dielectric, wherein each memory stack structure comprises a ferroelectric material layer, a front-side gate dielectric contacting the ferroelectric material layer, and a vertical semiconductor channel contacting the front-side gate dielectric and the backside gate dielectric; and wherein each of the line trench fill structures comprises a laterally undulating dielectric rail contacting the backside gate electrode, laterally extending along the first horizontal direction, and including a laterally alternating sequence of bulbous regions and neck regions that have a lesser width along the second horizontal direction than the bulbous regions.

2. The three-dimensional memory device of claim 1, wherein each of the ferroelectric material layers, the front-side gate dielectrics, and the vertical semiconductor channels vertically extends from a first horizontal plane including bottom surfaces of bottommost ones of the electrically conductive strips of the alternating stacks to a second horizontal plane including top surfaces of topmost ones of the electrically conductive strips of the alternating stacks.

3. The three-dimensional memory device of claim 1, wherein each of the backside gate electrodes laterally extends along the first horizontal direction and is configured to apply a backside bias voltage to each of the vertical semiconductor channels within a respective one of the line trench fill structures.

4. The three-dimensional memory device of claim 1, wherein:
each of the backside gate electrodes has a laterally undulating profile;
the ferroelectric material layers comprise hafnium oxide; and
the electrically conductive strips contacts sidewalls of the ferroelectric material layers.

5. The three-dimensional memory device of claim 1, wherein the backside gate dielectric comprises a continuous layer that contacts each memory stack structure within the respective set of memory stack structures.

6. The three-dimensional memory device of claim 1, wherein the backside gate electrode is laterally spaced from each memory stack structure within the respective set of memory stack structures by a lateral spacing that is the same as a thickness of the backside gate dielectric.

7. The three-dimensional memory device of claim 1, wherein each of the ferroelectric material layers is in direct contact with a respective backside gate dielectric.

8. The three-dimensional memory device of claim 1, wherein:
each of the front-side gate dielectrics is in direct contact with a respective gate dielectric; and each backside gate dielectric is in direct contact with a respective plurality of ferroelectric material layers of the ferroelectric material layers of the three-dimensional memory device.

9. The three-dimensional memory device of claim 1, wherein each backside gate dielectric is in direct contact with a respective plurality of vertical semiconductor channels of the vertical semiconductor channels of the three-dimensional memory device.

10. A three-dimensional memory device, comprising:
an alternating stack of insulator layers and electrically conductive layers and located over a top surface of a substrate;
a memory stack structure vertically extending through the alternating stack and comprising a ferroelectric material layer, a front-side gate dielectric contacting the ferroelectric material layer, and a vertical semiconductor channel contacting the front-side gate dielectric;
a backside gate dielectric contacting the vertical semiconductor channel;
a backside gate electrode contacting the backside gate dielectric;
a source region contacting a bottom end of the vertical semiconductor channel; and
a source electrode surrounding the source region, comprising a conductive material that is different from a material of the source region, contacting an annular bottom surface of the ferroelectric material layer, and located underneath the alternating stack.

11. The three-dimensional memory device of claim 10, wherein:
the memory stack structure is located within an opening that extends through the alternating stack and has a generally cylindrical shape; and
each of the ferroelectric material layer, the front-side gate dielectric, the vertical semiconductor channel, and the backside gate dielectric has a respective generally annular cylindrical shape.

12. The three-dimensional memory device of claim 10, wherein each of the ferroelectric material layer, the front-side gate dielectric, the vertical semiconductor channel, and the backside gate dielectric vertically extends from a first horizontal plane including a bottom surface of a bottommost one of the electrically conductive layers to a second horizontal plane including a top surface of topmost one of the electrically conductive layers.

13. The three-dimensional memory device of claim 10, further comprising
a drain region contacting a top end of the vertical semiconductor channel.

14. The three-dimensional memory device of claim 13, wherein:
the source region has a first annular shape and laterally surrounds the backside gate electrode; and
a bottom surface of the backside gate electrode contacts a top surface of a patterned conductive material layer that underlies the source electrode.

15. The three-dimensional memory device of claim 10, wherein a top surface of the source electrode contacts a bottom surface of an insulating layer within the alternating stack.

16. The three-dimensional memory device of claim 10, further comprising a conductive material layer contacting a bottom surface of the backside gate electrode.

17. The three-dimensional memory device of claim 16, wherein the conductive material layer underlies the source region and the source electrode, and is vertically spaced from the source region by another insulating layer.

18. The three-dimensional memory device of claim 10, further comprising a backside contact via structure vertically extending through the alternating stack and contacting the source electrode.

* * * * *